(12) United States Patent
Rolland et al.

(10) Patent No.: US 10,350,823 B2
(45) Date of Patent: Jul. 16, 2019

(54) DUAL PRECURSOR RESIN SYSTEMS FOR ADDITIVE MANUFACTURING WITH DUAL CURE RESINS

(71) Applicant: Carbon, Inc., Redwood City, CA (US)

(72) Inventors: Jason P. Rolland, San Carlos, CA (US); Julia D. Cushen, San Francisco, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 15/755,385

(22) PCT Filed: Dec. 20, 2016

(86) PCT No.: PCT/US2016/067739
§ 371 (c)(1),
(2) Date: Feb. 26, 2018

(87) PCT Pub. No.: WO2017/112653
PCT Pub. Date: Jun. 29, 2017

(65) Prior Publication Data
US 2018/0264719 A1    Sep. 20, 2018

(51) Int. Cl.
*B29C 41/02*    (2006.01)
*B29C 64/129*   (2017.01)
(Continued)

(52) U.S. Cl.
CPC .......... *B29C 64/129* (2017.08); *B29C 64/124* (2017.08); *B29C 64/135* (2017.08);
(Continued)

(58) Field of Classification Search
CPC .... B29C 64/124; B29C 64/129; B29C 64/135
(Continued)

(56) References Cited

U.S. PATENT DOCUMENTS

| 5,236,637 A | 8/1993 | Hull |
| 5,629,133 A | 5/1997 | Wolf et al. |

(Continued)

FOREIGN PATENT DOCUMENTS

| CN | 103571211 | 2/2014 |
| EP | 0334092 | 9/1989 |

(Continued)

OTHER PUBLICATIONS

International Search Report and Written Opinion for PCT/US2016/066739 dated May 16, 2017, 11 pages.

(Continued)

*Primary Examiner* — Leo B Tentoni
(74) *Attorney, Agent, or Firm* — Myers Bigel, P.A.

(57) ABSTRACT

A method of forming a dual cure three-dimensional object by additive manufacturing may be carried out by mixing a first precursor liquid and a second precursor liquid to produce a polymerizable liquid comprising a mixture of (i) a light polymerizable liquid first component, and (ii) a second solidifiable component (e.g., a second reactive component) that is different from the first component (e.g., that does not contain a cationic photoinitiator, or is further solidified by a different physical mechanism, or further reacted, polymerized or chain extended by a different chemical reaction). In the foregoing: (i') at least one reactant of the second solidifiable component is contained in the first precursor liquid, and (ii') at least one reactant or catalyst of the second solidifiable component is contained in the second precursor liquid. Once mixed, the three-dimensional object may be formed from the resin by a dual cure additive manufacturing process.

27 Claims, 23 Drawing Sheets

(51) Int. Cl.
B29C 64/124 (2017.01)
B29C 64/135 (2017.01)
G03F 7/00 (2006.01)
G03F 7/16 (2006.01)
B33Y 70/00 (2015.01)
C08L 63/00 (2006.01)
B33Y 10/00 (2015.01)

(52) U.S. Cl.
CPC ............... *B33Y 70/00* (2014.12); *C08L 63/00* (2013.01); *G03F 7/0037* (2013.01); *G03F 7/16* (2013.01); *B33Y 10/00* (2014.12)

(58) Field of Classification Search
USPC ........................................ 264/401, 494, 496
See application file for complete search history.

(56) References Cited

U.S. PATENT DOCUMENTS

| | | | |
|---|---|---|---|
| 5,674,921 | A | 10/1997 | Regula et al. |
| 5,679,719 | A | 10/1997 | Klemarczyk et al. |
| 5,695,708 | A | 12/1997 | Karp et al. |
| 6,309,797 | B1 | 10/2001 | Grinevich et al. |
| 7,438,846 | B2 | 10/2008 | Hendrick |
| 7,892,474 | B2 | 2/2011 | Shkolnik et al. |
| 8,142,860 | B2 | 3/2012 | Vanmaele et al. |
| 9,205,601 | B2 | 12/2015 | Desimone et al. |
| 9,211,678 | B2 | 12/2015 | Desimone et al. |
| 9,216,546 | B2 | 12/2015 | Desimone et al. |
| 9,360,757 | B2 | 6/2016 | Desimone et al. |
| 9,453,142 | B2 | 9/2016 | Rolland et al. |
| 9,777,097 | B2 | 1/2017 | Liu et al. |
| 9,598,606 | B2 | 3/2017 | Rolland et al. |
| 9,676,963 | B2 | 6/2017 | Rolland et al. |
| 9,708,440 | B2 | 7/2017 | Das et al. |
| 9,982,164 | B2 | 5/2018 | Rolland et al. |
| 10,016,938 | B2 | 7/2018 | Desimone et al. |
| 10,093,064 | B2 | 10/2018 | Desimone et al. |
| 10,144,181 | B2 | 12/2018 | Desimone et al. |
| 10,150,253 | B2 | 12/2018 | Desimone et al. |
| 10,155,882 | B2 | 12/2018 | Rolland et al. |
| 2003/0091833 | A1 | 5/2003 | Baumgart et al. |
| 2004/0052966 | A1 | 3/2004 | Wilke et al. |
| 2004/0135292 | A1 | 7/2004 | Coats et al. |
| 2004/0187714 | A1 | 9/2004 | Napadensky et al. |
| 2007/0205528 | A1 | 9/2007 | Patel et al. |
| 2008/0131692 | A1 | 6/2008 | Rolland et al. |
| 2010/0024915 | A1 | 2/2010 | Thomas et al. |
| 2010/0105794 | A1 | 4/2010 | Dietliker et al. |
| 2011/0042859 | A1* | 2/2011 | Patel ...................... B33Y 70/00 264/401 |
| 2012/0195994 | A1 | 8/2012 | El-Siblani et al. |
| 2012/0251841 | A1 | 10/2012 | Southwell et al. |
| 2013/0292862 | A1 | 11/2013 | Joyce |
| 2013/0295212 | A1 | 11/2013 | Chen et al. |
| 2015/0322291 | A1 | 11/2015 | Salviato et al. |
| 2016/0160077 | A1 | 6/2016 | Rolland et al. |
| 2016/0263838 | A1* | 9/2016 | Goldman .............. B29C 64/135 |
| 2017/0021565 | A1 | 1/2017 | Lund |
| 2017/0113416 | A1* | 4/2017 | DeSimone ............ B29C 64/129 |
| 2017/0151718 | A1 | 6/2017 | Rolland et al. |
| 2017/0239887 | A1 | 8/2017 | Rolland et al. |
| 2018/0015662 | A1* | 1/2018 | Ermoshkin ........... B29C 64/124 |
| 2018/0265738 | A1 | 9/2018 | Rolland et al. |

FOREIGN PATENT DOCUMENTS

| | | |
|---|---|---|
| EP | 0442071 | 8/1991 |
| EP | 0525578 | 2/1993 |
| EP | 0830641 | 3/1998 |
| EP | 1341039 | 9/2003 |
| EP | 1918316 | 5/2008 |
| EP | 2224874 | 9/2010 |
| EP | 2955004 | 12/2015 |
| JP | H02111528 | 4/1990 |
| WO | 2001/026023 | 4/2001 |
| WO | 2006/045002 | 4/2006 |
| WO | 2014020400 | 2/2014 |
| WO | 2015/077419 | 5/2015 |
| WO | 2016145050 | 9/2016 |
| WO | 2018237038 | 12/2018 |

OTHER PUBLICATIONS

International Search Report and Written Opinion of the International Searching Authority: corresponding to International Application No. PCT/US2018/038550, dated Nov. 20, 2018, 20 pages.
Tumbleston et al, "Continuous Liquid Interface Production of 3D Objects" Science, 347(0228):1349-1352 (2015 ).
Smooth-On et al. "Clear Flex Series—Water clear urethane rubber", retrieved from the Internet. URL:https://web.archive.org/web/20150302041022/http:www.smooth-on.com.80/tb/files/CLEAR_FLEX_50_95_TB.pdf (2016).
Pan et al. "A Fast Mask Projection Steriolithography Process for Fabricating Digital Models in Minutes" J. Manufacturing. Sci. And Eng., 134, 9 pages (2012).
Velankar et al. "High-Performance UV-Curable Urethane Acrylates vie Deblocking Chemistry" Journal of Applied Polymer Science, 162:1361-1376 (1996).
Invitation to Pay Additional Fees corresponding to International Application No. PCT/US2018/038550 dated Oct. 9, 2018, 10 pages.
Park et al., UV- and thermal-curing behaviors or dual-curable adhesives based on epoxy acrylate oligomers, International Journal of Adhesion and Adhesives, vol. 29, Issue 7, 2009, pp. 710-717.

* cited by examiner

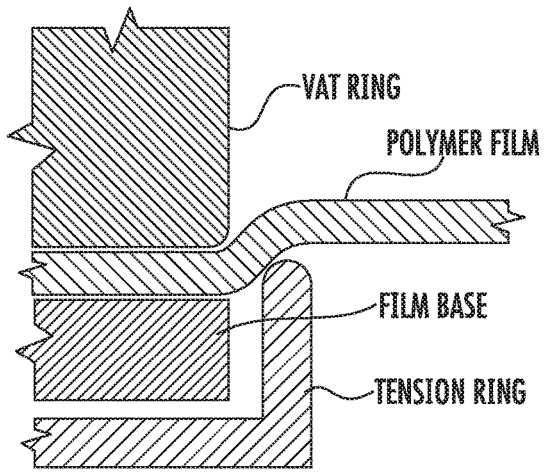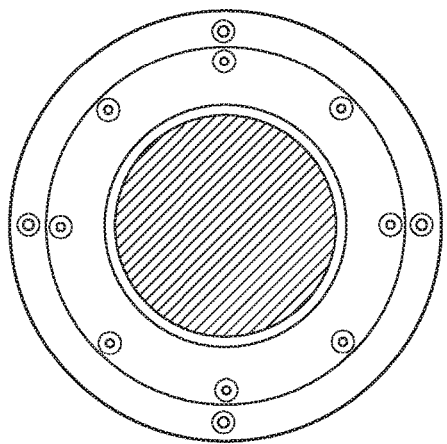
Fig. 9         Fig. 10
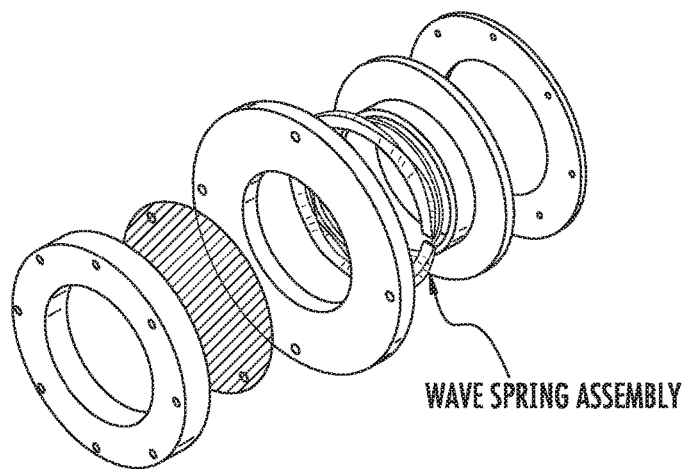
Fig. 11

US 10,350,823 B2

DUAL PRECURSOR RESIN SYSTEMS FOR ADDITIVE MANUFACTURING WITH DUAL CURE RESINS

RELATED APPLICATIONS

This application is a 35 U.S.C. § 371 national phase entry of International Application No. PCT/US2016/067739, filed Dec. 20, 2016, and which claims the benefit of U.S. Provisional Patent Application Ser. No. 62/270,829, filed Dec. 22, 2015, the disclosures of which are incorporated by reference herein in their entireties.

FIELD OF THE INVENTION

The present invention concerns materials, methods and apparatus for the fabrication of solid three-dimensional objects from liquid materials, and objects so produced.

BACKGROUND OF THE INVENTION

In conventional additive or three-dimensional fabrication techniques, construction of a three-dimensional object is performed in a step-wise or layer-by-layer manner. In particular, layer formation is performed through solidification of photo curable resin under the action of visible or UV light irradiation. Two techniques are known: one in which new layers are formed at the top surface of the growing object; the other in which new layers are formed at the bottom surface of the growing object.

If new layers are faulted at the top surface of the growing object, then after each irradiation step the object under construction is lowered into the resin "pool," a new layer of resin is coated on top, and a new irradiation step takes place. An early example of such a technique is given in Hull, U.S. Pat. No. 5,236,637, at FIG. 3. A disadvantage of such "top-down" techniques is the need to submerge the growing object in a (potentially deep) pool of liquid resin and reconstitute a precise overlayer of liquid resin.

If new layers are formed at the bottom of the growing object, then after each irradiation step the object under construction must be separated from the bottom plate in the fabrication well. An early example of such a technique is given in Hull, U.S. Pat. No. 5,236,637, at FIG. 4. While such "bottom-up" techniques hold the potential to eliminate the need for a deep well in which the object is submerged by instead lifting the object out of a relatively shallow well or pool, a problem with such "bottom-up" fabrication techniques, as commercially implemented, is that extreme care must be taken, and additional mechanical elements employed, when separating the solidified layer from the bottom plate due to physical and chemical interactions therebetween. For example, in U.S. Pat. No. 7,438,846, an elastic separation layer is used to achieve "non-destructive" separation of solidified material at the bottom construction plane. Other approaches, such as the B9Creator™ 3-dimensional printer marketed by B9Creations of Deadwood, S. Dak., USA, employ a sliding build plate. See, e.g., M. Joyce, US Patent App. 2013/0292862 and Y. Chen et al., US Patent App. 2013/0295212 (both Nov. 7, 2013); see also Y. Pan et al., *J. Manufacturing Sci. and Eng.* 134, 051011-1 (October 2012). Such approaches introduce a mechanical step that may complicate the apparatus, slow the method, and/or potentially distort the end product.

Continuous processes for producing a three-dimensional object are suggested at some length with respect to "top-down" techniques in U.S. Pat. No. 7,892,474, but this reference does not explain how they may be implemented in "bottom-up" systems in a manner non-destructive to the article being produced, which limits the materials which can be used in the process, and in turn limits the structural properties of the objects so produced.

Southwell, Xu et al., US Patent Application Publication No. 2012/0251841, describe liquid radiation curable resins for additive fabrication, but these comprise a cationic photoinitiator (and hence are limited in the materials which may be used) and are suggested only for layer by layer fabrication.

Velankar, Pazos, and Cooper, *Journal of Applied Polymer Science* 162, 1361 (1996), describe UV-curable urethane acrylates formed by a deblocking chemistry, but they are not suggested for additive manufacturing, and no suggestion is made on how those materials may be adapted to additive manufacturing.

Accordingly, there is a need for new materials and methods for producing three-dimensional objects by additive manufacturing that have satisfactory structural properties.

SUMMARY OF THE INVENTION

Described herein are methods, systems and apparatus (including associated control methods, systems and apparatus), for the production of a three-dimensional object by additive manufacturing. In preferred (but not necessarily limiting) embodiments, the method is carried out continuously. In preferred (but not necessarily limiting) embodiments, the three-dimensional object is produced from a liquid interface. Hence they are sometimes referred to, for convenience and not for purposes of limitation, as "continuous liquid interface production," "continuous liquid interphase printing," or the like (i.e., "CLIP"). A schematic representation of an embodiment thereof is given in FIG. 2 herein.

The present invention provides a method of forming a three-dimensional object, comprising: (a) (i) providing a carrier and an optically transparent member having a build surface, the carrier and the build surface defining a build region therebetween, or (ii) providing a carrier in a polymerizable liquid reservoir, the reservoir having a fill level, the carrier and the fill level defining a build region therebetween; (b) filling the build region with a polymerizable liquid, the polymerizable liquid comprising a mixture of: (i) a light polymerizable liquid first component, and (ii) a second solidifiable (or second reactive) component different from the first component; (c) irradiating the build region with light (through the optically transparent member when present) to form a solid polymer scaffold from the first component and advancing (e.g., advancing concurrently—that is, simultaneously, or sequentially in an alternating fashion with irradiating steps) the carrier away from the build surface to form a three-dimensional intermediate having the same shape as, or a shape to be imparted to, the three-dimensional object and containing the second solidifiable component carried in the scaffold in unsolidified or uncured form; and (d) concurrently with or subsequent to the irradiating step, solidifying and/or curing (e.g., further reacting, polymerizing, or chain extending) the second solidifiable or reactive component in the three-dimensional intermediate to form the three-dimensional object.

Optionally, a wash step may be included between formation of the three-dimensional intermediate and the subsequent solidifying and/or curing step (d) by which the three-dimensional object is formed. Any suitable wash liquid may be employed (e.g., BIO-SOLV™ solvent replacement;

PURPLE POWER™ degreaser/cleaner; SIMPLE GREEN® all purpose cleaner; a 50:50 volume:volume mixture of water and isopropanol, etc. See also, U.S. Pat. No. 5,248,456).

In some embodiments, the second component comprises: (i) a polymerizable liquid solubilized in or suspended in the first component; (ii) a polymerizable solid solubilized in the first component; or (iii) a polymer solubilized in the first component. In other embodiments, the second component comprises: (i) a polymerizable solid suspended in the first component; or (ii) solid thermoplastic or thermoset polymer particles suspended in the first component.

In some embodiments, the first component comprises a blocked or reactive blocked prepolymer and (optionally but in some embodiments preferably) a reactive diluent, and the second component comprises a chain extender. The first components react together to form a blocked polymer scaffold during the irradiating step, which is unblocked by heating or microwave irradiating during the second step to, in turn, react with the chain extender. In some embodiments, the reactive blocked component comprises a reactive blocked diisocyanate or branched isocyanate and/or chain extender, alone or in combination with a reactive blocked prepolymer, and other unblocked constituents (e.g., polyisocyanate oligomer, diisocyanate, reactive diluents, and/or chain extender).

In some embodiments, reactive blocked prepolymers, diisocyanates, branched isocyanates, and/or chain extenders are blocked by reaction of (i.e., are the reaction product of) a polyisocyanate oligomer, an isocyanate, and/or a chain extender with an amine (meth)acrylate, alcohol (meth)acrylate, maleimide, or n-vinylformamide monomer blocking agent.

In some embodiments, the three-dimensional intermediate is collapsible or compressible (e.g., elastic).

In some embodiments, the scaffold is continuous; in other embodiments, the scaffold is discontinuous (e.g., an open or closed cell foam, which foam may be regular (e.g., geometric, such as a lattice) or irregular).

In some embodiments, the three-dimensional object comprises a polymer blend (e.g., an interpenetrating polymer network, a semi-interpenetrating polymer network, a sequential interpenetrating polymer network) formed from the first component and the second component.

In some embodiments, the polymerizable liquid comprises from 1, 2 or 5 percent by weight to 20, 30, 40, 90 or 99 percent by weight of the first component; and from 1, 10, 60, 70 or 80 percent by weight to 95, 98 or 99 percent by weight of the second component (optionally including one or more additional components). In other embodiments, the polymerizable liquid comprises from 1, 2 or 5 percent by weight to 20, 30, 40, 90 or 99 percent by weight of the second component; and from 1, 10, 60, 70 or 80 percent by weight to 95, 98 or 99 percent by weight of the first component (optionally including one or more additional components).

In some embodiments, the solidifying and/or curing step (d) is carried out concurrently with the irradiating step (c) and: (i) the solidifying and/or curing step is carried out by precipitation; (ii) the irradiating step generates heat from the polymerization of the first component in an amount sufficient to thermally solidify or polymerize the second component (e.g., to a temperature of 50 or 80 to 100° C., for polymerizing polyurethane, polyurea, or copolymer thereof (e.g., poly(urethane-urea)); and (iii) the second component (e.g., a light or ultraviolet light curable epoxy resin) is solidified by the same light as is the first component in the irradiating step.

In some embodiments, the solidifying and/or curing step (d) is carried out subsequent to the irradiating step (c) and is carried out by: (i) heating or microwave irradiating the second solidifiable component; (ii) irradiating the second solidifiable component with light at a wavelength different from that of the light in the irradiating step (c); (iii) contacting the second polymerizable component to water; or (iv) contacting the second polymerizable component to a catalyst.

In some embodiments, the second component comprises precursors to a polyurethane, polyurea, or copolymer thereof (e.g., poly(urethane-urea)), a silicone resin, or natural rubber, and the solidifying and/or curing step is carried out by heating or microwave irradiating.

In some embodiments, the second component comprises a cationically cured resin (e.g., an epoxy resin or a vinyl ether) and the solidifying and/or curing step is carried out by irradiating the second solidifiable component with light at a wavelength different from that of the light in the irradiating step (c).

In some embodiments, the second component comprises a precursor to a polyurethane, polyurea, or copolymer thereof (e.g., poly(urethane-urea)), and the solidifying and/or curing step is carried out by contacting the second component to water (e.g., in liquid, gas, or aerosol form). Suitable examples of such precursors include, but are not limited to, those described in B. Baumbach, Silane Terminated Polyurethanes (Bayer MaterialScience 2013).

In some embodiments, the second component comprises a precursor to a polyurethane, polyurea, or copolymer thereof (e.g., poly(urethane-urea)), a silicone resin, a ring-opening metathesis polymerization resin, or a click chemistry resin (alkyne monomers in combination with compound plus azide monomers), and the solidifying and/or curing step is carried out by contacting the second component to a polymerization catalyst (e.g., a metal catalyst such as a tin catalyst, and/or an amine catalyst, for polyurethane/polyurea resins; platinum or tin catalysts for silicone resins; ruthenium catalysts for ring-opening metathesis polymerization resins; copper catalyst for click chemistry resins; etc., which catalyst is contacted to the article as a liquid aerosol, by immersion, etc.), or an aminoplast containing resin, such as one containing N-(alkoxymethyl)acrylamide, hydroxyl groups, and a blocked acid catalyst.

In some embodiments, the irradiating step and/or advancing step is carried out while also concurrently:

(i) continuously maintaining a dead zone (or persistent or stable liquid interface) of polymerizable liquid in contact with the build surface, and (ii) continuously maintaining a gradient of polymerization zone (e.g., an active surface) between the dead zone and the solid polymer and in contact with each thereof, the gradient of polymerization zone comprising the first component in partially cured form.

In some embodiments, the first component comprises a free radical polymerizable liquid and the inhibitor comprises oxygen; or the first component comprises an acid-catalyzed or cationically polymerizable liquid, and the inhibitor comprises a base.

In some embodiments, the gradient of polymerization zone and the dead zone together have a thickness of from 1 to 1000 microns.

In some embodiments, the gradient of polymerization zone is maintained for a time of at least 5, 10, 20 or 30 seconds, or at least 1 or 2 minutes.

In some embodiments, the advancing is carried out at a cumulative rate of at least 0.1, 1, 10, 100 or 1000 microns per second.

In some embodiments, the build surface is substantially fixed or stationary in the lateral and/or vertical dimensions.

In some embodiments the method further comprises vertically reciprocating the carrier with respect to the build surface to enhance or speed the refilling of the build region with the polymerizable liquid.

A further aspect of the invention is a polymerizable liquid substantially as described herein above and below, and/or for use in carrying out a method as described herein.

In some embodiments of the methods and compositions described above and below, the polymerizable liquid (or "dual cure resin") has a viscosity of 100, 200, 500 or 1,000 centipoise or more at room temperature and/or under the operating conditions of the method, up to a viscosity of 10,000, 20,000, or 50,000 centipoise or more, at room temperature and/or under the operating conditions of the method.

One particular embodiment of the inventions disclosed herein is a method of forming a three-dimensional object comprised of polyurethane, polyurea, or copolymer thereof, the method comprising: (a) providing a carrier and an optically transparent member having a build surface, the carrier and the build surface defining a build region therebetween; (b) filling the build region with a polymerizable liquid, the polymerizable liquid comprising at least one of: (i) a blocked or reactive blocked prepolymer, (ii) a blocked or reactive blocked diisocyanate or branched isocyanate, or (iii) a blocked or reactive blocked diisocyanate or branched isocyanate chain extender; (c) irradiating the build region with light through the optically transparent member to form a solid blocked polymer scaffold and advancing the carrier away from the build surface to form a three-dimensional intermediate having the same shape as, or a shape to be imparted to, the three-dimensional object, with the intermediate containing the chain extender; and then (d) heating or microwave irradiating the three-dimensional intermediate sufficiently to form from the three-dimensional intermediate the three-dimensional object comprised of polyurethane, polyurea, or copolymer thereof.

In some embodiments, the solidifiable or polymerizable liquid is changed at least once during the method with a subsequent solidifiable or polymerizable liquid; optionally where the subsequent solidifiable or polymerizable liquid is cross-reactive with each previous solidifiable or polymerizable liquid during the subsequent curing, to form an object having a plurality of structural segments covalently coupled to one another, each structural segment having different structural (e.g., tensile) properties.

A further aspect of the inventions disclosed herein is a polymerizable liquid useful for the production of a three-dimensional object comprised of polyurethane, polyurea, or a copolymer thereof by additive manufacturing, the polymerizable liquid comprising a mixture of:

(a) at least one constitutent selected from the group consisting of (i) a blocked or reactive blocked prepolymer, (ii) a blocked or reactive blocked diisocyanate or branched isocyanate, and (iii) a blocked or reactive blocked diisocyanate or branched isocyanate chain extender, (b) optionally at least one additional chain extender, (c) a photoinitiator, (d) optionally a polyol and/or a polyamine, (e) optionally a reactive diluent, (f) optionally a non-reactive (i.e., non-reaction initiating) light absorbing, particularly a ultraviolet light-absorbing, pigment or dye which when present is included in an amount of from 0.001 or 0.01 to 10 percent by weight, and (g) optionally a filler (e.g., silica, a toughener such as a core-shell rubber, etc., including combinations thereof);

optionally, but in some embodiments preferably, subject to the proviso that the non-reactive light absorbing pigment or dye is present when the at least one constituent is only the blocked or reactive blocked prepolymer.

In some embodiments, polymerizable liquids used in the present invention include a non-reactive pigment or dye. Examples include, but are not limited to, (i) titanium dioxide (e.g., in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxypenyltriazine, and/or benzotriazole ultraviolet light absorber (e.g., in an amount of 0.001 or 0.005 to 1, 2 or 4 percent by weight).

In some embodiments, a Lewis acid or an oxidizable tin salt is included in the polymerizable liquid (e.g., in an amount of from 0.01 or 0.1 to 1 or 2 percent by weight, or more) in an amount effective to accelerate the formation of the three-dimensional intermediate object during the production thereof.

A further aspect of the inventions disclosed herein is a three-dimensional object comprised of: (a) a light polymerized first component; and (b) a second solidified component (e.g., a further reacted, polymerized or chain extended component) different from the first component; optionally but in some embodiments preferably subject to the proviso that: (i) the second component does not contain a cationic polymerization photoinitiator, and/or (ii) the three-dimensional object is produced by the process of continuous liquid interface production.

In some embodiments, the object further comprises: (c) a third solidified (or further reacted, polymerized, or chain extended) component different from the first and second component, with the object having at least a first structural segment and a second structural segment covalently coupled to one another, the first structural segment comprised of the second solidified component, the second structural segment comprised of the third solidified component; and both the first and second structural segments comprised of the same or different light polymerized first component.

In some embodiments, the object comprises a polymer blend formed from the first component and the second component.

The object may be one that has a shape that cannot be formed by injection molding or casting.

In some embodiments of the foregoing, the subsequent solidifying and/or curing step decreases the rigidity, and/or increases the elasticity, of the three-dimensional intermediate (sometimes referred to as the "green" object), in the forming of the three-dimensional object, for example, by decreasing the Young's modulus of the intermediate by at least 10, 20, 30 or 40 percent, up to 60, 80, 90 or 99 percent, in forming the three-dimensional object.

In some embodiments, the three-dimensional object has a Young's modulus of from 2, 5 or 10 percent, to 20, 40, 60 or 80 percent, of the Young's Modulus of the three-dimensional intermediate.

In some embodiments, the three-dimensional intermediate has a Young's Modulus of from 30 Megapascals to 50, 100 or 200 Megapascals, or more, and the three-dimensional object has a Young' modulus of from 0.1 or 0.2 Megapascals to 20 or 30 Megapascals.

In some embodiments, the constituents or ingredients of the polymerizable liquid are divided among two different precursor liquids. The methods may then be carried out by mixing the first precursor liquid and a second precursor liquid to produce the polymerizable liquid comprising a mixture of (i) a light polymerizable liquid first component, wherein: (i) at least one reactant of said second solidifiable component is contained in said first precursor liquid, and (ii) at least one reactant or catalyst of said second solidifiable component is contained in said second precursor liquid; then (typically within one day, and preferably within one or two hours, of said mixing step), filling the build region with the polymerizable liquid.

Further provided is a combination comprising first and second precursor resin compositions which on mixing together produce an epoxy dual cure resin useful for additive manufacturing, said combination comprising: (a) a first, pseudoplastic, precursor resin composition, comprising: (i) a hardener (e.g., organic hardener) co-polymerizable with an epoxy resin, said organic hardener in solid particulate form and dispersed in said resin composition; (ii) optionally (i.e., in some embodiments), a photoinitiator; (iii) optionally, monomers and/or prepolymers that are polymerizable by exposure to actinic radiation or light; (iv) optionally, a light absorbing pigment or dye; (v) optionally, a diluent; (vi) optionally, a particulate filler; and (vii) optionally, a co-monomer and/or a co-prepolymer (with said epoxy resin); and (b) a second, optionally pseudoplastic, precursor resin composition, packaged separately from (i.e., not mixed with) said first precursor resin, said second precursor resin comprising: (i) an epoxy resin co-polymerizable with said organic hardener; (ii) a dual reactive compound having substituted thereon a first reactive group reactive with said monomers and/or prepolymers that are polymerizable by exposure to actinic radiation or light, and a second reactive group reactive with said epoxy resin (e.g., an epoxy acrylate); (iii) optionally, a photoinitiator; (iv) optionally, monomers and/or prepolymers that are polymerizable by exposure to actinic radiation or light; (v) optionally, a light absorbing pigment or dye; (vi) optionally, a diluent; (vii) optionally, a particulate filler; and (viii) optionally, a co-monomer and/or a co-prepolymer (with said epoxy resin); subject to the proviso that said photoinitiator, and said monomers and/or prepolymers that are polymerizable by exposure to actinic radiation or light, are each included in at least one of each of said first and second precursor resin compositions.

Also provided is a precursor resin composition useful for making a dual cure resin which is, in turn, useful for additive manufacturing, said precursor resin consisting essentially of: (i) an epoxy resin co-polymerizable with an organic hardener; (ii) a dual reactive compound having substituted thereon a first reactive group reactive with monomers and/or prepolymers that are polymerizable by exposure to actinic radiation or light, and a second reactive group reactive with said epoxy resin (e.g., an epoxy acrylate); (iii) optionally, a photoinitiator; (iv) optionally, monomers and/or prepolymers that are polymerizable by exposure to actinic radiation or light; (v) optionally, a light absorbing pigment or dye; (vi) optionally a diluent; (vii) optionally a particulate filler; (viii) optionally, a co-monomer and/or a co-prepolymer (with said epoxy resin).

Non-limiting examples and specific embodiments of the present invention are explained in greater detail in the drawings herein and the specification set forth below. The disclosures of all United States Patent references cited herein are to be incorporated herein by reference in their entirety.

BRIEF DESCRIPTION OF THE DRAWINGS

FIG. 9 is a side sectional view of the build plates of FIG. 7 and FIG. 10, showing how the tension member tensions and rigidifies the polymer film.

FIG. 10 is a top view of a 2.88 inch diameter round build plate of the invention, where the film dimension may be 4 inches in diameter.

FIG. 11 is an exploded view of the build plate of FIG. 10.

DETAILED DESCRIPTION OF ILLUSTRATIVE EMBODIMENTS

Figure 1:
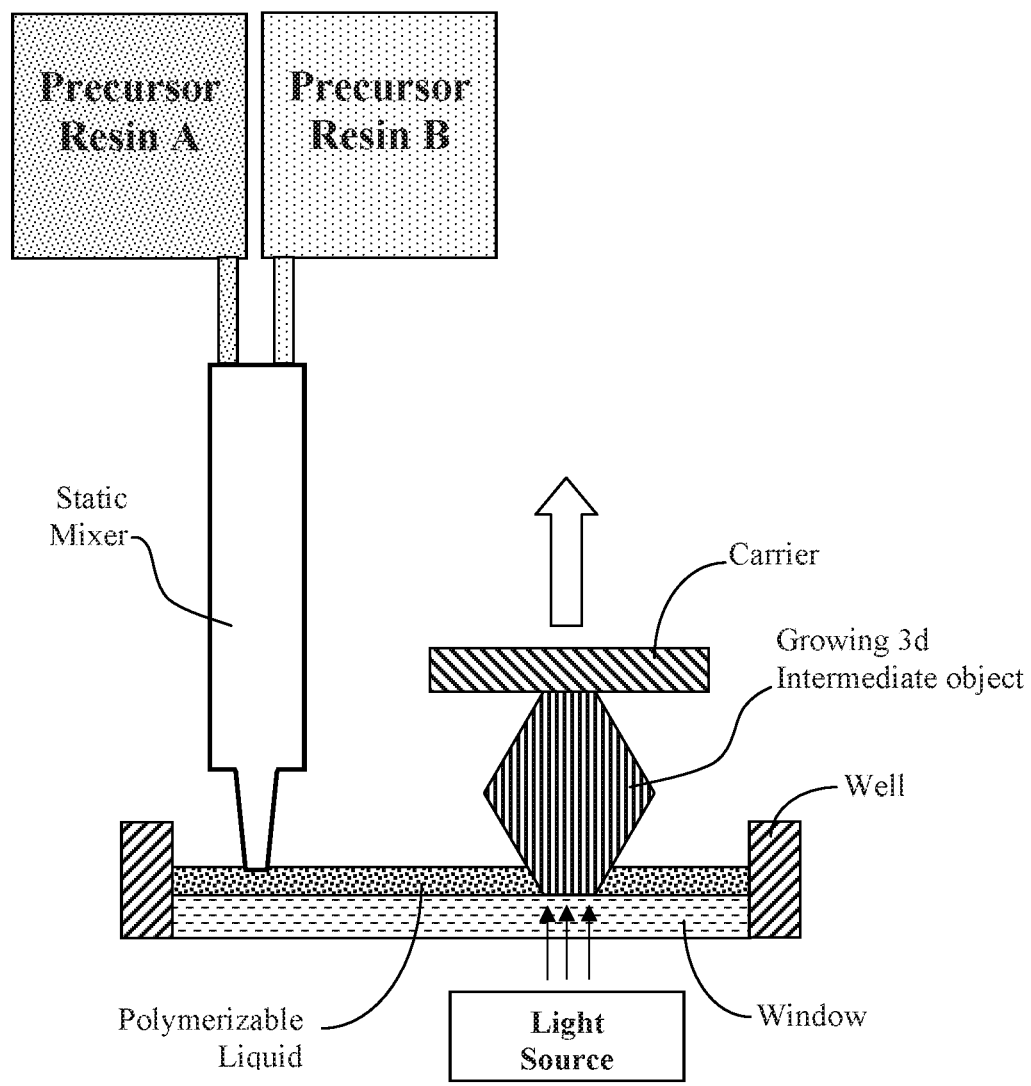
FIG. 1 is a schematic illustration of one embodiment of a method and apparatus for carrying out the present invention, where two precursor resins are mixed to produce the polymerizable liquid.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

Like numbers refer to like elements throughout. In the figures, the thickness of certain lines, layers, components, elements or features may be exaggerated for clarity. Where used, broken lines illustrate optional features or operations unless specified otherwise.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly-used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with and/or contacting the other element or intervening elements can also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature can have portions that overlap or underlie the adjacent feature.

Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only, unless specifically indicated otherwise.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

"Shape to be imparted to" refers to the case where the shape of the intermediate object slightly changes between formation thereof and forming the subsequent three-dimensional product, typically by shrinkage (e.g., up to 1, 2 or 4 percent by volume), expansion (e.g., up to 1, 2 or 4 percent by volume), removal of support structures, or by intervening forming steps (e.g., intentional bending, stretching, drilling, grinding, cutting, polishing, or other intentional forming after formation of the intermediate product, but before formation of the subsequent three-dimensional product). As noted above, the three-dimensional intermediate may also be washed, if desired, before further curing, and/or before, during, or after any intervening forming steps.

"Hydrocarbyl" as used herein refers to a bifunctional hydrocarbon group, which hydrocarbon may be aliphatic, aromatic, or mixed aliphatic and aromatic, and optionally containing one or more (e.g., 1, 2, 3, or 4) heteroatoms (typically selected from N, O, and S). Such hydrocarbyl groups may be optionally substituted (e.g., with additional isocyanate groups) and may contain from 1, 2, or 3 carbon atoms, up to 6, 8 or 10 carbon atoms or more, and up to 40, 80, or 100 carbon atoms or more.

"Hard-segment" and "soft-segment" as used herein derive from the morphology of elastomeric polymers which can contain distinct phase separated regions. Such regions can be detected by thermoanalysis techniques and distinguished by, for example, glass transition temperatures. Generally, soft-segments of the polymer can be considered as having glass transition temperatures below room temperature whilst hard-segments can be considered as having glass transition temperatures above room temperature or even melting points if a crystallite. It is the current opinion (and hence their classification) that "soft-segment" prepolymers or resin constituents are associated with the formation of the soft-segment phase of the product and conversely that hard-segment prepolymers or resin constituents are associated with the hard-segment phase of the product. Structure-property relationships of hard- and soft-segment phases are described for example by Redman in "Developments in Polyurethanes-I" J. M. Buist Ed., Elsevier, London—published 1978. See, e.g., U.S. Pat. No. 5,418,259 (Dow).

Heating may be active heating (e.g., in an oven, such as an electric, gas, or solar oven), or passive heating (e.g., at ambient temperature). Active heating will generally be more rapid than passive heating and in some embodiments is preferred, but passive heating-such as simply maintaining the intermediate at ambient temperature for a sufficient time to effect further cure—is in some embodiments preferred.

"Isocyanate" as used herein includes diisocyanate, polyisocyanate, and branched isocyanate.

"Diisocyanate" and "polyisocyanate" are used interchangeably herein and refer to aliphatic, cycloaliphatic, and aromatic isocyanates that have at least 2, or in some embodiments more than 2, isocyanate (NCO) groups per molecule, on average. In some embodiments, the isocyanates have, on average, 2.1, 2.3, 2.5, 2.8, or 3 isocyanate groups per molecule, up to 6, 8 or 10 or more isocyanate groups per molecule, on average. In some embodiments, the isocyanates may be a hyperbranched or dendrimeric isocyanate (e.g., containing more than 10 isocyanate groups per molecule, on average, up to 100 or 200 more more isocyanate groups per molecule, on average). Common examples of suitable isocyanates include, but are not limited to, methylene diphenyl diisocyanate (MDI), toluene diisocyanate (TDI)), para-phenyl diisocyanate (PPDI), 4,4'-dicyclohexyl-methane-diisocyanate (HMDI), hexamethylene diisocyanate (HDI), isophorone diisocyanate (IPDI), triphenylmethane-4,4'4"-triisocyanate, tolune-2,4,6-triyl triisocyanate, 1,3,5-triazine-2,4,6-triisocyanate, ethyl ester L-lysine triisocyanate, etc., including combinations thereof. Numerous additional examples are known and are described in, for example, U.S. Pat. Nos. 9,200,108; 8,378,053; 7,144,955; 4,075,151, 3,932,342, and in US Patent Application Publication Nos. US 20040067318 and US 20140371406, the disclosures of all of which are incorporated by reference herein in their entirety.

"Branched isocyanate" as used herein refers to diisocyanates or polyisocyanates as described above that have 3 or more isocyanate groups per molecule, or (with respect to mixtures of different isocyanates) more than 2 isocyanate groups per molecule, on average. In some embodiments, the branched isocyanates have, on average, 2.1, 2.3, 2.5, 2.8, or 3 isocyanate groups per molecule, up to 6, 8 or 10 or more isocyanate groups per molecule, on average. In some embodiments, the isocyanates may be a hyperbranched or dendrimeric isocyanates as discussed above (e.g., containing more than 10 isocyanate groups per molecule, on average, up to 100 or 200 more more isocyanate groups per molecule, on average).

Oxidizable tin salts useful for carrying out the present invention include, but are not limited to, stannous butanoate, stannous octoate, stannous hexanoate, stannous heptanoate, stannous linoleate, stannous phenyl butanoate, stannous phenyl stearate, stannous phenyl oleate, stannous nonanoate, stannous decanoate, stannous undecanoate, stannous dodecanoate, stannous stearate, stannous oleate, stannous undecenoate, stannous 2-ethylhexoate, dibutyl tin dilaurate, dibutyl tin dioleate, dibutyl tin distearate, dipropyl tin dilaurate, dipropyl tin dioleate, dipropyl tin distearate, dibutyl tin dihexanoate, and combinations thereof. See also U.S. Pat. Nos. 5,298,532; 4,421,822; and 4,389,514, the disclosures of which are incorporated herein by reference. In addition to the foregoing oxidizable tin salts, Lewis acids such as those described in Chu et al. in Macromolecular Symposia, Volume 95, Issue 1, pages 233-242, June 1995 are known to enhance the polymerization rates of free-radical polymerizations and are included herein by reference.

Any suitable filler may be used in connection with the present invention, depending on the properties desired in the part or object to be made. Thus, fillers may be solid or liquid, organic or inorganic, and may include reactive and non-reactive rubbers: siloxanes, acrylonitrile-butadiene rubbers; reactive and non-reactive thermoplastics (including but not limited to: poly(ether imides), maleimide-styrene terpolymers, polyarylates, polysulfones and polyethersulfones, etc.) inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners.

One or more polymeric and/or inorganic tougheners can be used as a filler in the present invention. See generally US Patent Application Publication No. 20150215430. The toughener may be uniformly distributed in the form of particles in the cured product. The particles could be less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization. Examples of block copolymers include the copolymers whose composition is described in U.S. Pat. No. 6,894,113 (Court et al., Atofina, 2005) and include "NANOSTRENTH®" SBM (polystyrene-polybutadiene-polymethacrylate), and AMA (polymethacrylate-polybutylacrylate-polymethacrylate), both produced by Arkema. Other suitable block copolymers include FORTEGRA™ and the amphiphilic block copolymers described in U.S. Pat. No. 7,820,760B2, assigned to Dow Chemical. Examples of known core-shell particles include the core-shell (dendrimer) particles whose compositions are described in US20100280151A1 (Nguyen et al., Toray Industries, Inc., 2010) for an amine branched polymer as a shell grafted to a core polymer polymerized from polymerizable monomers containing unsaturated carbon-carbon bonds, core-shell rubber particles whose compositions are described in EP 1632533A1 and EP 2123711A1 by Kaneka Corporation, and the "KaneAce MX" product line of such particle/epoxy blends whose particles have a polymeric core polymerized from polymerizable monomers such as butadiene, styrene, other unsaturated carbon-carbon bond monomer, or their combinations, and a polymeric shell compatible with the epoxy, typically polymethylmethacrylate, polyglycidylmethacrylate, polyacrylonitrile or similar polymers, as discussed further below. Also suitable as block copolymers in the present invention are the "JSR SX" series of carboxylated polystyrene/polydivinylbenzenes produced by JSR Corporation; "Kureha Paraloid" EXL-2655 (produced by Kureha Chemical Industry Co., Ltd.), which is a butadiene alkyl methacrylate styrene copolymer; "Stafiloid" AC-3355 and TR-2122 (both produced by Takeda Chemical Industries, Ltd.), each of which are acrylate methacrylate copolymers; and "PARALOID" EXL-2611 and EXL-3387 (both produced by Rohm & Haas), each of which are butyl acrylate methyl methacrylate copolymers. Examples of suitable oxide particles include NANOPOX® produced by nanoresins AG. This is a master blend of functionalized nanosilica particles and an epoxy.

Core-Shell Rubbers.

Core-shell rubbers are particulate materials (particles) having a rubbery core. Such materials are known and described in, for example, US Patent Application Publication No. 20150184039, as well as US Patent Application Publication No. 20150240113, and U.S. Pat. Nos. 6,861,475, 7,625,977, 7,642,316, 8,088,245, and elsewhere.

In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter; however, if the particles are not spherical, the particle size is defined as the longest dimension of the particle.

In some embodiments, the rubbery core can have a glass transition temperature (Tg) of less than −25° C., more preferably less than −50° C., and even more preferably less than −70° C. The Tg of the rubbery core may be well below −100° C. The core-shell rubber also has at least one shell portion that preferably has a Tg of at least 50° C. By "core," it is meant an internal portion of the core-shell rubber. The core may form the center of the core-shell particle, or an internal shell or domain of the core-shell rubber. A shell is a portion of the core-shell rubber that is exterior to the rubbery core. The shell portion (or portions) typically forms the outermost portion of the core-shell rubber particle. The shell material can be grafted onto the core or is cross-linked. The rubbery core may constitute from 50 to 95%, or from 60 to 90%, of the weight of the core-shell rubber particle.

The core of the core-shell rubber may be a polymer or copolymer of a conjugated diene such as butadiene, or a lower alkyl acrylate such as n-butyl-, ethyl-, isobutyl- or 2-ethylhexylacrylate. The core polymer may in addition contain up to 20% by weight of other copolymerized monounsaturated monomers such as styrene, vinyl acetate, vinyl chloride, methyl methacrylate, and the like. The core polymer is optionally cross-linked. The core polymer optionally contains up to 5% of a copolymerized graft-linking monomer having two or more sites of unsaturation of unequal reactivity, such as diallyl maleate, monoallyl fumarate, allyl methacrylate, and the like, at least one of the reactive sites being non-conjugated.

The core polymer may also be a silicone rubber. These materials often have glass transition temperatures below −100° C. Core-shell rubbers having a silicone rubber core include those commercially available from Wacker Chemie, Munich, Germany, under the trade name GENIOPERL®.

The shell polymer, which is optionally chemically grafted or cross-linked to the rubber core, can be polymerized from at least one lower alkyl methacrylate such as methyl methacrylate, ethyl methacrylate or t-butyl methacrylate. Homopolymers of such methacrylate monomers can be used. Further, up to 40% by weight of the shell polymer can be formed from other monovinylidene monomers such as styrene, vinyl acetate, vinyl chloride, methyl acrylate, ethyl acrylate, butyl acrylate, and the like. The molecular weight of the grafted shell polymer can be between 20,000 and 500,000.

One suitable type of core-shell rubber has reactive groups in the shell polymer which can react with an epoxy resin or an epoxy resin hardener. Glycidyl groups are suitable. These can be provided by monomers such as glycidyl methacrylate.

One example of a suitable core-shell rubber is of the type described in US Patent Application Publication No. 2007/0027233 (EP 1 632 533 A1). Core-shell rubber particles as described therein include a cross-linked rubber core, in most cases being a cross-linked copolymer of butadiene, and a shell which is preferably a copolymer of styrene, methyl methacrylate, glycidyl methacrylate and optionally acrylonitrile. The core-shell rubber is preferably dispersed in a polymer or an epoxy resin, also as described in the document.

Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 153, Kaneka Kane Ace MX 154, Kaneka Kane Ace MX 156, Kaneka Kane Ace MX170, and Kaneka Kane Ace MX 257 and Kaneka Kane Ace MX 120 core-shell rubber dispersions, and mixtures thereof.

I. Polymerizable Liquids: Part A.

Dual cure systems as described herein may include a first curable system (sometimes referred to as "Part A" herein) that is curable by actinic radiation, typically light, and in some embodiments ultraviolet (UV) light). Any suitable polymerizable liquid can be used as the first component. The liquid (sometimes also referred to as "liquid resin" "ink," or simply "resin" herein) can include a monomer, particularly photopolymerizable and/or free radical polymerizable monomers, and a suitable initiator such as a free radical initiator, and combinations thereof. Examples include, but are not limited to, acrylics, methacrylics, acrylamides, styrenics, olefins, halogenated olefins, cyclic alkenes, maleic anhydride, alkenes, alkynes, carbon monoxide, functionalized oligomers, multifunctional cute site monomers, functionalized PEGs, etc., including combinations thereof. Examples of liquid resins, monomers and initiators include but are not limited to those set forth in U.S. Pat. Nos. 8,232,043; 8,119,214; 7,935,476; 7,767,728; 7,649,029; WO 2012129968 A1; CN 102715751 A; JP 2012210408 A.

Acid Catalyzed Polymerizable Liquids.

While in some embodiments as noted above the polymerizable liquid comprises a free radical polymerizable liquid (in which case an inhibitor may be oxygen as described below), in other embodiments the polymerizable liquid comprises an acid catalyzed, or cationically polymerized, polymerizable liquid. In such embodiments the polymerizable liquid comprises monomers that contain groups suitable for acid catalysis, such as epoxide groups, vinyl ether groups, etc. Thus suitable monomers include olefins such as methoxyethene, 4-methoxystyrene, styrene, 2-methylprop-1-ene, 1,3-butadiene, etc.; heterocycloic monomers (including lactones, lactams, and cyclic amines) such as oxirane, thietane, tetrahydrofuran, oxazoline, 1,3, dioxepane, oxetan-2-one, etc., and combinations thereof. A suitable (generally ionic or non-ionic) photoacid generator (PAG) is included in the acid catalyzed polymerizable liquid, examples of which include, but are not limited to onium salts, sulfonium and iodonium salts, etc., such as diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, etc., including mixtures thereof. See, e.g., U.S. Pat. Nos. 7,824,839; 7,550,246; 7,534,844; 6,692,891; 5,374,500; and 5,017,461; see also *Photoacid Generator Selection Guide for the electronics industry and energy curable coatings* (BASF 2010).

Hydrogels.

In some embodiments suitable resins includes photocurable hydrogels like poly(ethylene glycols) (PEG) and gelatins. PEG hydrogels have been used to deliver a variety of biologicals, including growth factors; however, a great challenge facing PEG hydrogels crosslinked by chain growth polymerizations is the potential for irreversible protein damage. Conditions to maximize release of the biologicals from photopolymerized PEG diacrylate hydrogels can be enhanced by inclusion of affinity binding peptide sequences in the monomer resin solutions, prior to photopolymerization allowing sustained delivery. Gelatin is a biopolymer frequently used in food, cosmetic, pharmaceutical and photographic industries. It is obtained by thermal denaturation or chemical and physical degradation of collagen. There are three kinds of gelatin, including those found in animals, fish and humans. Gelatin from the skin of cold water fish is considered safe to use in pharmaceutical applications. UV or visible light can be used to crosslink appropriately modified gelatin. Methods for crosslinking gelatin include cure derivatives from dyes such as Rose Bengal.

Photocurable Silicone Resins.

A suitable resin includes photocurable silicones. UV cure silicone rubber, such as Siliopren™ UV Cure Silicone Rubber can be used as can LOCTITE™ Cure Silicone adhesives sealants. Applications include optical instruments, medical and surgical equipment, exterior lighting and enclosures, electrical connectors/sensors, fiber optics, gaskets, and molds.

Biodegradable Resins.

Biodegradable resins are particularly important for implantable devices to deliver drugs or for temporary performance applications, like biodegradable screws and stents (U.S. Pat. Nos. 7,919,162; 6,932,930). Biodegradable copolymers of lactic acid and glycolic acid (PLGA) can be dissolved in PEG di(meth)acrylate to yield a transparent resin suitable for use. Polycaprolactone and PLGA oligomers can be functionalized with acrylic or methacrylic groups to allow them to be effective resins for use.

Photocurable Polyurethanes.

A particularly useful resin is photocurable polyurethanes (including polyureas, and copolymers of polyurethanes and polyureas (e.g., poly(urethane-urea)). A photopolymerizable polyurethane/polyurea composition comprising (1) a polyurethane based on an aliphatic diisocyanate, poly(hexamethylene isophthalate glycol) and, optionally, 1,4-butanediol; (2) a polyfunctional acrylic ester; (3) a photoinitiator; and (4) an anti-oxidant, can be formulated so that it provides a hard, abrasion-resistant, and stain-resistant material (U.S. Pat. No. 4,337,130). Photocurable thermoplastic polyurethane elastomers incorporate photoreactive diacetylene diols as chain extenders.

High Performance Resins.

In some embodiments, high performance resins are used. Such high performance resins may sometimes require the use of heating to melt and/or reduce the viscosity thereof, as noted above and discussed further below. Examples of such resins include, but are not limited to, resins for those materials sometimes referred to as liquid crystalline polymers of esters, ester-imide, and ester-amide oligomers, as described in U.S. Pat. Nos. 7,507,784; 6,939,940. Since such resins are sometimes employed as high-temperature thermoset resins, in the present invention they further comprise a suitable photoinitiator such as benzophenone, anthraquinone, and fluoroenone initiators (including derivatives thereof), to initiate cross-linking on irradiation, as discussed further below.

Additional Example Resins.

Particularly useful resins for dental applications include EnvisionTEC's Clear Guide, EnvisionTEC's E-Denstone Material. Particularly useful resins for hearing aid industries include EnvisionTEC's e-Shell 300 Series of resins. Particularly useful resins include EnvisionTEC's HTM140IV High Temperature Mold Material for use directly with vulcanized rubber in molding/casting applications. A particularly useful material for making tough and stiff parts includes EnvisionTEC's RC31 resin. Particularly useful resin for investment casting applications include EnvisionTEC's Easy Cast EC500 resin and MadeSolid FireCast resin.

Additional Resin Ingredients.

The liquid resin or polymerizable material can have solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 μm average diameter).

The particles can comprise an active agent or detectable compound as described below, though these may also be provided dissolved solubilized in the liquid resin as also discussed below. For example, magnetic or paramagnetic particles or nanoparticles can be employed.

The liquid resin can have additional ingredients solubilized therein, including pigments, dyes, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Non-Reactive Light Absorbers.

In some embodiments, polymerizable liquids for carrying out the present invention include a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a a hydroxybenzophenone, hydroxyphenylbenzotriazole, oxanilide, benzophenone, thioxanthone, hydroxypenyltriazine, and/or benzotriazole ultraviolet light absorber (e.g., Mayzo BLS1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058; 6,916,867; 7,157,586; and 7,695,643, the disclosures of which are incorporated herein by reference.

Inhibitors of Polymerization.

Inhibitors or polymerization inhibitors for use in the present invention may be in the form of a liquid or a gas. In some embodiments, gas inhibitors are preferred. In some embodiments, liquid inhibitors such as oils or lubricants (e.g., fluorinated oils such as perfluoropolyethers) may be employed, as inhibitors (or as release layers that maintain a liquid interface). The specific inhibitor will depend upon the monomer being polymerized and the polymerization reaction. For free radical polymerization monomers, the inhibitor can conveniently be oxygen, which can be provided in the form of a gas such as air, a gas enriched in oxygen (optionally but in some embodiments preferably containing additional inert gases to reduce combustibility thereof), or in some embodiments pure oxygen gas. In alternate embodiments, such as where the monomer is polymerized by a photoacid generator initiator, the inhibitor can be a base such as ammonia, trace amines (e.g., methyl amine, ethyl amine, di and trialkyl amines such as dimethyl amine, diethyl amine, trimethyl amine, triethyl amine, etc.), or carbon dioxide, including mixtures or combinations thereof.

Polymerizable Liquids Carrying Live Cells.

In some embodiments, the polymerizable liquid may carry live cells as "particles" therein. Such polymerizable liquids are generally aqueous, and may be oxygenated, and may be considered as "emulsions" where the live cells are the discrete phase. Suitable live cells may be plant cells (e.g., monocot, dicot), animal cells (e.g., mammalian, avian, amphibian, reptile cells), microbial cells (e.g., prokaryote, eukaryote, protozoal, etc.), etc. The cells may be of differentiated cells from or corresponding to any type of tissue (e.g., blood, cartilage, bone, muscle, endocrine gland, exocrine gland, epithelial, endothelial, etc.), or may be undifferentiated cells such as stem cells or progenitor cells. In such embodiments the polymerizable liquid can be one that forms a hydrogel, including but not limited to those described in U.S. Pat. Nos. 7,651,683; 7,651,682; 7,556,490; 6,602,975; 5,836,313; etc.

II. Apparatus.

Figure 3:
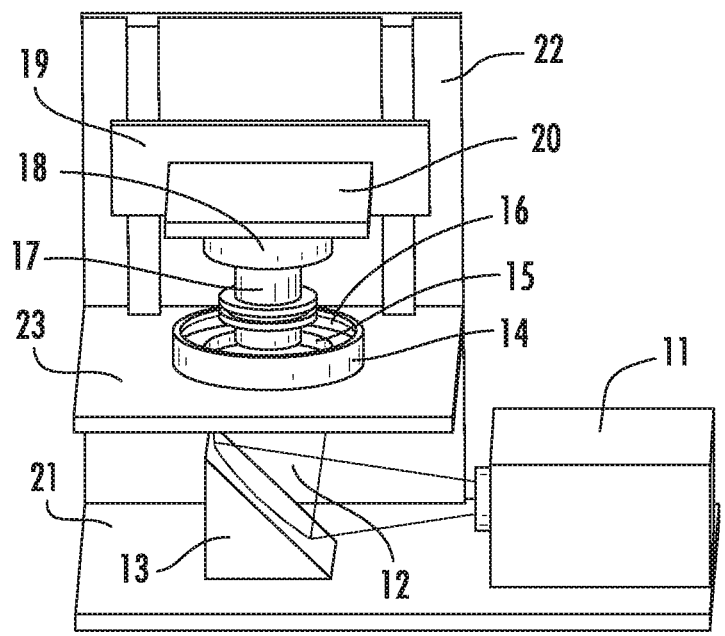
FIG. 3 is a perspective view of one embodiment of an apparatus of the present invention.

A non-limiting embodiment of an apparatus of the invention is shown in FIG. 3. It comprises a radiation source 11 such as a digital light processor (DLP) providing electromagnetic radiation 12 which though reflective mirror 13 illuminates a build chamber defined by wall 14 and a rigid or flexible build plate 15 forming the bottom of the build chamber, which build chamber is filled with liquid resin 16. The bottom of the chamber 15 is constructed of a build plate comprising a rigid or flexible semipermeable member as discussed further below. The top of the object under construction 17 is attached to a carrier 18. The carrier is driven in the vertical direction by linear stage 19, although alternate structures can be used as discussed below.

A liquid resin reservoir, tubing, pumps, liquid level sensors and/or valves can be included to replenish the pool of liquid resin in the build chamber (not shown for clarity) though in some embodiments a simple gravity feed may be employed. Drives/actuators for the carrier or linear stage, along with associated wiring, can be included in accordance with known techniques (again not shown for clarity). The drives/actuators, radiation source, and in some embodiments pumps and liquid level sensors can all be operatively associated with a suitable controller, again in accordance with known techniques.

Build plates 15 used to carry out the present invention generally comprise or consist of a (typically rigid or solid, stationary, and/or fixed, although in some embodiments flexible) semipermeable (or gas permeable) member, alone or in combination with one or more additional supporting substrates (e.g., clamps and tensioning members to tension and stabilize an otherwise flexible semipermeable material). The semipermeable member can be made of any suitable material that is optically transparent at the relevant wavelengths (or otherwise transparent to the radiation source, whether or not it is visually transparent as perceived by the human eye—i.e., an optically transparent window may in some embodiments be visually opaque), including but not limited to porous or microporous glass, and the rigid gas permeable polymers used for the manufacture of rigid gas permeable contact lenses. See, e.g., Norman G. Gaylord, U.S. Pat. No. RE31,406; see also U.S. Pat. Nos. 7,862,176; 7,344,731; 7,097,302; 5,349,394; 5,310,571; 5,162,469; 5,141,665; 5,070,170; 4,923,906; and 4,845,089. In some embodiments such materials are characterized as glassy and/or amorphous polymers and/or substantially crosslinked that they are essentially non-swellable. Preferably the semipermeable member is formed of a material that does not swell when contacted to the liquid resin or material to be polymerized (i.e., is "non-swellable"). Suitable materials for the semipermeable member include amorphous fluoropolymers, such as those described in U.S. Pat. Nos. 5,308,685 and 5,051,115. For example, such fluoropolymers are particularly useful over silicones that would potentially swell when used in conjunction with organic liquid resin inks to be polymerized. For some liquid resin inks, such as more aqueous-based monomeric systems and/or some polymeric resin ink systems that have low swelling tendencies, silicone based window materials maybe suitable. The solubility or permeability of organic liquid resin inks can be dramatically decreased by a number of known parameters including increasing the crosslink density of the window material or increasing the molecular weight of the liquid resin ink. In some embodiments the build plate may be formed from a thin film or sheet of material which is flexible when separated from the apparatus of the invention, but which is clamped and tensioned when installed in the apparatus (e.g., with a tensioning ring) so that it is tensioned and stabilized in the apparatus. Particular materials include TEFLON AF® fluoropolymers, commercially available from DuPont. Additional materials include perfluoropolyether polymers such as described in U.S. Pat. Nos. 8,268,446; 8,263,129; 8,158,728; and 7,435,495.

It will be appreciated that essentially all solid materials, and most of those described above, have some inherent "flex" even though they may be considered "rigid," depending on factors such as the shape and thickness thereof and environmental factors such as the pressure and temperature to which they are subjected. In addition, the terms "stationary" or "fixed" with respect to the build plate is intended to mean that no mechanical interruption of the process occurs, or no mechanism or structure for mechanical interruption of the process (as in a layer-by-layer method or apparatus) is provided, even if a mechanism for incremental adjustment of the build plate (for example, adjustment that does not lead to or cause collapse of the gradient of polymerization zone) is provided.

The semipermeable member typically comprises a top surface portion, a bottom surface portion, and an edge surface portion. The build surface is on the top surface portion; and the feed surface may be on one, two, or all three of the top surface portion, the bottom surface portion, and/or the edge surface portion. In the embodiment illustrated in FIG. 3 the feed surface is on the bottom surface portion, but alternate configurations where the feed surface is provided on an edge, and/or on the top surface portion (close to but separate or spaced away from the build surface) can be implemented with routine skill.

The semipermeable member has, in some embodiments, a thickness of from 0.01, 0.1 or 1 millimeters to 10 or 100 millimeters, or more, depending upon the size of the item being fabricated, whether or not it is laminated to or in contact with an additional supporting plate such as glass, etc., as discussed further below.

The permeability of the semipermeable member to the polymerization inhibitor will depend upon conditions such as the pressure of the atmosphere and/or inhibitor, the choice of inhibitor, the rate or speed of fabrication, etc. In general, when the inhibitor is oxygen, the permeability of the semipermeable member to oxygen may be from 10 or 20 Barrers, up to 1000 or 2000 Barrers, or more. For example, a semipermeable member with a permeability of 10 Barrers used with a pure oxygen, or highly enriched oxygen, atmosphere under a pressure of 150 PSI may perform substantially the same as a semipermeable member with a permeability of 500 Barrers when the oxygen is supplied from the ambient atmosphere under atmospheric conditions.

Thus, the semipermeable member may comprise a flexible polymer film (having any suitable thickness, e.g., from 0.001, 0.01, 0.05, 0.1 or 1 millimeters to 1, 5, 10, or 100 millimeters, or more), and the build plate may further comprise a tensioning member (e.g., a peripheral clamp and an operatively associated strain member or stretching member, as in a "drum head"; a plurality of peripheral clamps, etc., including combinations thereof) connected to the polymer film and to fix and tension, stabilize or rigidify the film (e.g., at least sufficiently so that the film does not stick to the object as the object is advanced and resiliently or elastically rebound therefrom). The film has a top surface and a bottom surface, with the build surface on the top surface and the feed surface preferably on the bottom surface. In other embodiments, the semipermeable member comprises: (i) a polymer film layer (having any suitable thickness, e.g., from 0.001, 0.01, 0.1 or 1 millimeters to 5, 10 or 100 millimeters, or more), having a top surface positioned for contacting the polymerizable liquid and a bottom surface, and (ii) a gas permeable, optically transparent supporting member (having any suitable thickness, e.g., from 0.01, 0.1 or 1 millimeters to 10, 100, or 200 millimeters, or more), contacting the film layer bottom surface. The supporting member has a top surface contacting the film layer bottom surface, and the supporting member has a bottom surface which may serve as the feed surface for the polymerization inhibitor. Any suitable materials that are semipermeable (that is, permeable to the polymerization inhibitor) may be used. For example, the polymer film or polymer film layer may be a fluoropolymer film, such as an amorphous thermoplastic fluoropolymer like TEFLON AF 1600™ or TEFLON AF 2400™ fluoropolymer films, or perfluoropolyether (PFPE), particularly a crosslinked PFPE film, or a crosslinked silicone polymer film. The supporting member comprises a silicone or crosslinked silicone polymer member such as a polydimethylsiloxane polydimethylxiloxane member, a gas permeable polymer member, or a porous or microporous glass member. Films can be laminated or clamped directly to the rigid supporting member without adhesive (e.g., using PFPE and PDMS materials), or silane coupling agents that react with the upper surface of a PDMS layer can be utilized to adhere to the first polymer film layer. UV-curable, acrylate-functional silicones can also be used as a tie layer between UV-curable PFPEs and rigid PDMS supporting layers.

When configured for placement in the apparatus, the carrier defines a "build region" on the build surface, within the total area of the build surface. Because lateral "throw" (e.g., in the X and/or Y directions) is not required in the present invention to break adhesion between successive layers, as in the Joyce and Chen devices noted previously, the area of the build region within the build surface may be maximized (or conversely, the area of the build surface not devoted to the build region may be minimized). Hence in some embodiments, the total surface area of the build region can occupy at least fifty, sixty, seventy, eighty, or ninety percent of the total surface area of the build surface.

As shown in FIG. 3, the various components are mounted on a support or frame assembly 20. While the particular design of the support or frame assembly is not critical and can assume numerous configurations, in the illustrated embodiment it is comprised of a base 21 to which the radiation source 11 is securely or rigidly attached, a vertical member 22 to which the linear stage is operatively associated, and a horizontal table 23 to which wall 14 is removably or securely attached (or on which the wall is placed), and with the build plate fixed, either permanently or removably, to form the build chamber as described above.

As noted above, the build plate can consist of a single unitary and integral piece of a semipermeable member, or can comprise additional materials. For example, a porous or microporous glass can be laminated or fixed to a semipermeable material. Or, a semipermeable member as an upper portion can be fixed to a transparent lower member having purging channels formed therein for feeding gas carrying the polymerization inhibitor to the semipermeable member (through which it passes to the build surface to facilitate the formation of a release layer of unpolymerized liquid material, as noted above and below). Such purge channels may extend fully or partially through the base plate: For example, the purge channels may extend partially into the base plate, but then end in the region directly underlying the build surface to avoid introduction of distortion. Specific geometries will depend upon whether the feed surface for the inhibitor into the semipermeable member is located on the same side or opposite side as the build surface, on an edge portion thereof, or a combination of several thereof.

Any suitable radiation source (or combination of sources) can be used, depending upon the particular resin employed, including electron beam and ionizing radiation sources. In a preferred embodiment the radiation source is an actinic radiation source, such as one or more light sources, and in particular one or more ultraviolet light sources. Any suitable light source can be used, such as incandescent lights, fluorescent lights, phosphorescent or luminescent lights, a laser, light-emitting diode, etc., including arrays thereof. The light source preferably includes a pattern-forming element operatively associated with a controller, as noted above. In some embodiments, the light source or pattern forming element comprises a digital (or deformable) micromirror device (DMD) with digital light processing (DLP), a spatial modulator (SLM), or a microelectromechanical system (MEMS) mirror array, a liquid crystal display (LCD) panel, a mask (aka a reticle), a silhouette, or a combination thereof. See, U.S. Pat. No. 7,902,526. Preferably the light source comprises a spatial light modulation array such as a liquid crystal light valve array or micromirror array or DMD (e.g., with an operatively associated digital light processor, typically in turn under the control of a suitable controller), configured to carry out exposure or irradiation of the polymerizable liquid without a mask, e.g., by maskless photolithography. See, e.g., U.S. Pat. Nos. 6,312,134; 6,248,509; 6,238,852; and 5,691,541.

In some embodiments, as discussed further below, there may be movement in the X and/or Y directions concurrently with movement in the Z direction, with the movement in the X and/or Y direction hence occurring during polymerization of the polymerizable liquid (this is in contrast to the movement described in Y. Chen et al., or M. Joyce, supra, which is movement between prior and subsequent polymerization steps for the purpose of replenishing polymerizable liquid). In the present invention such movement may be carried out for purposes such as reducing "burn in" or fouling in a particular zone of the build surface.

Because an advantage of some embodiments of the present invention is that the size of the build surface on the semipermeable member (i.e., the build plate or window) may be reduced due to the absence of a requirement for extensive lateral "throw" as in the Joyce or Chen devices noted above, in the methods, systems and apparatus of the present invention lateral movement (including movement in the X and/or Y direction or combination thereof) of the carrier and object (if such lateral movement is present) is preferably not more than, or less than, 80, 70, 60, 50, 40, 30, 20, or even 10 percent of the width (in the direction of that lateral movement) of the build region.

While in some embodiments the carrier is mounted on an elevator to advance up and away from a stationary build plate, on other embodiments the converse arrangement may be used: That is, the carrier may be fixed and the build plate lowered to thereby advance the carrier away therefrom. Numerous different mechanical configurations will be apparent to those skilled in the art to achieve the same result.

Depending on the choice of material from which the carrier is fabricated, and the choice of polymer or resin from which the article is made, adhesion of the article to the carrier may sometimes be insufficient to retain the article on the carrier through to completion of the finished article or "build." For example, an aluminum carrier may have lower adhesion than a poly(vinyl chloride) (or "PVC") carrier. Hence one solution is to employ a carrier comprising a PVC on the surface to which the article being fabricated is polymerized. If this promotes too great an adhesion to conveniently separate the finished part from the carrier, then any of a variety of techniques can be used to further secure the article to a less adhesive carrier, including but not limited to the application of adhesive tape such as "Greener Masking Tape for Basic Painting #2025 High adhesion" to further secure the article to the carrier during fabrication.

III. Controller and Process Control.

The methods and apparatus of the invention can include process steps and apparatus features to implement process control, including feedback and feed-forward control, to, for example, enhance the speed and/or reliability of the method.

A controller for use in carrying out the present invention may be implemented as hardware circuitry, software, or a combination thereof. In one embodiment, the controller is a general purpose computer that runs software, operatively associated with monitors, drives, pumps, and other components through suitable interface hardware and/or software. Suitable software for the control of a three-dimensional printing or fabrication method and apparatus as described herein includes, but is not limited to, the ReplicatorG open source 3d printing program, 3DPrint™ controller software from 3D systems, Slic3r, Skeinforge, KISSlicer, Repetier-Host, PrintRun, Cura, etc., including combinations thereof.

Process parameters to directly or indirectly monitor, continuously or intermittently, during the process (e.g., during one, some or all of the filling, irradiating and advancing steps) include, but are not limited to, irradiation intensity, temperature of carrier, polymerizable liquid in the build zone, temperature of growing product, temperature of build plate, pressure, speed of advance, pressure, force (e.g., exerted on the build plate through the carrier and product being fabricated), strain (e.g., exerted on the carrier by the growing product being fabricated), thickness of release layer, etc.

Known parameters that may be used in feedback and/or feed-forward control systems include, but are not limited to, expected consumption of polymerizable liquid (e.g., from the known geometry or volume of the article being fabricated), degradation temperature of the polymer being formed from the polymerizable liquid, etc.

Process conditions to directly or indirectly control, continuously or step-wise, in response to a monitored parameter, and/or known parameters (e.g., during any or all of the process steps noted above), include, but are not limited to, rate of supply of polymerizable liquid, temperature, pressure, rate or speed of advance of carrier, intensity of irradiation, duration of irradiation (e.g., for each "slice"), etc.

For example, the temperature of the polymerizable liquid in the build zone, or the temperature of the build plate, can be monitored, directly or indirectly with an appropriate thermocouple, non-contact temperature sensor (e.g., an infrared temperature sensor), or other suitable temperature sensor, to determine whether the temperature exceeds the degradation temperature of the polymerized product. If so, a process parameter may be adjusted through a controller to reduce the temperature in the build zone and/or of the build plate. Suitable process parameters for such adjustment may include: decreasing temperature with a cooler, decreasing the rate of advance of the carrier, decreasing intensity of the irradiation, decreasing duration of radiation exposure, etc.

In addition, the intensity of the irradiation source (e.g., an ultraviolet light source such as a mercury lamp) may be monitored with a photodetector to detect a decrease of intensity from the irradiation source (e.g., through routine degradation thereof during use). If detected, a process parameter may be adjusted through a controller to accommodate the loss of intensity. Suitable process parameters for such adjustment may include: increasing temperature with a heater, decreasing the rate of advance of the carrier, increasing power to the light source, etc.

As another example, control of temperature and/or pressure to enhance fabrication time may be achieved with heaters and coolers (individually, or in combination with one another and separately responsive to a controller), and/or with a pressure supply (e.g., pump, pressure vessel, valves and combinations thereof) and/or a pressure release mechanism such as a controllable valve (individually, or in combination with one another and separately responsive to a controller).

Figure 2:
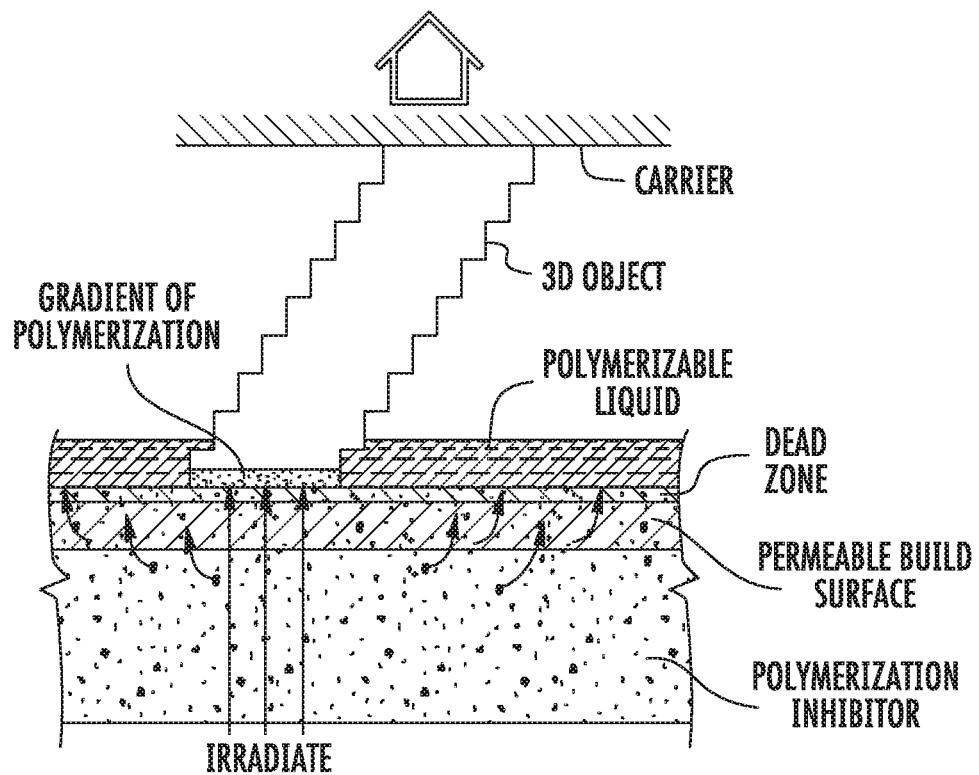
FIG. 2 is a schematic illustration of one embodiment of a method of the present invention.

In some embodiments, the controller is configured to maintain the gradient of polymerization zone described herein (see, e.g., FIG. 2) throughout the fabrication of some or all of the final product. The specific configuration (e.g., times, rate or speed of advancing, radiation intensity, temperature, etc.) will depend upon factors such as the nature of the specific polymerizable liquid and the product being created. Configuration to maintain the gradient of polymerization zone may be carried out empirically, by entering a set of process parameters or instructions previously determined, or determined through a series of test runs or "trial and error"; configuration may be provided through pre-determined instructions; configuration may be achieved by suitable monitoring and feedback (as discussed above), combinations thereof, or in any other suitable manner.

Figure 4:
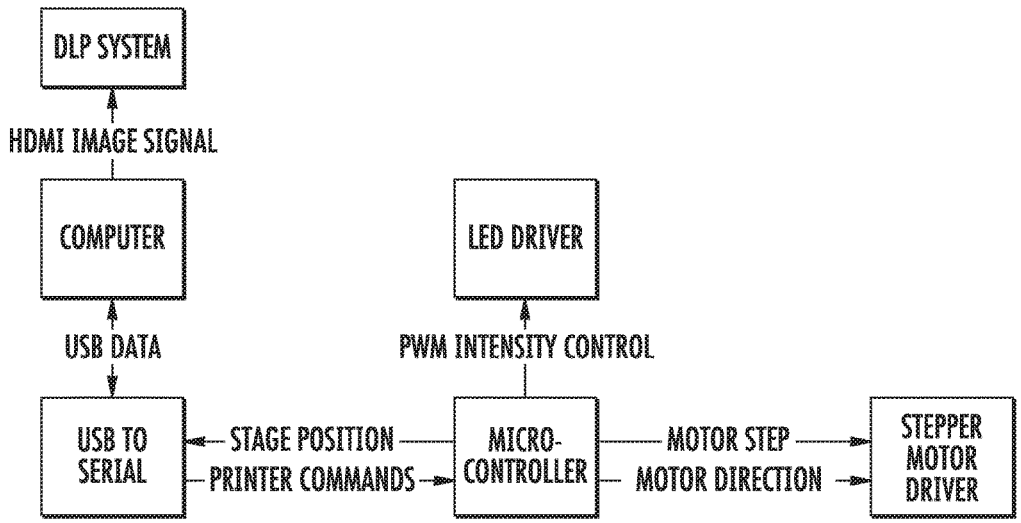
FIG. 4 is a first flow chart illustrating control systems and methods for carrying out the present invention.
Figure 5:
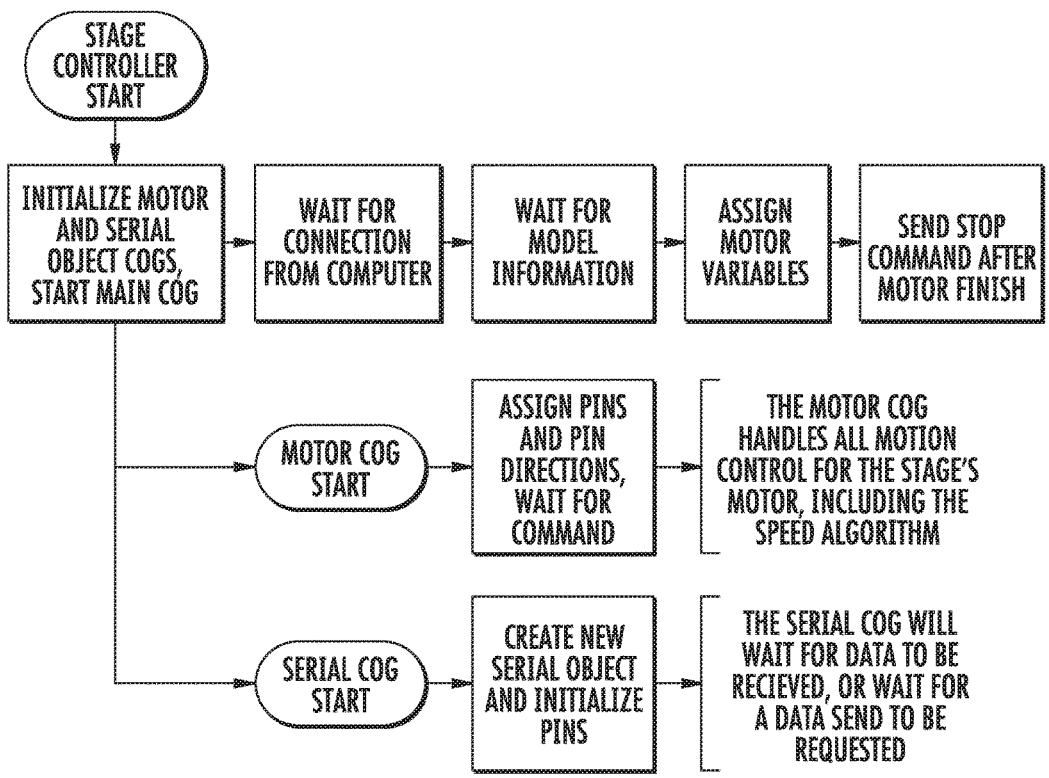
FIG. 5 is a second flow chart illustrating control systems and methods for carrying out the present invention.
Figure 6:
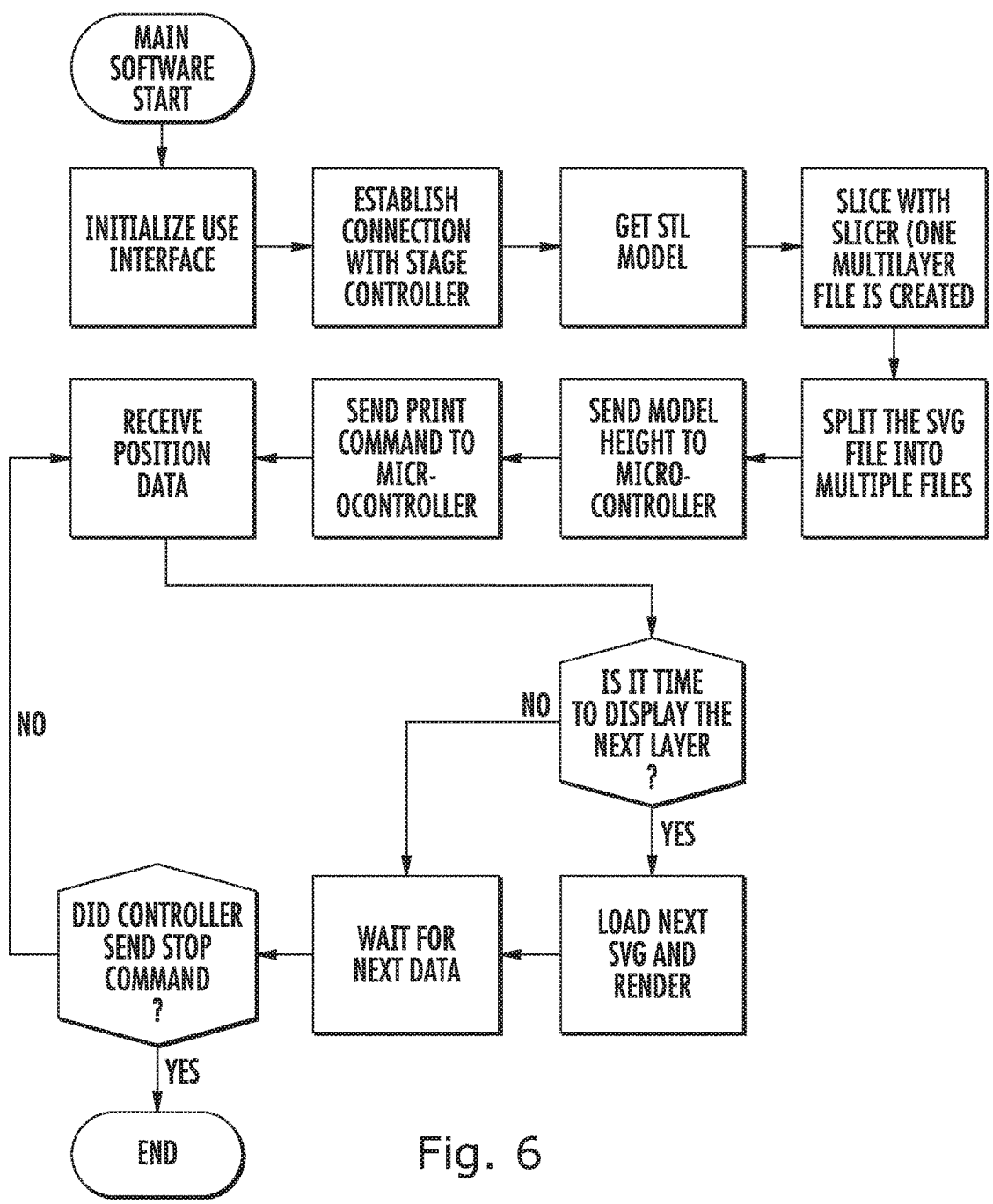
FIG. 6 is a third flow chart illustrating control systems and methods for carrying out the present invention.

In some embodiments, a method and apparatus as described above may be controlled by a software program running in a general purpose computer with suitable interface hardware between that computer and the apparatus described above. Numerous alternatives are commercially available. Non-limiting examples of one combination of components is shown in FIG. 4 to FIG. 6, where "Microcontroller" is Parallax Propeller, the Stepper Motor Driver is Sparkfun EasyDriver, the LED Driver is a Luxeon Single LED Driver, the USB to Serial is a Parallax USB to Serial converter, and the DLP System is a Texas Instruments LightCrafter system.

IV. General Methods.

The three-dimensional intermediate is preferably formed from resins as described above by additive manufacturing, typically bottom-up or top-down additive manufacturing. In general, top-down three-dimensional fabrication is carried out by:

(a) providing a polymerizable liquid reservoir having a polymerizable liquid fill level and a carrier positioned in the reservoir, the carrier and the fill level defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light to form a solid polymer scaffold from the first component and also advancing (typically lowering) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

A wiper blade, doctor blade, or optically transparent (rigid or flexible) window, may optionally be provided at the fill level to facilitate leveling of the polymerizable liquid, in accordance with known techniques. In the case of an optically transparent window, the window provides a build surface against which the three-dimensional intermediate is formed, analogous to the build surface in bottom-up three-dimensional fabrication as discussed below.

In general, bottom-up three-dimensional fabrication is carried out by:

(a) providing a carrier and an optically transparent member having a build surface, the carrier and the build surface defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light through said optically transparent member to form a solid polymer scaffold from the first component and also advancing (typically raising) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

In some embodiments of bottom-up or top-down three-dimensional fabrication as implemented in the context of the present invention, the build surface is stationary during the formation of the three-dimensional intermediate; in other embodiments of bottom-up three-dimensional fabrication as implemented in the context of the present invention, the build surface is tilted, slid, flexed and/or peeled, and/or otherwise translocated or released from the growing three-dimensional intermediate, usually repeatedly, during formation of the three-dimensional intermediate.

In some embodiments of bottom-up or top-down three-dimensional fabrication as carried out in the context of the present invention, the polymerizable liquid (or resin) is maintained in liquid contact with both the growing three-dimensional intermediate and the build surface during both the filling and irradiating steps, during fabrication of some of, a major portion of, or all of the three-dimensional intermediate.

In some embodiments of bottom-up or top-down three-dimensional fabrication as carried out in the context of the present invention, the growing three-dimensional intermediate is fabricated in a layerless manner (e.g., through multiple exposures or "slices" of patterned actinic radiation or light) during at least a portion of the formation of the three-dimensional intermediate.

In some embodiments of bottom up or top down three-dimensional fabrication as carried out in the context of the present invention, the growing three-dimensional intermediate is fabricated in a layer-by-layer manner (e.g., through multiple exposures or "slices" of patterned actinic radiation or light), during at least a portion of the formation of the three-dimensional intermediate.

In some embodiments of bottom up or top down three-dimensional fabrication employing a rigid or flexible optically transparent window, a lubricant or immiscible liquid may be provided between the window and the polymerizable liquid (e.g., a fluorinated fluid or oil such as a perfluoropolyether oil).

From the foregoing it will be appreciated that, in some embodiments of bottom-up or top down three-dimensional fabrication as carried out in the context of the present invention, the growing three-dimensional intermediate is fabricated in a layerless manner during the formation of at least one portion thereof, and that same growing three-dimensional intermediate is fabricated in a layer-by-layer manner during the formation of at least one other portion thereof. Thus, operating mode may be changed once, or on multiple occasions, between layerless fabrication and layer-by-layer fabrication, as desired by operating conditions such as part geometry.

In some embodiments, the intermediate is formed by continuous liquid interface production (CLIP), as discussed further below.

As noted above, the present invention provides (in some embodiments) a method of forming a three-dimensional object, comprising the steps of: (a) providing a carrier and a build plate, the build plate comprising a semipermeable member, the semipermeable member comprising a build surface and a feed surface separate from the build surface, with the build surface and the carrier defining a build region therebetween, and with the feed surface in fluid contact with a polymerization inhibitor; then (concurrently and/or sequentially) (b) filling the build region with a polymerizable liquid, the polymerizable liquid contacting the build segment, (c) irradiating the build region through the build plate to produce a solid polymerized region in the build region, with a liquid film release layer comprised of the polymerizable liquid formed between the solid polymerized region and the build surface, the polymerization of which liquid film is inhibited by the polymerization inhibitor; and (d) advancing the carrier with the polymerized region adhered thereto away from the build surface on the stationary build plate to create a subsequent build region between the polymerized region and the top zone. In general the method includes (e) continuing and/or repeating steps (b) through (d) to produce a subsequent polymerized region adhered to a previous polymerized region until the continued or repeated deposition of polymerized regions adhered to one another forms the three-dimensional object.

Since no mechanical release of a release layer is required, or no mechanical movement of a build surface to replenish oxygen or other inhibitor is required, the method can be carried out in a continuous fashion, though it will be appreciated that the individual steps noted above may be carried out sequentially, concurrently, or a combination thereof. Indeed, the rate of steps can be varied over time depending upon factors such as the density and/or complexity of the region under fabrication.

Also, since mechanical release from a window or from a release layer generally requires that the carrier be advanced a greater distance from the build plate than desired for the next irradiation step, which enables the window to be recoated, and then return of the carrier back closer to the build plate (e.g., a "two steps forward one step back" operation), the present invention in some embodiments permits elimination of this "back-up" step and allows the carrier to be advanced unidirectionally, or in a single direction, without intervening movement of the window for re-coating, or "snapping" of a pre-formed elastic release-layer. However, in other embodiments of the invention, reciprocation is utilized not for the purpose of obtaining release, but for the purpose of more rapidly filling or pumping polymerizable liquid into the build region.

While the dead zone and the gradient of polymerization zone do not have a strict boundary therebetween (in those locations where the two meet), the thickness of the gradient of polymerization zone is in some embodiments at least as great as the thickness of the dead zone. Thus, in some embodiments, the dead zone has a thickness of from 0.01, 0.1, 1, 2, or 10 microns up to 100, 200 or 400 microns, or more, and/or the gradient of polymerization zone and the dead zone together have a thickness of from 1 or 2 microns up to 400, 600, or 1000 microns, or more. Thus the gradient of polymerization zone may be thick or thin depending on the particular process conditions at that time. Where the gradient of polymerization zone is thin, it may also be described as an active surface on the bottom of the growing three-dimensional object, with which monomers can react and continue to form growing polymer chains therewith. In some embodiments, the gradient of polymerization zone, or active surface, is maintained (while polymerizing steps continue) for a time of at least 5, 10, 15, 20 or 30 seconds, up to 5, 10, 15 or 20 minutes or more, or until completion of the three-dimensional product.

The method may further comprise the step of disrupting the gradient of polymerization zone for a time sufficient to form a cleavage line in the three-dimensional object (e.g., at a predetermined desired location for intentional cleavage, or at a location in the object where prevention of cleavage or reduction of cleavage is non-critical), and then reinstating the gradient of polymerization zone (e.g., by pausing, and resuming, the advancing step, increasing, then decreasing, the intensity of irradiation, and combinations thereof).

In some embodiments, the advancing step is carried out sequentially in uniform increments (e.g., of from 0.1 or 1 microns, up to 10 or 100 microns, or more) for each step or increment. In some embodiments, the advancing step is carried out sequentially in variable increments (e.g., each increment ranging from 0.1 or 1 microns, up to 10 or 100 microns, or more) for each step or increment. The size of the increment, along with the rate of advancing, will depend in part upon factors such as temperature, pressure, structure of the article being produced (e.g., size, density, complexity, configuration, etc.)

In other embodiments of the invention, the advancing step is carried out continuously, at a uniform or variable rate.

In some embodiments, the rate of advance (whether carried out sequentially or continuously) is from about 0.1 1, or 10 microns per second, up to about to 100, 1,000, or 10,000 microns per second, again depending on factors such as temperature, pressure, structure of the article being produced, intensity of radiation, etc As described further below, in some embodiments the filling step is carried out by forcing the polymerizable liquid into the build region under pressure. In such a case, the advancing step or steps may be carried out at a rate or cumulative or average rate of at least 0.1, 1, 10, 50, 100, 500 or 1000 microns per second, or more. In general, the pressure may be whatever is sufficient to increase the rate of the advancing step(s) at least 2, 4, 6, 8 or 10 times as compared to the maximum rate of repetition of the advancing steps in the absence of the pressure. Where the pressure is provided by enclosing an apparatus such as described above in a pressure vessel and carrying the process out in a pressurized atmosphere (e.g., of air, air enriched with oxygen, a blend of gasses, pure oxygen, etc.) a pressure of 10, 20, 30 or 40 pounds per square inch (PSI) up to, 200, 300, 400 or 500 PSI or more, may be used. For fabrication of large irregular objects higher pressures may be less preferred as compared to slower fabrication times due to the cost of a large high pressure vessel. In such an embodiment, both the feed surface and the polymerizable liquid can be are in fluid contact with the same compressed gas (e.g., one comprising from 20 to 95 percent by volume of oxygen, the oxygen serving as the polymerization inhibitor.

On the other hand, when smaller items are fabricated, or a rod or fiber is fabricated that can be removed or exited from the pressure vessel as it is produced through a port or orifice therein, then the size of the pressure vessel can be kept smaller relative to the size of the product being fabricated and higher pressures can (if desired) be more readily utilized.

As noted above, the irradiating step is in some embodiments carried out with patterned irradiation. The patterned irradiation may be a fixed pattern or may be a variable pattern created by a pattern generator (e.g., a DLP) as discussed above, depending upon the particular item being fabricated.

When the patterned irradiation is a variable pattern rather than a pattern that is held constant over time, then each irradiating step may be any suitable time or duration depending on factors such as the intensity of the irradiation, the presence or absence of dyes in the polymerizable material, the rate of growth, etc. Thus in some embodiments each irradiating step can be from 0.001, 0.01, 0.1, 1 or 10 microseconds, up to 1, 10, or 100 minutes, or more, in duration. The interval between each irradiating step is in some embodiments preferably as brief as possible, e.g., from 0.001, 0.01, 0.1, or 1 microseconds up to 0.1, 1, or 10 seconds. In example embodiments, the pattern may vary hundreds, thousands or millions of times to impart shape changes on the three-dimensional object being formed. In addition, in example embodiments, the pattern generator may have high resolution with millions of pixel elements that can be varied to change the shape that is imparted. For example, the pattern generator may be a DLP with more than 1,000 or 2,000 or 3,000 or more rows and/or more than 1,000 or 2,000 or 3,000 or more columns of micromirrors, or pixels in a liquid crystal display panel, that can be used to vary the shape. In example embodiments, the three-dimensional object may be formed through the gradient of polymerization allowing the shape changes to be imparted while continuously printing. In example embodiments, this allows complex three-dimensional objects to be formed at high speed with a substantially continuous surface without cleavage lines or seams. In some examples, thousands or millions of shape variations may be imparted on the three-dimensional object being formed without cleavage lines or seams across a length of the object being formed of more than 1 mm, 1 cm, 10 cm or more or across the entire length of the formed object. In example embodiments, the object may be continuously formed through the gradient of polymerization at a rate of more than 1, 10, 100, 1000, 10000 or more microns per second.

In some embodiments the build surface is flat; in others the build surface is irregular such as convexly or concavely curved, or has walls or trenches formed therein. In either case the build surface may be smooth or textured.

Curved and/or irregular build plates or build surfaces can be used in fiber or rod formation, to provide different materials to a single object being fabricated, that is, different polymerizable liquids to the same build surface through channels or trenches formed in the build surface, each associated with a separate liquid supply, etc.

Carrier Feed Channels for Polymerizable Liquid.

While polymerizable liquid may be provided directly to the build plate from a liquid conduit and reservoir system, in some embodiments the carrier includes one or more feed channels therein. The carrier feed channels are in fluid communication with the polymerizable liquid supply, for example a reservoir and associated pump. Different carrier feed channels may be in fluid communication with the same supply and operate simultaneously with one another, or different carrier feed channels may be separately controllable from one another (for example, through the provision of a pump and/or valve for each). Separately controllable feed channels may be in fluid communication with a reservoir containing the same polymerizable liquid, or may be in fluid communication with a reservoir containing different polymerizable liquids. Through the use of valve assemblies, different polymerizable liquids may in some embodiments be alternately fed through the same feed channel, if desired.

V. Reciprocal Feed of Polymerizable Liquid.

In an embodiment of the present invention, the carrier is vertically reciprocated with respect to the build surface to enhance or speed the refilling of the build region with the polymerizable liquid.

In some embodiments, the vertically reciprocating step, which comprises an upstroke and a downstroke, is carried out with the distance of travel of the upstroke being greater than the distance of travel of the downstroke, to thereby concurrently carry out the advancing step (that is, driving the carrier away from the build plate in the Z dimension) in part or in whole.

In some embodiments, the speed of the upstroke gradually accelerates (that is, there is provided a gradual start and/or gradual acceleration of the upstroke, over a period of at least 20, 30, 40, or 50 percent of the total time of the upstroke) until the conclusion of the upstroke, or the change of direction which represents the beginning of the downstroke. Stated differently, the upstroke begins, or starts, gently or gradually.

In some embodiments, the speed of the downstroke gradually decelerates (that is, there is provided a gradual termination and/or gradual deceleration of the downstroke) over a period of at least 20, 30, 40, or 50 percent of the total time of the downstroke. Stated differently, the downstroke concludes, or ends, gently or gradually.

While in some embodiments there is an abrupt end, or abrupt deceleration, of the upstroke, and an abrupt beginning or deceleration of the downstroke (e.g., a rapid change in vector or direction of travel from upstroke to downstroke), it will be appreciated that gradual transitions may be introduced here as well (e.g., through introduction of a "plateau" or pause in travel between the upstroke and downstroke). It will also be appreciated that, while the reciprocating step may be a single upstroke and downstroke, the reciprocations may occur in linked groups thereof, of the same or different amplitude and frequency.

In some embodiments, the vertically reciprocating step is carried out over a total time of from 0.01 or 0.1 seconds up to 1 or 10 seconds (e.g., per cycle of an upstroke and a downstroke).

In some embodiments, the upstroke distance of travel is from 0.02 or 0.2 millimeters (or 20 or 200 microns) to 1 or 10 millimeters (or 1000 to 10,000 microns). The distance of travel of the downstroke may be the same as, or less than, the distance of travel of the upstroke, where a lesser distance of travel for the downstroke serves to achieve the advancing of the carrier away from the build surface as the three-dimensional object is gradually formed.

Preferably the vertically reciprocating step, and particularly the upstroke thereof, does not cause the formation of gas bubbles or a gas pocket in the build region, but instead the build region remains filled with the polymerizable liquid throughout the reciprocation steps, and the gradient of polymerization zone or region remains in contact with the "dead zone" and with the growing object being fabricated throughout the reciprocation steps. As will be appreciated, a purpose of the reciprocation is to speed or enhance the refilling of the build region, particularly where larger build regions are to be refilled with polymerizable liquid, as compared to the speed at which the build region could be refilled without the reciprocation step.

In some embodiments, the advancing step is carried out intermittently at a rate of 1, 2, 5 or 10 individual advances per minute up to 300, 600, or 1000 individual advances per minute, each followed by a pause during which an irradiating step is carried out. It will be appreciated that one or more reciprocation steps (e.g., upstroke plus downstroke) may be carried out within each advancing step. Stated differently, the reciprocating steps may be nested within the advancing steps.

In some embodiments, the individual advances are carried out over an average distance of travel for each advance of from 10 or 50 microns to 100 or 200 microns (optionally including the total distance of travel for each vertically reciprocating step, e.g., the sum of the upstroke distance minus the downstroke distance).

Apparatus for carrying out the invention in which the reciprocation steps described herein are implemented substantially as described above, with the drive associated with the carrier, and/or with an additional drive operatively associated with the transparent member, and with the controller operatively associated with either or both thereof and configured to reciprocate the carrier and transparent member with respect to one another as described above.

VI. Increased Speed of Fabrication by Increased Light Intensity.

In general, it has been observed that speed of fabrication can increase with increased light intensity. In some embodiments, the light is concentrated or "focused" at the build region to increase the speed of fabrication. This may be accomplished using an optical device such as an objective lens.

The speed of fabrication may be generally proportional to the light intensity. For example, the build speed in millimeters per hour may be calculated by multiplying the light intensity in milliWatts per square centimeter and a multiplier. The multiplier may depend on a variety of factors, including those discussed below. A range of multipliers, from low to high, may be employed. On the low end of the range, the multiplier may be about 10, 15, 20 or 30. On the high end of the mutipler range, the multiplier may be about 150, 300, 400 or more.

The relationships described above are, in general, contemplated for light intensities of from 1, 5 or 10 milliWatts per square centimeter, up to 20 or 50 milliWatts per square centimeter.

Certain optical characteristics of the light may be selected to facilitate increased speed of fabrication. By way of example, a band pass filter may be used with a mercury bulb light source to provide 365±10 nm light measured at Full Width Half Maximum (FWHM). By way of further example, a band pass filter may be used with an LED light source to provide 375±15 nm light measured at FWHM.

As noted above, polymerizable liquids used in such processes are, in general, free radical polymerizable liquids with oxygen as the inhibitor, or acid-catalyzed or cationically polymerizable liquids with a base as the inhibitor. Some specific polymerizable liquids will of course cure more rapidly or efficiently than others and hence be more amenable to higher speeds, though this may be offset at least in part by further increasing light intensity.

At higher light intensities and speeds, the "dead zone" may become thinner as inhibitor is consumed. If the dead zone is lost then the process will be disrupted. In such case, the supply of inhibitor may be enhanced by any suitable means, including providing an enriched and/or pressurized atmosphere of inhibitor, a more porous semipermeable member, a stronger or more powerful inhibitor (particularly where a base is employed), etc.

In general, lower viscosity polymerizable liquids are more amenable to higher speeds, particularly for fabrication of articles with a large and/or dense cross section (although this can be offset at least in part by increasing light intensity). Polymerizable liquids with viscosities in the range of 50 or 100 centipoise, up to 600, 800 or 1000 centipoise or more (as measured at room temperature and atmospheric pressure with a suitable device such as a HYDRAMOTION REACTAVISC™ Viscometer (available from Hydramotion Ltd, 1 York Road Business Park, Malton, York YO17 6YA England). In some embodiments, where necessary, the viscosity of the polymerizable liquid can advantageously be reduced by heating the polymerizable liquid, as described above.

In some embodiments, such as fabrication of articles with a large and/or dense cross-section, speed of fabrication can be enhanced by introducing reciprocation to "pump" the polymerizable liquid, as described above, and/or the use of feeding the polymerizable liquid through the carrier, as also described above, and/or heating and/or pressurizing the polymerizable liquid, as also described above.

VII. Tiling.

It may be desirable to use more than one light engine to preserve resolution and light intensity for larger build sizes. Each light engine may be configured to project an image (e.g., an array of pixels) into the build region such that a plurality of "tiled" images are projected into the build region. As used herein, the term "light engine" can mean an assembly including a light source, a DLP device such as a digital micromirror or LCD device and an optical device such as an objective lens. The "light engine" may also include electronics such as a controller that is operatively associated with one or more of the other components.

Figure 18A:
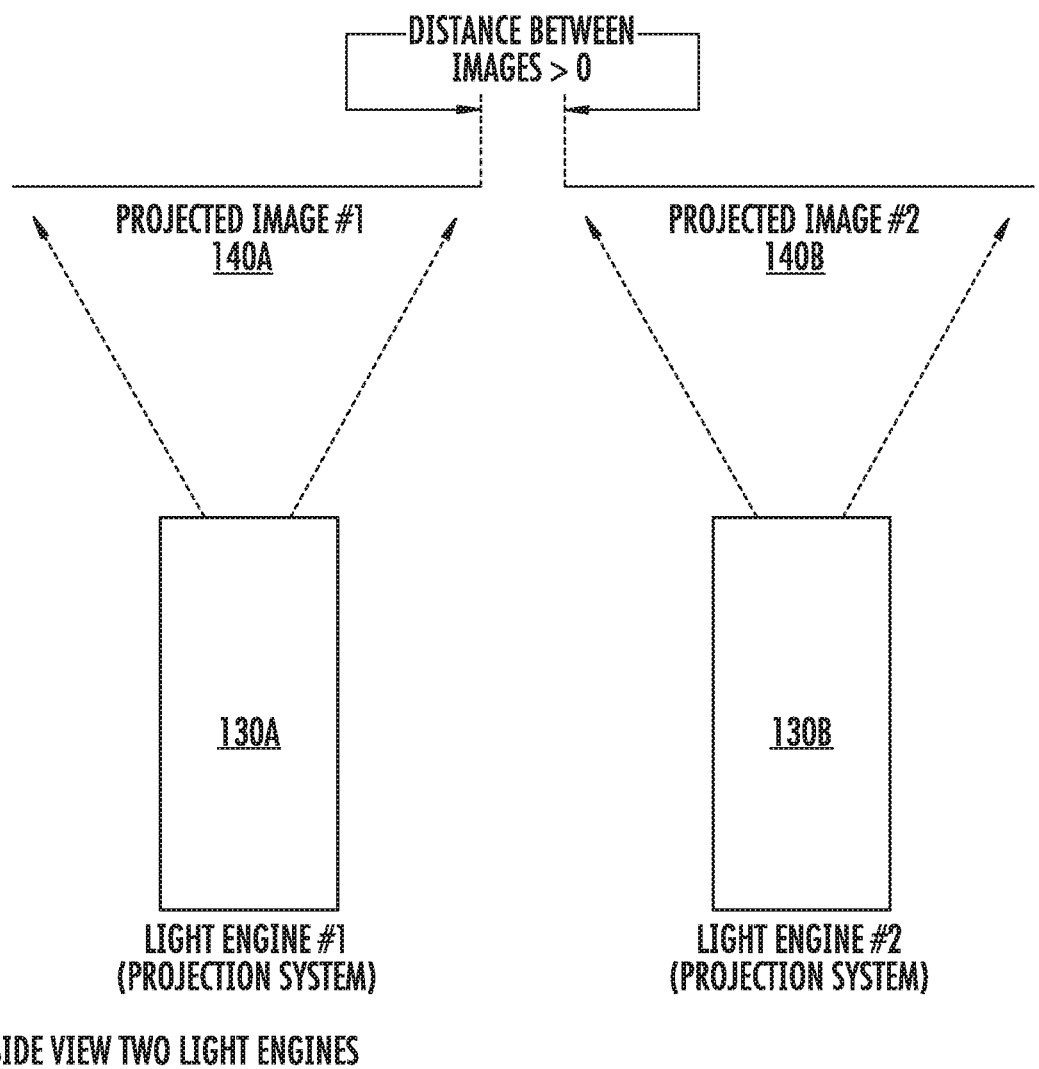
FIG. 18A is a schematic diagram illustrating tiled images.
Figure 18B:
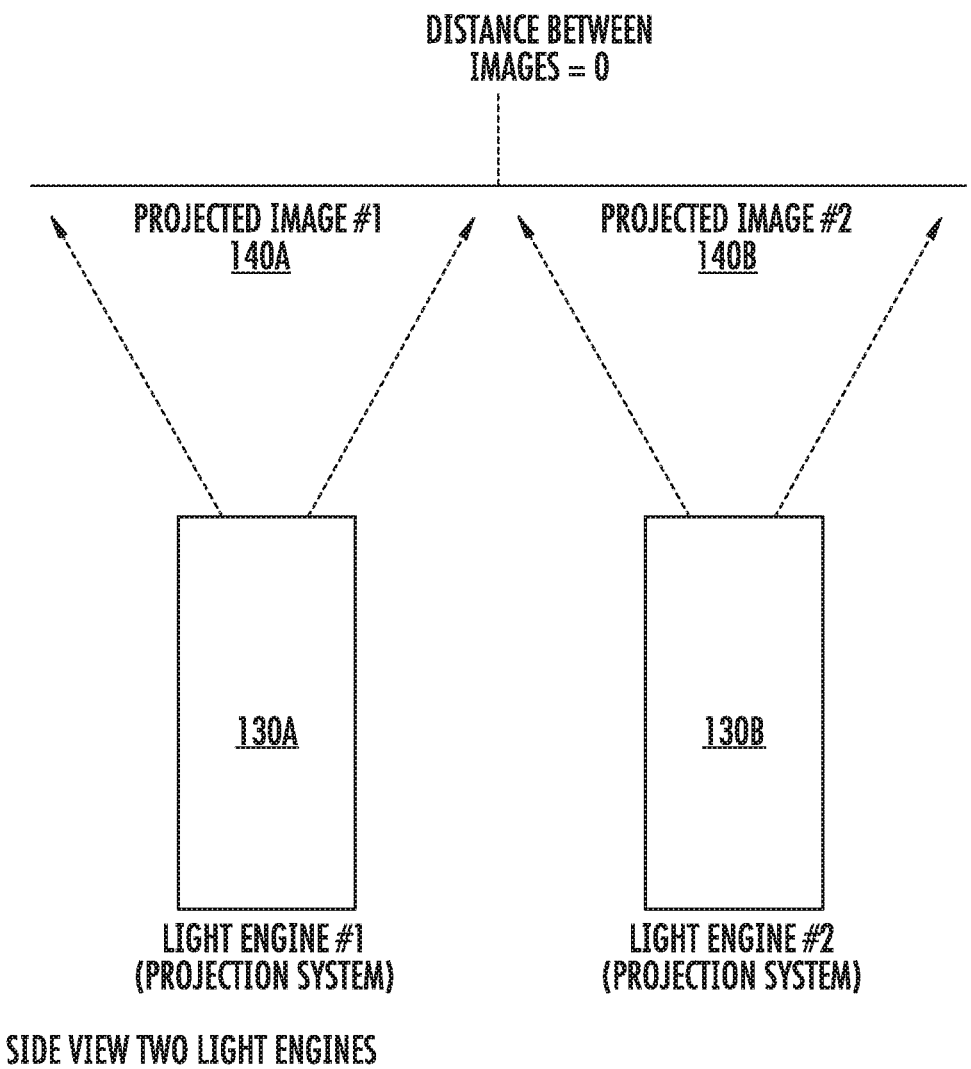
FIG. 18B is a second schematic diagram illustrating tiled images.
Figure 18C:
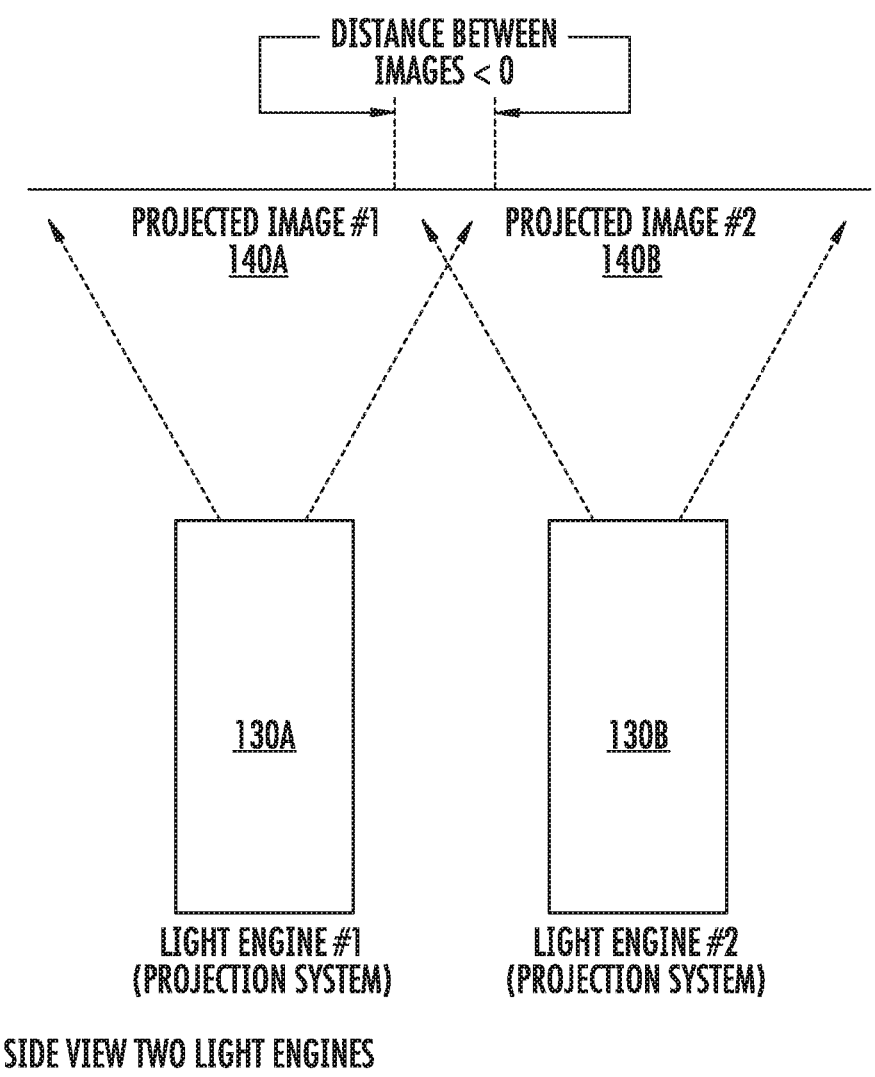
FIG. 18C is a third schematic diagram illustrating tiled images.

This is shown schematically in FIG. 18A-FIG. 18C. The light engine assemblies 130A, 130B produce adjacent or "tiled" images 140A, 140B. In FIG. 18A, the images are slightly misaligned; that is, there is a gap between them. In FIG. 18B, the images are aligned; there is no gap and no overlap between them. In FIG. 18C, there is a slight overlap of the images 140A and 140B.

In some embodiments, the configuration with the overlapped images shown in FIG. 18C is employed with some form of "blending" or "smoothing" of the overlapped regions as generally discussed in, for example, U.S. Pat. Nos. 7,292,207, 8,102,332, 8,427,391, 8,446,431 and U.S. Patent Application Publication Nos. 2013/0269882, 2013/0278840 and 2013/0321475, the disclosures of which are incorporated herein in their entireties.

The tiled images can allow for larger build areas without sacrificing light intensity, and therefore can facilitate faster build speeds for larger objects. It will be understood that more than two light engine assemblies (and corresponding tiled images) may be employed. Various embodiments of the invention employ at least 4, 8, 16, 32, 64, 128 or more tiled images.

VIII. Dual Hardening Polymerizable Liquids: Part B.

As noted above, in some embodiments of the invention, the polymerizable liquid comprises a first light polymerizable component (sometimes referred to as "Part A" herein)

and a second component that solidifies by another mechanism, or in a different manner from, the first component (sometimes referred to as "Part B" herein), typically by further reacting, polymerizing, or chain extending. Numerous embodiments thereof may be carried out. In the following, note that, where particular acrylates such as methacrylates are described, other acrylates may also be used.

Part A Chemistry.

As noted above, in some embodiments of the present invention, a resin will have a first component, termed "Part A." Part A comprises or consists of a mixture of monomers and/or prepolymers that can be polymerized by exposure to actinic radiation or light. This resin can have a functionality of 2 or higher (though a resin with a functionality of 1 can also be used when the polymer does not dissolve in its monomer). A purpose of Part A is to "lock" the shape of the object being formed or create a scaffold for the one or more additional components (e.g., Part B). Importantly, Part A is present at or above the minimum quantity needed to maintain the shape of the object being formed after the initial solidification. In some embodiments, this amount corresponds to less than ten, twenty, or thirty percent by weight of the total resin (polymerizable liquid) composition.

In some embodiments, Part A can react to form a cross-linked polymer network or a solid homopolymer.

Examples of suitable reactive end groups suitable for Part A constituents, monomers, or prepolymers include, but are not limited to: acrylates, methacrylates, α-olefins, N-vinyls, acrylamides, methacrylamides, styrenics, epoxides, thiols, 1,3-dienes, vinyl halides, acrylonitriles, vinyl esters, maleimides, and vinyl ethers.

An aspect of the solidification of Part A is that it provides a scaffold in which a second reactive resin component, termed "Part B," can solidify during a second step (which may occur concurrently with or following the solidification of Part A). This secondary reaction preferably occurs without significantly distorting the original shape defined during the solidification of Part A. Alternative approaches would lead to a distortion in the original shape in a desired manner.

In particular embodiments, when used in the methods and apparatus described herein, the solidification of Part A is continuously inhibited during printing within a certain region, by oxygen or amines or other reactive species, to form a liquid interface between the solidified part and an inhibitor-permeable film or window (e.g., is carried out by continuous liquid interphase/interface printing/polymerization).

Part B Chemistry.

Part B may comprise, consist of or consist essentially of a mix of monomers and/or prepolymers that possess reactive end groups that participate in a second solidification reaction after the Part A solidification reaction. In some embodiments, Part B could be added simultaneously to Part A so it is present during the exposure to actinide radiation, or Part B could be infused into the object made during the 3D printing process in a subsequent step. Examples of methods used to solidify Part B include, but are not limited to, contacting the object or scaffold to heat, water or water vapor, light at a different wavelength than that at which Part A is cured, catalysts, (with or without additional heat), evaporation of a solvent from the polymerizable liquid (e.g., using heat, vacuum, or a combination thereof), microwave irradiation, etc., including combinations thereof.

Examples of suitable reactive end group pairs suitable for Part B constituents, monomers or prepolymers include, but are not limited to: epoxy/amine, epoxy/hydroxyl, oxetane/amine, oxetane/alcohol, isocyanate*/hydroxyl, isocyanate*/amine, isocyanate/carboxylic acid, anhydride/amine, amine/carboxylic acid, amine/ester, hydroxyl/carboxylic acid, hydroxyl/acid chloride, amine/acid chloride, vinyl/Si—H (hydrosilylation), Si—Cl/hydroxyl, Si—Cl/amine, hydroxyl/aldehyde, amine/aldehyde, hydroxymethyl or alkoxymethyl amide/alcohol, aminoplast, alkyne/Azide (also known as one embodiment of "Click Chemistry," along with additional reactions including thiolene, Michael additions, Diels-Alder reactions, nucleophilic substitution reactions, etc.), alkene/sulfur (polybutadiene vulcanization), alkene/peroxide, alkene/thiol, alkyne/thiol, hydroxyl/halide, isocyanate*/water (polyurethane foams), Si—OH/hydroxyl, Si—OH/water, Si—OH/Si—H (tin catalyzed silicone), Si—OH/Si—OH (tin catalyzed silicone), perfluorovinyl (coupling to form perfluorocyclobutane), etc., where *isocyanates include protected isocyanates (e.g., oximes)), diene/dienophiles for Diels-Alder reactions, olefin metathesis polymerization, olefin polymerization using Ziegler-Natta catalysis, ring-opening polymerization (including ring-opening olefin metathesis polymerization, lactams, lactones, siloxanes, epoxides, cyclic ethers, imines, cyclic acetals, etc.), etc.

Other reactive chemistries suitable for Part B will be recognizable by those skilled in the art. Part B components useful for the formation of polymers described in "Concise Polymeric Materials Encyclopedia" and the "Encyclopedia of Polymer Science and Technology" are hereby incorporated by reference.

Organic Peroxides.

In some embodiments, an organic peroxide may be included in the polymerizable liquid or resin, for example to facilitate the reaction of potentially unreacted double bonds during heat and/or microwave irradiation curing. Such organic peroxides may be included in the resin or polymerizable liquid in any suitable amount, such as from 0.001 or 0.01 or 0.1 percent by weight, up to 1, 2, or 3 percent by weight. Examples of suitable organic peroxides include, but are not limited to, 2,5-bis(tert-butylperoxy)-2,5-dimethylhexane (e.g., LUPEROX 101™), dilauroyl peroxide (e.g., LUPEROX LP™), benzoyl peroxide (e.g., LUPEROX A98™), and bis(tert-butyldioxyisopropyl)benzene (e.g., VulCUP R™), etc., including combinations thereof. Such organic peroxides are available from a variety of sources, including but not limited to Arkema (420 rue d'Estienne d'Orves, 92705 Colombes Cedex, France).

Elastomers.

A particularly useful embodiment for implementing the invention is for the formation of elastomers. Tough, high-elongation elastomers are difficult to achieve using only liquid UV-curable precursors. However, there exist many thermally cured materials (polyurethanes, silicones, natural rubber) that result in tough, high-elongation elastomers after curing. These thermally curable elastomers on their own are generally incompatible with most 3D printing techniques.

In embodiments of the current invention, small amounts (e.g., less than 20 percent by weight) of a low-viscosity UV curable material (Part A) are blended with thermally-curable precursors to form (preferably tough) elastomers (e.g., polyurethanes, polyureas, or copolymers thereof (e.g., poly(urethane-urea)), and silicones) (Part B). The UV curable component is used to solidify an object into the desired shape using 3D printing as described herein and a scaffold for the elastomer precursors in the polymerizable liquid. The object can then be heated after printing, thereby activating the second component, resulting in an object comprising the elastomer.

Adhesion of Formed Objects.

In some embodiments, it may be useful to define the shapes of multiple objects using the solidification of Part A, align those objects in a particular configuration, such that there is a hermetic seal between the objects, then activate the secondary solidification of Part B. In this manner, strong adhesion between parts can be achieved during production. A particularly useful example may be in the formation and adhesion of sneaker components.

Fusion of Particles as Part B.

In some embodiments, "Part B" may simply consist of small particles of a pre-formed polymer. After the solidification of Part A, the object may be heated above the glass transition temperature of Part B in order to fuse the entrapped polymeric particles.

Evaporation of Solvent as Part B.

In some embodiments, "Part B" may consist of a pre-formed polymer dissolved in a solvent. After the solidification of Part A into the desired object, the object is subjected to a process (e.g., heat+vacuum) that allows for evaporation of the solvent for Part B, thereby solidifying Part B.

Thermally Cleavable End Groups.

In some embodiments, the reactive chemistries in Part A can be thermally cleaved to generate a new reactive species after the solidification of Part A. The newly-formed reactive species can further react with Part B in a secondary solidification. An exemplary system is described by Velankar, Pezos and Cooper, *Journal of Applied Polymer Science*, 62, 1361-1376 (1996). Here, after UV-curing, the acrylate/methacrylate groups in the formed object are thermally cleaved to generated diisocyanate or branched isocyanate prepolymers that further react with blended chain-extender to give high molecular weight polyurethanes/polyureas within the original cured material or scaffold. Such systems are, in general, dual-hardening systems that employ blocked or reactive blocked prepolymers, as discussed in greater detail below. It may be noted that later work indicates that the thermal cleavage above is actually a displacement reaction of the chain extender (usually a diamine) with the hindered urea, giving the final polyurethanes/polyureas without generating isocyanate intermediates.

Methods of Mixing Components.

In some embodiments, the components may be mixed (as a single batch, and/or in a continuous manner) prior to being introduced to the printer build plate or build region. This may be done using any suitable manner, such as with mixers, including static mixers, e.g., multi-barrel syringes and mixing nozzles. FIG. 1 provides a schematic illustration thereof. The method may be carried out by: mixing a first precursor liquid and a second precursor liquid to produce the polymerizable liquid comprising a mixture of (i) a light polymerizable liquid first component, and wherein: (i') at least one reactant of said second solidifiable component is contained in said first precursor liquid, and (ii') at least one reactant or catalyst of said second solidifiable component is contained in said second precursor liquid; then (typically within one day, and preferably within one or two hours, of said mixing step), proceeding to fill the build region with the polymerizable liquid. As illustrated, filling may be carried out directly from the output of the mixer, such as the static mixer.

For example, Part A may comprise or consist of a UV-curable di(meth)acrylate resin, Part B may comprise or consist of a diisocyanate or branched isocyanate prepolymer and a polyol mixture. The polyol can be blended together in one barrel with Part A and remain unreacted. A second syringe barrel would contain the diisocyanate of Part B. In this manner, the material can be stored without worry of Part B solidifying prematurely. Additionally, when the resin is introduced to the printer in this fashion, a constant time may be defined between mixing of all components and solidification of Part A.

It will be appreciated that precursor liquids or resins, like the dual cure resins formed by mixing thereof, will generally be viscous liquids, and in some cases may advantageously be pseudoplastic as discussed below.

Pseudoplastic Precursor Liquids.

In some embodiments, particularly where one or both precursor resin carries solid particles therein, that precursor resin(s) are pseudoplastic compositions. Pseudoplastic resin compositions, and various ways to impart pseudoplastic properties to resin compositions, are known. See, e.g., U.S. Pat. No. 9,216,543; see also U.S. Pat. Nos. 6,180,244; 6,172,134; 8,604,132; and 7,482,399 (the disclosures of all of which are incorporated by reference herein in their entirety.

Pseudoplastic (or "shear thinning") composition as used herein refers to a composition, and in particular a precursor resin, that becomes more fluid when a force is applied, in particular a mechanical force such as shear or pressure as encountered during mixing (e.g., agitating, stirring, pumping, shaking, etc.). In the present invention, pseudoplasticity of a precursor resin that contains particulates can aid in stabilizing that precursor resin during storage (e.g., the higher viscosity during storage serves to inhibit settling of the solid particulates) yet does not unduly interfere with mixing of that resin with another precursor resin when dispensed for use.

In some embodiments, the pseudoplastic resin(s) can have a shear-thinning value of at least 5, 6, or 10, up to 40, 60, 80, or 100 or more. Shear thinning value can be determined in accordance with known techniques (see, e.g., U.S. Pat. Nos. 9,382,370; 8,604,132; and 8,173,750, the disclosures of which are incorporated herein by reference in their entirety).

In some embodiments, the resin may be inherently pseudoplastic (that is, pseudoplasticity imparted by constituents included in the precursor resin for other purposes); in other embodiments, pseudoplasticity may be imparted to that precursor resin by inclusion of one or more rheology modifiers therein, in any suitable amount (e.g., 0.1 or 1 percent by weight, up to 2, 5 or 10 percent by weight). Rheology modifiers that may be used include, but are not limited to, organic and inorganic rheology modifiers and associative as well as non-associative modifiers. Organic rheology modifiers comprise products based on natural materials, like cellulose, cellulose derivatives, alginates, or polysaccharides and their derivatives, like xanthan, or synthetic polymeric materials like polyacrylates, polyurethanes or polyamides. Inorganic rheology modifiers comprise clays, like bentonite clays, attapulgite clays, organoclays, kaolin, and treated or untreated synthetic silicas, like fumed silicas.

Particular examples of rheology modifiers include, but are not limited to, alkali soluble or swellable emulsions such as AcrySol™ ASE-60, ASE-75 and ASB-95NP, Acusol™ 810A (Rohm and Haas Co.), and Alcogum™ L-15, L-31 and L-37 (Alco Chemical), alkali soluble associative emulsions such as Alcogum™ SL-70 and 78 (Alco Chemical) or Acrysol™ TT-935 or RM-5 (Rohm and Haas Co.), and alkali swellable associative urethanes such as Polyphobe™ P-104, and P-106 (Union Carbide), and in addition, hydrophobically-modified urethane dispersions such as Nopco DSX 1514, 1550, 2000 EXP and 3000 EXP (Henkel Corporation) and Acrysol™ RM-825 (Rohm and Haas Co.).

Additional examples of rheology modifiers include, but are not limited to, fumed silica coated with trimethylsilane. The trimethylsilane coated silica may be prepared, for example, by treating fumed silica with a methylchlorosilane, such as dimethyl dichlorosilane or timethyl chlorosilane, or more preferably with hexamethyldisilazine, such as Aerosil™ R812 (Degussa Limited). Still another non-limiting example of a rheology modifier is fumed silica treated with silicone oil, such as AEROSIL™ R202 (Degussa Limited).

Additional examples of rheology modifiers include, but are not limited to, wax-based rheology modifiers, such as polyethylene glycol wax with a melting point of about 60.degree. C. or low melting point (e.g., less than 100.degree. C.) stearic acid esters. Suitable commercial preparations are those sold under the trade marks THIXOMEN™ and THIXOTROL ST™.

Example Precursor Resins for Making an Epoxy Dual Cure Resin.

A non-limiting example of a pair of precursor resins, this one for producing an epoxy dual cure resin, is a combination of:

(a) a first, pseudoplastic, precursor resin composition, comprising or consisting essentially of (it is desirable to package the epoxy resin and dual reactive compound separately from the hardener to avoid premature reaction and extend shelf life):
  (i) an organic hardener co-polymerizable with an epoxy resin, said organic hardener in solid particulate form and dispersed in said resin composition;
  (ii) optionally, a photoinitiator;
  (iii) optionally, monomers and/or prepolymers that are polymerizable by exposure to actinic radiation or light;
  (iv) optionally, a light absorbing pigment or dye
  (v) optionally a diluent;
  (vi) optionally a particulate filler;
  (vii) optionally, a co-monomer and/or a co-prepolymer (with said epoxy resin); and (b) a second, optionally pseudoplastic, precursor resin composition, packaged separately from (i.e., not mixed with) said first precursor resin, said second precursor resin comprising, or consisting essentially of (it is desirable to exclude the hardener from the second precursor resin to avoid premature reaction and extend shelf life):
  (i) an epoxy resin co-polymerizable with said organic hardener;
  (ii) a dual reactive compound having substituted thereon a first reactive group reactive with said monomers and/or prepolymers that are polymerizable by exposure to actinic radiation or light, and a second reactive group reactive with said epoxy resin (e.g., an epoxy acrylate);
  (iii) optionally, a photoinitiator;
  (iv) optionally, monomers and/or prepolymers that are polymerizable by exposure to actinic radiation or light;
  (v) optionally, a light absorbing pigment or dye
  (vi) optionally a diluent;
  (vii) optionally a particulate filler;
  (viii) optionally, a co-monomer and/or a co-prepolymer (with said epoxy resin);
subject to the proviso that said photoinitiator, and said monomers and/or prepolymers that are polymerizable by exposure to actinic radiation or light, are each included in at least one of each said first and second precursor resin compositions.

The two may be packaged separately from one another by any suitable means, such as in two separate cans, bottles, or other container, in a common outer container; in separate chambers of a dual or multi chamber cartridge or dispenser; etc.

The transitional phrase "consisting essentially of" means that the scope of a claim is to be interpreted to encompass the specified materials or steps recited in the claim, and also additional materials or steps that do not materially affect the basic and novel characteristics of the claimed invention as described herein. For example, in some embodiments of the compositions, the second precursor composition comprising (i) an epoxy resin co-polymerizable with the organic hardener; and (ii) a dual reactive compound having substituted thereon a first reactive group reactive with said monomers and/or prepolymers that are polymerizable by exposure to actinic radiation or light, and a second reactive group reactive with said epoxy resin (e.g., an epoxy acrylate), is subject to the proviso that the second precursor composition does not include (or does not appreciably include) an organic hardener.

In some embodiments, the epoxy resin comprises a bisphenol A epoxy resin, a bisphenol F epoxy resin, a novolac epoxy resin, an aliphatic epoxy resin, a glycidylamine epoxy resin, or a combination thereof. In some embodiments, the epoxy resin comprises an epoxy compound having at least two epoxy groups; in other embodiments epoxy resin can comprise an epoxy compound having a single epoxy group, for example as a reactive diluent. Numerous examples of suitable epoxy resins (and organic hardeners) are known. See, e.g., U.S. Pat. Nos. 3,945,972; 3,947,395; 4,833,226; 5,319,004; 6,355,763; 6,881,813; 8,383,025; 9,133,301; etc.

In some embodiments, the epoxy resin comprises an epoxidized vegetable oil. In general, epoxidized vegetable oils can be obtained by the epoxidation of triglycerides of unsaturated fatty acids. They are made by epoxidizing the reactive olefin groups of the naturally occurring triglyceride oils. The olefin groups can be epoxidized with peracids, such as perbenzoic, peracetic and the like, and with hydrogen peroxide. Suitable epoxidized vegetable oils are epoxidized linseed oil, epoxidized soybean oil, epoxidized corn oil, epoxidized cottonseed oil, epoxidized perilla oil, epoxidized safflower oil, etc. See, e.g., U.S. Pat. Nos. 3,051,671; 5,973,082; 8,481,622; and 9,169,386; see also M. Stemmelen et al., A fully biobased epoxy resin from vegetable oils: From the synthesis of the precursors by thiol-ene reaction to the study of the final material, *J. Polym Sci. Part A: Polym Chem.* 49, 2434-2444 (2011).

In some embodiments, the epoxy resin comprises a catalyzed epoxy resin (which may not require a hardener). In such case, the resin may further include an epoxy homopolymerization catalyst, such as a tertiary amine or imidizole (anionic polymerization) or boron trifluoride (cationic polymerizations).

Any suitable hardener may be used (see references cited in connection with epoxy resins above). In some embodiments, the hardener comprises an amine or polyamine (e.g., an aromatic amine or polyamine, a cycloaliphatic amine or polyamine, an aliphatic amine or polyamine such as a polyether amine, etc.).

In some embodiments, the hardener comprises an acid or polyacid (i.e., polycarboxylic acids), a phenol or polyphenol, an alcohol or polyol, or a thiol or polythiol.

In some embodiments, the hardener comprises an anhydride, such as a linear or cyclic anhydride, including compounds having more than one anhydride group (for example, at least one of polysebacic or polyazelaic anhydride; methyltetrahydrophthalic anhydride, tetrahydro phthalic anhydride, methyl nadic anhydride, hexahydro phthalicanhydride, and methylhexahydro phthalic anhydride; succinic anhydride, substituted succinic anhydride, citric acid anhydride, maleic anhydride, adducts of maleic anhydride, dodecyl succinic anhydride, maleic anhydride vinyl and styrene copolymers of maleic anhydride, multi-ring alicyclic anhydrides, phthalic anhydride, and/or trimellitic anhydride (See, e.g., U.S. Pat. No. 9,080,007)).

Latent Hardeners.

In some embodiments, the hardener comprises a latent hardener (including mixtures thereof); that is, a hardener having a low reactivity at lower temperatures, and/or which is sparingly soluble at lower temperatures, such that the hardener can be more stable at room temperature, but then activated upon heating. Numerous examples of latent hardeners are known. See, e.g., U.S. Pat. No. 8,779,036; see also U.S. Pat. No. 4,859,761. Particular examples include substituted guanidines and aromatic amines, such as dicyandiamide, benzoguanamine, o-tolylbiguanidine, bis(4-aminophenyl) sulfone (also known as diamino diphenylsulfone: DDS), bis(3-aminophenyl) sulfone, 4,4'-methylenediamine, 1,2- or 1,3- or 1,4-benzenediamines, bis(4-aminophenyl)-1,4-diisopropylbenzene (e.g., EPON 1061 from Shell), bis(4-amino-3,5-dimethylphenyl)-1,4-diisopropylbenzene (e.g., EPON 1062 from Shell), bis(aminophenyl) ether, diaminobenzophenones, 2,6-diaminopyridine, 2,4-toluenediamine, diaminodiphenylpropanes, 1,5-diaminonaphthalene, xylenediamines, 1,1-bis-4-aminophenylcyclohexane, methylenebis (2,6-diethylaniline) (e.g., LONZACURE M-DEA from Lonza), methylenebis(2-isopropyl-6-methylaniline) (e.g., LONZACURE M-MIPA from Lonza), methylenebis(2,6-diisopropylaniline) (e.g., LONZACURE M-DIPA from Lonza), 4-aminodiphenylamine, diethyltoluenediamine, phenyl-4,6-diaminotriazine, and lauryl-4,6-diaminotriazine. Still other examples include N-acylimidazoles such as 1-(2', 4',6'-trimethylbenzoyl)-2-phenylimidazole or 1-benzoyl-2-isopropylimidazole (see, e.g., U.S. Pat. Nos. 4,436,892 and 4,587,311); Cyanoacetyl compounds such as neopentyl glycol biscyanoacetate, N-isobutylcyanoacetamide, 1,6-hexamethylene biscyanoacetate or 1,4-cyclohexanedimethanol biscyanoacetate (see, e.g., U.S. Pat. No. 4,283,520); N-cyanoacylamide compounds such as N,N'-dicyanoadipic diamide (see, e.g., U.S. Pat. Nos. 4,529,821, 4,550,203, and 4,618,712); acylthiopropylphenols (see, e.g., U.S. Pat. No. 4,694,096) and the urea derivatives such as toluene-2,4-bis (N,N-dimethylcarbamide) (see, e.g., U.S. Pat. No. 3,386, 955); and aliphatic or cycloaliphatic diamines and polyamines if they are sufficiently unreactive. An example which may be mentioned here is polyetheramines, e.g., JEFFAMINE 230 and 400. Aliphatic or cycloaliphatic diamines or polyamines whose reactivity has been reduced by steric and/or electronic influencing factors or/and are sparingly soluble or have a high melting point, e.g., JEFFLINK 754 (Huntsman) or CLEARLINK 1000 (Dorf Ketal) can also be used.

Epoxy Accelerator.

An accelerator (or mixture of accelerators) may optionally be included in the polymerizable liquid, examples of which include, but are not limited to, those set forth in U.S. Pat. Nos. 9,080,007; 8,779,036; 7,750,107; 6,773,754; 5,198, 146; 4,800,222; and 3,639,928.

Dual Reactive Compound.

As noted above, in some embodiments a dual reactive compound is included in the polymerizable liquid. In general, such a dual reactive compound comprises: (i) a first reactive group reactive with (i.e., preferentially reactive with) the monomers and/or prepolymers that are polymerizable by exposure to actinic radiation or light, and (ii) a second reactive group reactive with (i.e., preferentially reactive with) the epoxy resin. One or more of each reactive groups may be included.

Examples of suitable first reactive groups include, but are not limited to, acrylates, methacrylates, α-olefins, N-vinyls, acrylamides, methacrylamides, styrenics, thiols, 1,3-dienes, vinyl halides, acrylonitriles, vinyl esters, maleimides, and vinyl ethers.

Examples of suitable second reactive groups include, but are not limited to, epoxy, amine, isocyanate, alcohol, and anhydride groups.

Thus, particular examples of suitable dual reactive compounds include compounds of the general formula $(X)_nR(X')_m$, wherein: X is the first reactive group, X' is the second reactive group, n and m are each integers of from 1 or 2 to 10 or 20, and R is a hydrocarbyl or organic group (e.g., an aromatic, aliphatic, or mixed aromatic and aliphatic group, such as bis-phenol A). Particular examples include but are not limited to epoxy acrylates and epoxy methacrylates, such as compounds of Formula I:

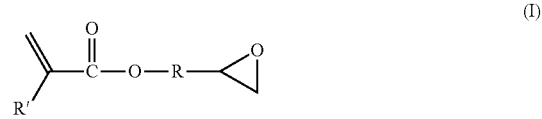

where R' is H or $CH_3$ and R is as given above. R may be as short as $-CH_2-$ (e.g., glicidyl methacrylate), or may be a long chain organic polymer, itself. See, e.g., U.S. Pat. No. 8,383,025 at column 4.

Other constituents such as the monomers and/or prepolymers polymerizable by exposure to actinic radiation or light, photoinitiators, pigments, dyes, fillers/tougheners, light absorbing pigments or dyes, diluents, and the like, can be as described above and below.

The ingredients may be included in each precursor in any suitable amount, for example such that the polymerizable liquid (i.e., the combination of both precursor resins when mixed together) comprises:

from 0.1 to 4 percent by weight of said photoinitiator;

from 10 to 90 percent by weight of said monomers and/or prepolymers that are polymerizable by exposure to actinic radiation or light;

from 0.1 to 2 percent by weight of said light absorbing pigment or dye when present;

from 2, 5 or 10 to 50 or 60 percent by weight of said epoxy resin;

from 1 or 2 to 30 or 40 percent by weight of said organic hardener when present;

from 1 or 2 to 30 or 40 percent by weight of said dual reactive compound when present;

from 1 to 40 percent by weight of said diluent when present; and from 1 to 50 percent by weight of said filler when present.

Other Additive Manufacturing Techniques.

It will be clear to those skilled in the art that the materials described in the current invention will be useful in other additive manufacturing techniques including fused deposition modeling (FDM), solid laser sintering (SLS), and ink-jet methods. For example, a melt-processed acrylonitrile-butadiene-styrene resin may be formulated with a second UV-curable component that can be activated after the object is formed by FDM. New mechanical properties could be achieved in this manner. In another alternative, melt-processed unvulcanized rubber is mixed with a vulcanizing agent such as sulfur or peroxide, and the shape set through FDM, then followed by a continuation of vulcanization.

IX. Dual Hardening Polymerizable Liquids Employing Blocked Constituents and Thermally Cleavable Blocking Groups.

In some embodiments, where the solidifying and/or curing step (d) is carried out subsequent to the irradiating step (e.g., by heating or microwave irradiating); the solidifying and/or curing step (d) is carried out under conditions in which the solid polymer scaffold degrades and forms a constituent necessary for the polymerization of the second component (e.g., a constituent such as (i) a prepolymer, (ii) a diisocyanate, branched isocyanate, or polyisocyanate, and/or (iii) a polyol and/or diol, where the second component comprises precursors to a polyurethane/polyurea resin). Such methods may involve the use of reactive or non-reactive blocking groups on or coupled to a constituent of the first component, such that the constituent participates in the first hardening or solidifying event, and when de-protected (yielding free constituent and free blocking groups or blocking agents) generates a free constituent that can participate in the second solidifying and/or curing event. Non-limiting examples of such methods are described further below.

A. Dual Hardening Polymerizable Liquids Employing Blocked Prepolymers and Thermally Cleavable Blocking Groups.

Some "dual cure" embodiments of the present invention are, in general, a method of forming a three-dimensional object, comprising:

(a) providing a carrier and an optically transparent member having a build surface, the carrier and the build surface defining a build region therebetween;

(b) filling the build region with a polymerizable liquid, the polymerizable liquid comprising a mixture of a blocked or reactive blocked prepolymer, optionally but in some embodiments preferably a reactive diluent, a chain extender, and a photoinitiator;

(c) irradiating the build region with light through the optically transparent member to form a (rigid, compressible, collapsible, flexible or elastic) solid blocked polymer scaffold from the blocked prepolymer and optionally the reactive diluent while concurrently advancing the carrier away from the build surface to form a three-dimensional intermediate having the same shape as, or a shape to be imparted to, the three-dimensional object, with the intermediate containing the chain extender; and then (d) heating or microwave irradiating the three-dimensional intermediate sufficiently to form the three-dimensional product from the three-dimensional intermediate (without wishing to be bound to any particular mechanism, the heating or microwave irradiating may cause the chain extender to react with the blocked or reactive blocked prepolymer or an unblocked product thereof).

In some embodiments, the blocked or reactive blocked prepolymer comprises a polyisocyanate.

In some embodiments, the blocked or reactive blocked prepolymer comprises a compound of the formula A-X-A or X(-A)$_n$, where n is at least 2.1, 2.3, 2.5, or 3 (on average), X is a hydrocarbyl group and each A is an independently selected substituent of Formula X:

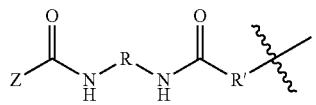

Formula (X)

where R is a hydrocarbyl group, R' is O or NH, and Z is a blocking group, the blocking group optionally having a reactive terminal group (e.g., a polymerizable end group such as an epoxy, alkene, alkyne, or thiol end group, for example an ethylenically unsaturated end group such as a vinyl ether). In a particular example, each A is an independently selected substituent of Formula (XI):

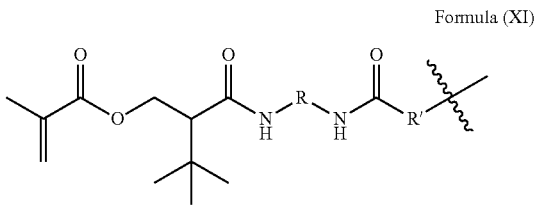

Formula (XI)

where R and R' are as given above.

In some embodiments, the blocked or reactive blocked prepolymer comprises a polyisocyanate oligomer produced by the reaction of at least one diisocyanate or branched isocyanate (e.g., a diisocyanate such as hexamethylene diisocyanate (HDI), bis-(4-isocyanatocyclohexyl)methane (HMDI), isophorone diisocyanate (IPDI), etc., a triisocyanate, etc.) with at least one polyol (e.g., a polyether or polyester or polybutadiene diol).

In some embodiments, the reactive blocked prepolymer is blocked by reaction of a polyisocyanate with an amine (meth)acrylate monomer blocking agent (e.g., tertiary-butylaminoethyl methacrylate (TBAEMA), tertiary pentylaminoethyl methacrylate (TPAEMA), tertiary hexylaminoethyl methacrylate (THAEMA), tertiary-butylaminopropyl methacrylate (TBAPMA), acrylate analogs thereof, and mixtures thereof (see, e.g., US Patent Application Publication No. 20130202392). Note that all of these can be used as diluents, as well.

There are many blocking agents for isocyanate. In preferred embodiments of the current invention, the blocking agent (e.g., TBAEMA) cures (e.g., from the actinic radiation or light) into the system. Those skilled in the art can couple (meth)acrylate groups to known blocking agents to create additional blocking agents that can be used to carry out the present invention. Still further, those skilled in the art can use maleimide, or substitute maleimide on other known blocking agents, for use in the present invention.

Examples of known blocking agents which can be substituted on or covalently coupled to (meth)acrylate or maleimide for use in the present invention include, but are not limited to, phenol type blocking agents (e.g., phenol, cresol, xylenol, nitrophenol, chlorophenol, ethyl phenol, t-butylphenol, hydroxy benzoic acid, hydroxy benzoic acid esters, 2,5-di-t-butyl-4-hydroxy toluene, etc.), lactam type blocking agents (e.g., ε-caprolactam, δ-valerolactam, γ-butyrolactam, β-propiolactam, etc.), active methylene type blocking agents (e.g., diethyl malonate, dimethyl malonate, ethyl acetoacetate, methyl acetoacetate, acetyl acetone, etc.), alcohol type blocking agents (e.g., methanol, ethanol, n-propanol, isopropanol, n-butanol, isobutanol, t-butanol, n-amyl alcohol, t-amyl alcohol, lauryl alcohol, ethylene glycol monomethyl ether, ethylene glycol monoethyl ether, ethylene glycol monobutyl ether, diethylene glycol monomethyl ether, diethylene glycol monoethyl ether, propylene glycol monomethyl ether, methoxyethanol, glycolic acid, glycolic acid esters, lactic acid, lactic acid ester, methylol urea, methylol melamine, diacetone alcohol, ethylene chlorohydrine, ethylene bromohydrine, 1,3-dichloro-2-propanol, co-hydroperfluoro alcohol, acetocyanhydrine, etc.), mercaptan type blocking agents (e.g., butyl mercaptan, hexyl mercaptan, t-butyl mercaptan, t-dodecyl mercaptan, 2-mercaptobenzothiazole, thiophenol, methyl thiophenol, ethyl thiophenyl, etc.), acid amide type blocking agents (e.g., acetoanilide, acetoanisidine amide, acrylamide, methacrylamide, acetic amide, stearic amide, benzamide, etc.), imide type blocking agents (e.g., succinimide, phthalimide, maleimide, etc.), amine type blocking agents (e.g., diphenylamine, phenylnaphthylamine, xylidine, N-phenyl xylidine, carbazole, aniline, naphthylamine, butylamine, dibutylamine, butyl phenylamine, etc.), imidazole type blocking agents (e.g., imidazole, 2-ethylimidazole, etc.), urea type blocking agents (e.g., urea, thiourea, ethylene urea, ethylene thiourea, 1,3-diphenyl urea, etc.), carbamate type blocking agents (e.g., N-phenyl carbamic acid phenyl ester, 2-oxazolidone, etc.), imine type blocking agents (e.g., ethylene imine, etc.), oxime type blocking agents (e.g., formaldoxime, acetaldoximine, acetoxime, methylethyl ketoxime, diacetylomonoxime, benzophenoxime, cyclohexanonoxime, etc.) and sulfurous acid salt type blocking agents (e.g., sodium bisulfite, potassium bisulfite, etc.). Of these, use is preferably made of the phenol type, the lactam type, the active methylene type and the oxime type blocking agents (see, e.g., U.S. Pat. No. 3,947,426).

In some embodiments, the diisocyanate or isocyanate-functional oligomer or prepolymer is blocked with an aldehyde blocking agent, such as a formyl blocking agent. Examples include but are not limited to 2-formyloxyethyl (meth)acrylate (FEMA) (or other aldehyde-containing acrylate or methacrylate) with a diisocyanate or isocyanate functional oligomer or polymer. See, e.g., X. Tassel et al., *A New Blocking Agent of isocyanates*, European Polymer Journal 36(9), 1745-1751 (2000); T. Haig, P. Badyrka et al., U.S. Pat. No. 8,524,816; and M. Sullivan and D. Bulpett, U.S. Pat. Appl. Pub. No. US20120080824. The reaction product of such an aldehyde blocking agent and an isocyanate can in some embodiments possess an advantage over TBAEMA blocked ABPUs by reducing hydrogen bonding due to urea formation, in turn (in some embodiments) resulting in lower viscosity blocked isocyanates. In addition, in some embodiments, a second advantage is eliminating free amines within the final product (a product of the deblocking of TBAEMA from the ABPU) which might oxidize and cause yellowness or lead to degradation.

In some embodiments, the reactive diluent comprises an acrylate, a methacrylate, a styrene, an acrylic acid, a vinylamide, a vinyl ether, a vinyl ester (including derivatives thereof), polymers containing any one or more of the foregoing, and combinations of two or more of the foregoing (e.g., acrylonitrile, styrene, divinyl benzene, vinyl toluene, methyl acrylate, ethyl acrylate, butyl acrylate, methyl (meth) acrylate, amine (meth)acrylates as described above, and mixtures of any two or more of these). See, e.g., US Patent Application Publication No. 20140072806.

In some embodiments, the chain extender comprises at least one diol, diamine or dithiol chain extender (e.g., ethylene glycol, 1,3-propanediol, 1,2-propanediol, 1,4-butanediol, 1,5-pentanediol, 1,6-hexanediol, 1,7-heptanediol, 1,8-octanediol, 1,9-nonanediol, 1,10-decanediol, 1,11-undecanediol, 1,12-dodecanediol, 1,2-cyclohexanedimethanol, 1,4-cyclohexanedimethanol, the corresponding diamine and dithiol analogs thereof, lysine ethyl ester, arginine ethyl ester, p-alanine-based diamine, and random or block copolymers made from at least one diisocyanate and at least one diol, diamine or dithiol chain extender; see, e.g., US Patent Application Publication No. 20140010858). Note also that, when dicarboxylic acid is used as the chain extender, polyesters (or carbamate-carboxylic acid anhydrides) are made.

In some embodiments, the polymerizable liquid comprises:

from 5 or 20 or 40 percent by weight to 60 or 80 or 90 percent by weight of the blocked or reactive blocked prepolymer;

from 10 or 20 percent by weight to 30 or 40 or 50 percent by weight of the reactive diluent;

from 5 or 10 percent by weight to 20 or 30 percent by weight of the chain extender; and from 0.1 or 0.2 percent by weight to 1, 2 or 4 percent by weight of the photoinitiator. Optional additional ingredients, such as dyes, fillers (e.g., silica), surfactants, etc., may also be included, as discussed in greater detail above.

An advantage of some embodiments of the invention is that, because these polymerizable liquids do not rapidly polymerize upon mixing, they may be formulated in advance, and the filling step carried out by feeding or supplying the polymerizable liquid to the build region from a single source (e.g., a single reservoir containing the polymerizable liquid in pre-mixed form), thus obviating the need to modify the apparatus to provide separate reservoirs and mixing capability.

Three-dimensional objects made by the process are, in some embodiments, collapsible or compressible (that is, elastic, e.g., has a Young's modulus at room temperature of from about 0.001, 0.01 or 0.1 gigapascals to about 1, 2 or 4 gigapascals, and/or a tensile strength at maximum load at room temperature of about 0.01, 0.1, or 1 to about 50, 100, or 500 megapascals, and/or a percent elongation at break at room temperature of about 10, 20 50 or 100 percent to 1000, 2000, or 5000 percent, or more).

An additional example of the preparation of a blocked reactive prepolymer is shown in the Scheme below:

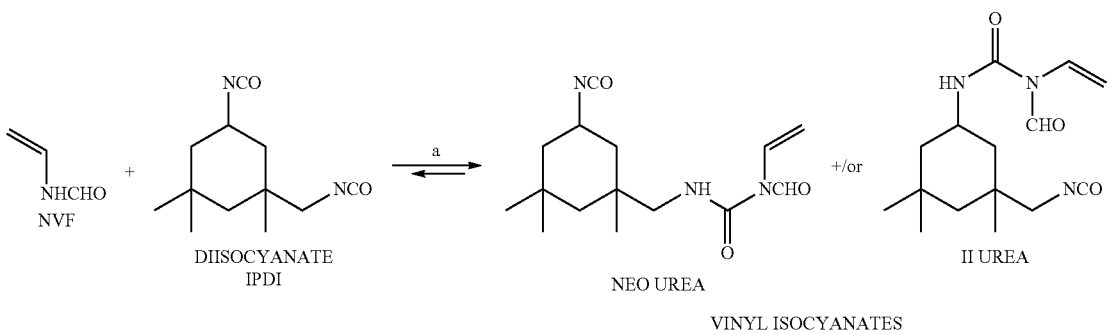

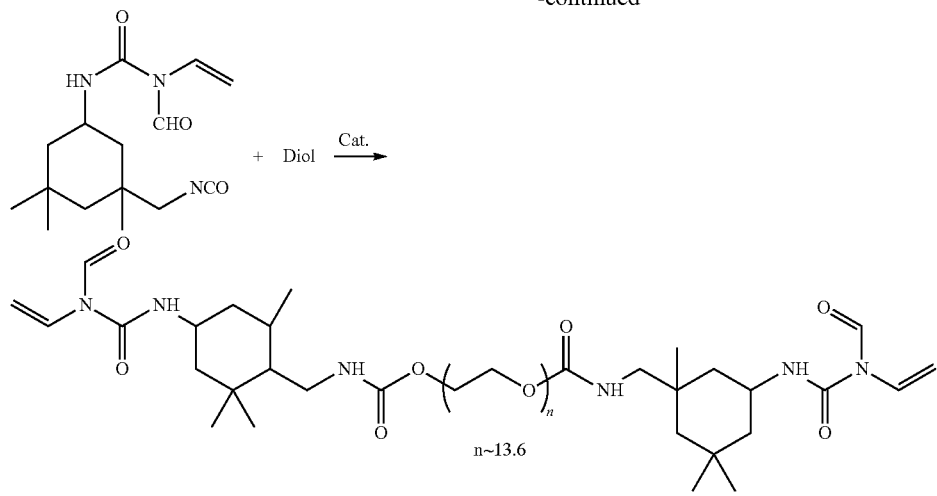

<sup>a</sup> Rate and product split depend on catalyst: Zn Octoate --> slow, mainly II Urea; Sn$^{+2}$ --> faster, mix.

One can use similar chemistry to that described above to form a reactive blocked diisocyanate, a reactive blocked chain extender, or a reactive blocked prepolymer.

Figure 26A:
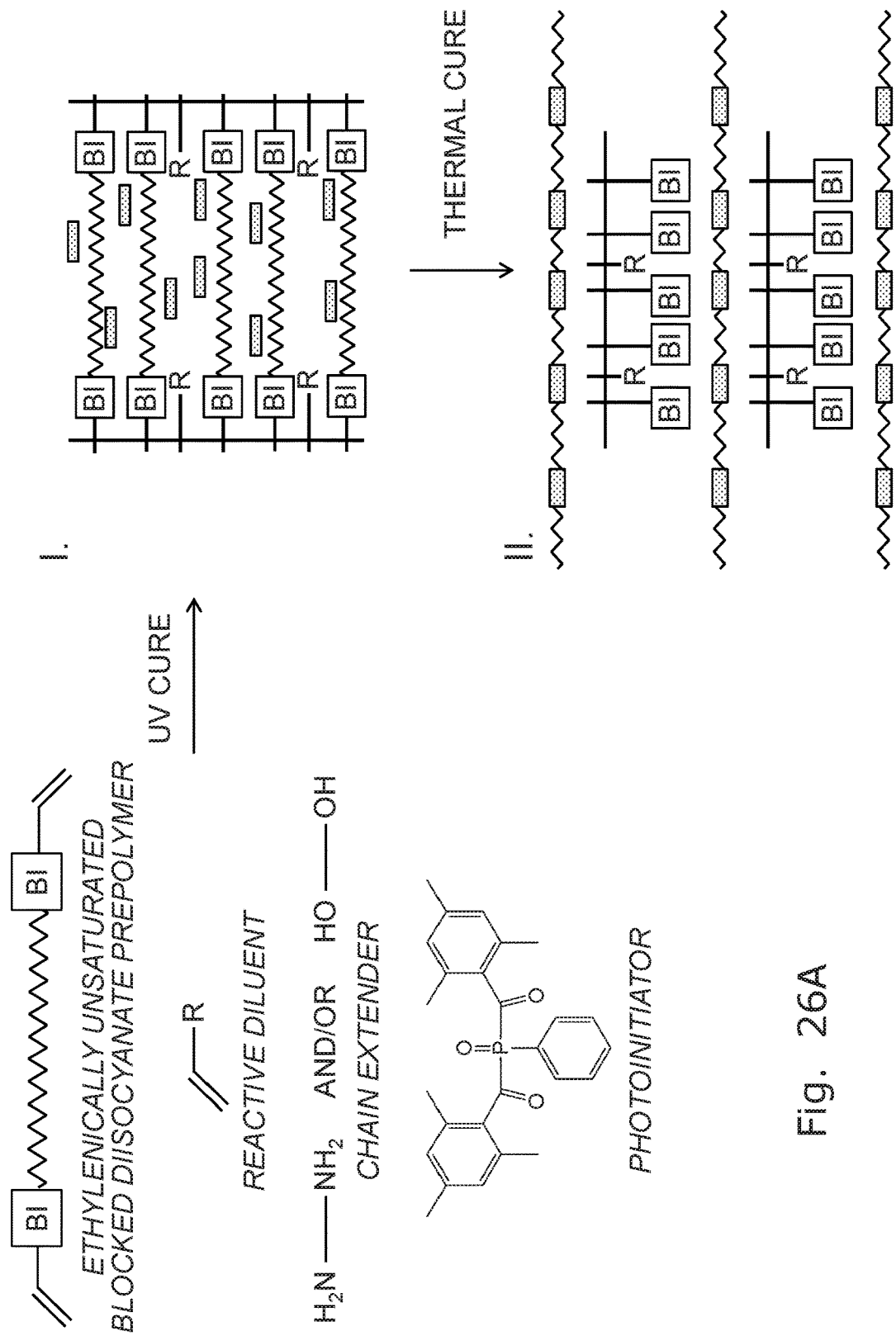
FIG. 26A depicts a dual cure system employing a thermally cleavable end group. I. Crosslinked blocked diisocyanate prepolymer containing unreacted chain extender. II. Polymer blend of: i) linear ethylenically unsaturated blocking monomer copolymerized with reactive diluent and ii) linear thermoplastic polyurethane.

A non-limiting example of a dual cure system employing a thermally cleavable end group is shown in the FIG. 26A and the Scheme below:

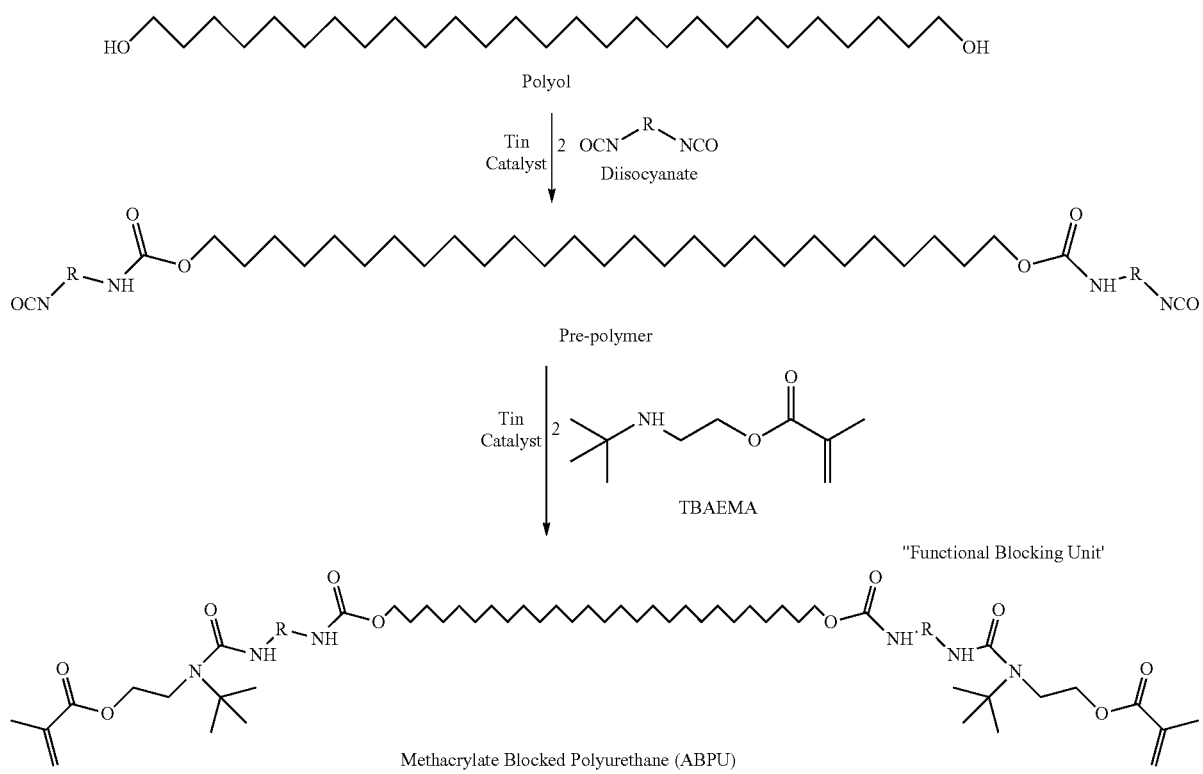

Without wishing to be bound to any underlying mechanism, in some embodiments, during thermal cure, blocking agent is cleaved and diisocyanate prepolymer is re-formed and quickly reacts with chain extenders or additional soft segment to form thermoplastic or thermoset polyurethane, polyurea, or copolymer thereof (e.g., poly(urethane-urea)), as follows:

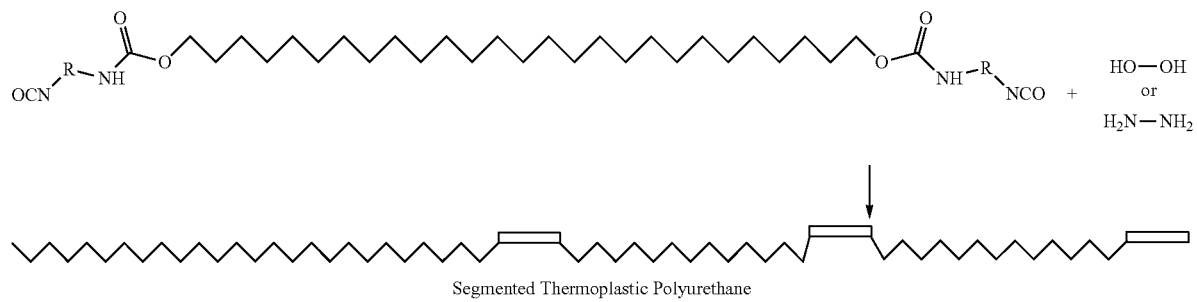

Segmented Thermoplastic Polyurethane

Alternative mechanisms such as those described in section B below may also be implemented or involved.

In the scheme above, the dual cure resin is comprised of a UV-curable (meth)acrylate blocked polyurethane (ABPU), a reactive diluent, a photoinitiator, and a chain extender(s). The reactive diluent (10-50 wt %) is an acrylate or methacrylate that helps to reduce the viscosity of ABPU and will be copolymerized with the ABPU under UV irradiation. The photoinitiator (generally about 1 wt %) can be one of those commonly used UV initiators, examples of which include but are not limited to such as acetophenones (diethoxyacetophenone for example), phosphine oxides diphenyl(2,4,6-trimethylbenzoyl)phosphine oxide, phenylbis(2,4,6-trimethylbenzoyl)phosphine oxide (PPO), Irgacure 369, etc.

After UV curing to form an intermediate shaped product having blocked polyurethane oligomers as a scaffold, and carrying the chain extender, the ABPU resin is subjected to a thermal cure, during which a high molecular weight polyurethane/polyurea is formed by a spontaneous reaction between the polyurethane/polyurea oligomers and the chain extender(s). The polyurethane/polyurea oligomer can react with proper chain extenders through substitution of TBAEMA, N-vinylformamide (NVF) or the like by proper chain extenders, either by deblocking or displacement. The thermal cure time needed can vary depending on the temperature, size, shape, and density of the product, but is typically between 1 to 6 hours depending on the specific ABPU systems, chain extenders and temperature.

One advantageous aspect of the foregoing is using a tertiary amine-containing (meth)acrylate (e.g., t-butylaminoethyl methacrylate, TBAEMA) to terminate synthesized polyurethane/polyurea oligomers with isocyanate at both ends. Using acrylate or methacrylate containing hydroxyl groups to terminate polyurethane/polyurea oligomers with isocyanate ends is used in UV curing resins in the coating field. The formed urethane bonds between the isocyanate and hydroxyl groups are generally stable even at high temperatures. In embodiments of the present invention, the urea bond formed between the tertiary amine of TBAEMA and isocyanate of the oligomer becomes labile when heated to suitable temperature (for example, about 100° C.), regenerating the isocyanate groups that will react with the chain extender(s) during thermal-cure to form high molecular weight polyurethane (PU). While it is possible to synthesize other (meth)acrylate containing isocyanate blocking functionality as generally used (such as N-vinylformamide, ε-caprolactam, 1,2,3-triazole, methyl ethyl ketoxime, diethyl malonate, etc.), the illustrative embodiment uses TBAEMA that is commercially available. The used chain extenders can be diols, diamines, triols, triamines, or their combinations, or others. Ethylene glycol, 1,4-butanediol, methylene dicyclohexylamine (H12MDA; or PACM as the commercial name from Air Products), hydroquinone bis(2-Hydroxyethyl) Ether (HQEE), 4,4'-Methylenebis(3-Chloro-2,6-Diethylaniline) (MCDEA), 4,4'-methylene-bis-(2,6 diethylaniline)(MDEA), 4,4'-Methylenebis(2-chloroaniline) (MOCA) are the preferred chain extenders.

To produce an ABPU, TBAEMA may be used to terminate the isocyanate end groups of the prepolymer, which is derived from isocyanate tipped polyols. The polyols (preferably with hydroxyl functionality of 2) used can be polyethers (especially polytetramethylene oxide (PTMO), polypropylene glycol (PPG)), polyesters (polycaprolactone (PCL), polycarbonate, etc.), polybutadiene and block copolymers such as PCL and PTMO block copolymer (Capa 7201A of Perstop, Inc.). The molecular weight of these polyols can be 500 to 6000 Da, and 500-2000 Da are preferred. In the presence of a catalyst (e.g., stannous octoate with 0.1-0.3 wt % to the weight of polyol; other tin catalysts or amine catalysts), diisocyanate (e.g., toluene diisocyanate (TDI), methylene diphenyl diisocyanate (MDI), hexamethylene diisocyanate (HDI), isophorone diisocyanate (IPDI), hydrogenated MDI (HMDI), para-phenyl diisocyanate (PPDI) etc.) is added to the polyol (or the reverse order; preferably the polyol being added to the isocyanate) with certain molar ratio (larger than 1:1; preferably, no less than 2:1, and 2:1 is mostly preferred) to make a prepolymer with residual isocyanate groups (50-100° C.). TBAEMA is then added to the reaction [Note: moles (TBAEMA)*2+moles(OH)=moles(isocyanate)] to cap the remaining isocyanate groups, resulting in ABPU (under 40-70° C.). Radical inhibitors such as hydroquinone (100-500 ppm) can be used to inhibit polymerization of (meth) acrylate during the reaction.

In general, a three-dimensional product of the foregoing methods comprises (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network). In some example embodiments, the three-dimensional product may also include unreacted photoinitiator remaining in the three-dimensional formed object. For example, in some embodiments, from 0.1 or 0.2 percent by weight to 1, 2 or 4 percent by weight of the photoinitiator may remain in the three-dimensional formed object, or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups, it will be appreciated that unreactive blocking groups may be employed as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders with more than two reactive groups (polyol and polyamine chain extenders such as triols and triamine chain extenders) may be used to form three-dimensional objects comprised of a crosslinked thermoset polyurethane, polyurea, or copolymer thereof (e.g., poly(urethane-urea)).

These materials may be used in bottom-up additive manufacturing techniques such as the continuous liquid interface printing techniques described herein, or other additive manufacturing techniques as noted above and below.

B. Dual Hardening Polymerizable Liquids Employing Blocked Diisocyanates and Thermally Cleavable blocking groups.

Another embodiment provides a method of forming a three-dimensional object comprised of polyurethane, polyurea, or copolymer thereof (e.g., poly(urethane-urea)), the method comprising:

(a) providing a carrier and an optically transparent member having a build surface, the carrier and the build surface defining a build region therebetween;

(b) filling the build region with a polymerizable liquid, the polymerizable liquid comprising a mixture of (i) a blocked or reactive blocked diisocyanate, (ii) a polyol and/or polyamine, (iii) a chain extender, (iv) a photoinitiator, and (v) optionally but in some embodiments preferably a reactive diluent (vi) optionally but in some embodiments preferably a pigment or dye, (vii) optionally but in some embodiments preferably a filler (e.g., silica), (c) irradiating the build region with light through the optically transparent member to form a solid blocked diisocyanate scaffold from the blocked diisocyanate, and optionally the reactive diluent, and advancing the carrier away from the build surface to form a three-dimensional intermediate having the same shape as, or a shape to be imparted to, the three-dimensional object, with the intermediate containing the chain extender and polyol and/or polyamine; and then (d) heating or microwave irradiating the three-dimensional intermediate sufficiently (e.g., sufficiently to de-block the blocked diisocyanate and form an unblocked diisocyanate that, in turn, polymerizes with the chain extender and polyol and/or polyamine) to form the three-dimensional product comprised of polyurethane, polyurea, or copolymer thereof (e.g., poly(urethane-urea)), from the three-dimensional intermediate.

In some embodiments, the blocked or reactive blocked diisocyanate or branched isocyanate comprises a compound of the formula A'-X'-A', or X'(-A')$_n$, where n is at least 2.1, 2.3, 2.5, or 3 (on average), X' is a hydrocarbyl group and each A' is an independently selected substituent of Formula (X'):

Formula (X')

where Z is a blocking group, the blocking group optionally having a reactive terminal group (e.g., a polymerizable end group such as an epoxy, alkene, alkyne, or thiol end group, for example an ethylenically unsaturated end group such as a vinyl ether). In a particular example, each A' is an independently selected substituent of Formula (XI'):

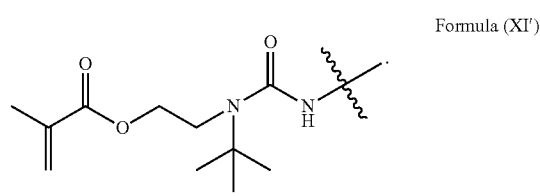 [SMILES: *NC(=O)N(CCOC(=O)C(=C)C)C(C)(C)C]

Formula (XI')

Other constituents and steps of these methods are carried out in like manner as described in section IX.A. above.

Figure 26B:
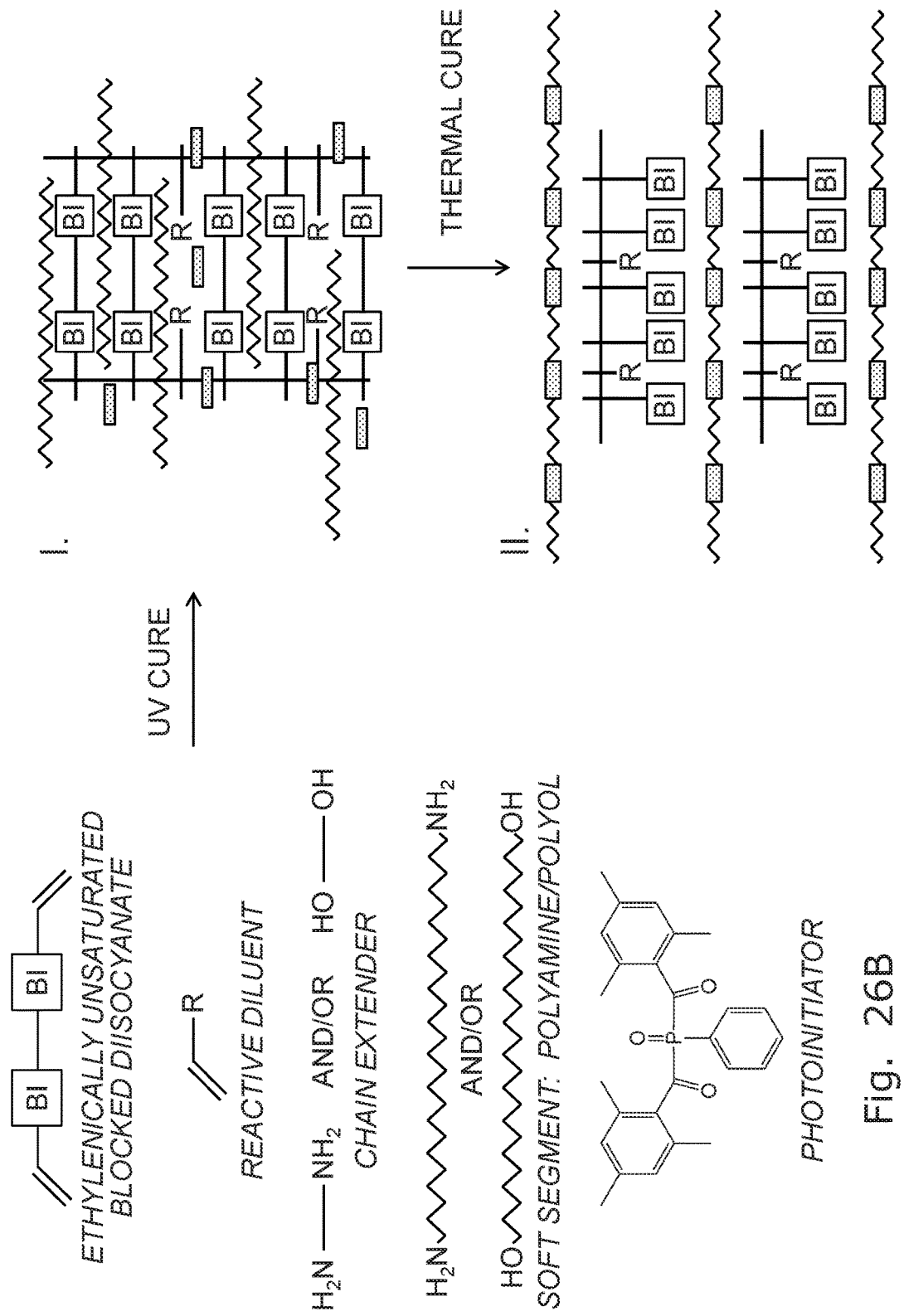
FIG. 26B depicts a method of the present invention carried out with (meth)acrylate blocked diisocyanates (ABDIs). I. Crosslinked blocked diisocyanate containing unreacted soft segment and chain extender. II. Polymer blend of: i) linear ethylenically unsaturated blocking monomer copolymerized with reactive diluent and ii) linear thermoplastic polyurethane.

In a non-limiting example, a blocked diisocyanate is prepared as shown in the Scheme below. Such blocked diisocyanates may be used in methods as shown in FIG. 26B.

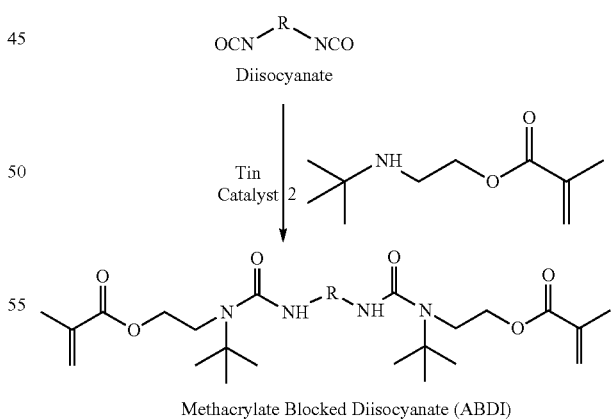

Methacrylate Blocked Diisocyanate (ABDI)

Without wishing to be bound by any particular underlying mechanism, in some embodiments, during thermal cure, the blocking agent is cleaved and the chain extender reacts to form thermoplastic or thermoset polyurethane, polyurea, or a copolymer thereof (e.g., poly(urethane-urea)), for example as shown below:

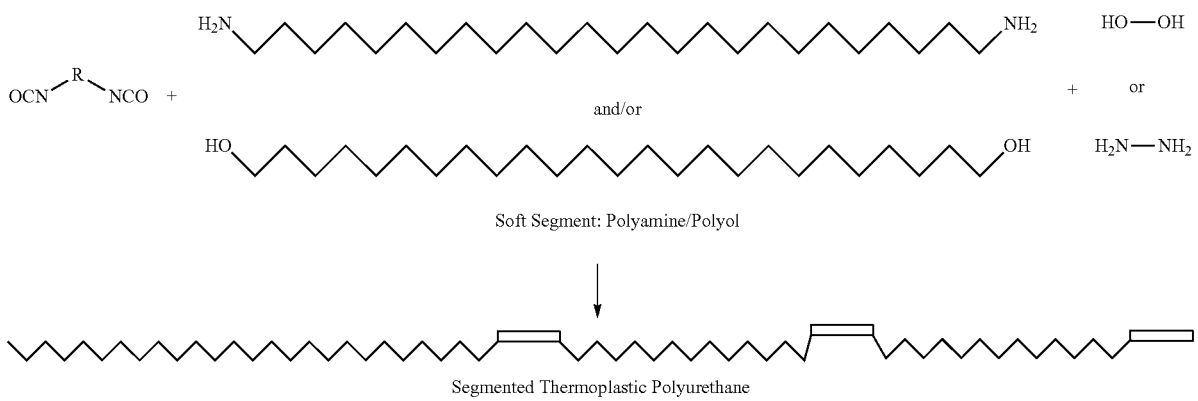

Soft Segment: Polyamine/Polyol

Segmented Thermoplastic Polyurethane

In an alternative mechanism, the chain extender reacts with the blocked diisocyanate or branched isocyanate, eliminates the blocking agent, in the process forming thermoplastic or thermoset polyurethane, polyurea, or a copolymer thereof (e.g., poly(urethane-urea)).

In general, a three-dimensional product of the foregoing methods comprises (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network). In some example embodiments, the three-dimensional product may also include unreacted photoinitiator remaining in the three-dimensional formed object. For example, in some embodiments, from 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups, it will be appreciated that unreactive blocking groups may be employed as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders with more than two reactive groups (polyol and polyamine chain extenders such as triols and triamine chain extenders) may be used to form three-dimensional objects comprised of a crosslinked thermoset polyurethane, polyurea, or copolymer thereof (e.g., poly(urethane-urea)).

These materials may be used in bottom-up additive manufacturing techniques such as the continuous liquid interface printing techniques described herein, or other additive manufacturing techniques as noted above and below.

C. Dual Hardening Polymerizable Liquids Employing Blocked Chain Extenders and Thermally Cleavable Blocking Groups.

Another embodiment provides a method of forming a three-dimensional object comprised of polyurethane, polyurea, or copolymer thereof (e.g., poly(urethane-urea)), the method comprising:

(a) providing a carrier and an optically transparent member having a build surface, the carrier and the build surface defining a build region therebetween;

(b) filling the build region with a polymerizable liquid, the polymerizable liquid comprising a mixture of (i) a polyol and/or polyamine, (ii) a blocked or reactive blocked diisocyanate or branched isocyanate chain extender, (iii) optionally one or more additional chain extenders, (iv) a photoinitiator, and (v) optionally but in some embodiments preferably a reactive diluent (vi) optionally but in some embodiments preferably a pigment or dye, (vii) optionally but in some embodiments preferably a filler (e.g., silica);

(c) irradiating the build region with light through the optically transparent member to form a solid blocked chain diisocyanate or branched isocyanate chain extender scaffold from the blocked or reactive blocked diisocyanate or branched isocyanate chain extender and optionally the reactive diluent, and advancing the carrier away from the build surface to form a three-dimensional intermediate having the same shape as, or a shape to be imparted to, the three-dimensional object, with the intermediate containing the polyol and/or polyamine and optionally one or more additional chain extenders; and then (d) heating or microwave irradiating the three-dimensional intermediate sufficiently to form the three-dimensional product comprised of polyurethane, polyurea, or copolymer thereof (e.g., poly(urethane-urea)), from the three-dimensional intermediate (e.g., heating or microwave irradiating sufficiently to de-block the blocked diisocyanate or branched isocyanate chain extender to form an unblocked diisocyanate chain extender that, in turn, polymerizes with the polyol and/or polyamine and optionally one or more additional chain extenders).

In some embodiments, the blocked or reactive blocked diisocyanate or branched isocyanate chain extender comprises a compound of the formula A"-X"-A" or X"(-A")$_n$, where n is at least 2.1, 2.3, 2.5, or 3 (on average), where X" is a hydrocarbyl group, and each A" is an independently selected substituent of Formula (X"):

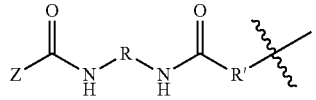

Formula (X")

where R is a hydrocarbyl group, R' is O or NH, and Z is a blocking group, the blocking group optionally having a reactive terminal group (e.g., a polymerizable end group such as an epoxy, alkene, alkyne, or thiol end group, for example an ethylenically unsaturated end group such as a vinyl ether). In a particular example, each A" is an independently selected substituent of Formula (XI"):

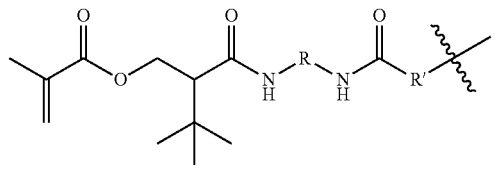

Formula (XI")

where R and R' are as given above.

Other constituents and steps employed in carrying out these methods may be the same as described in section IX.A. above.

An example of the preparation of a blocked diol chain extender is shown in the Scheme below.

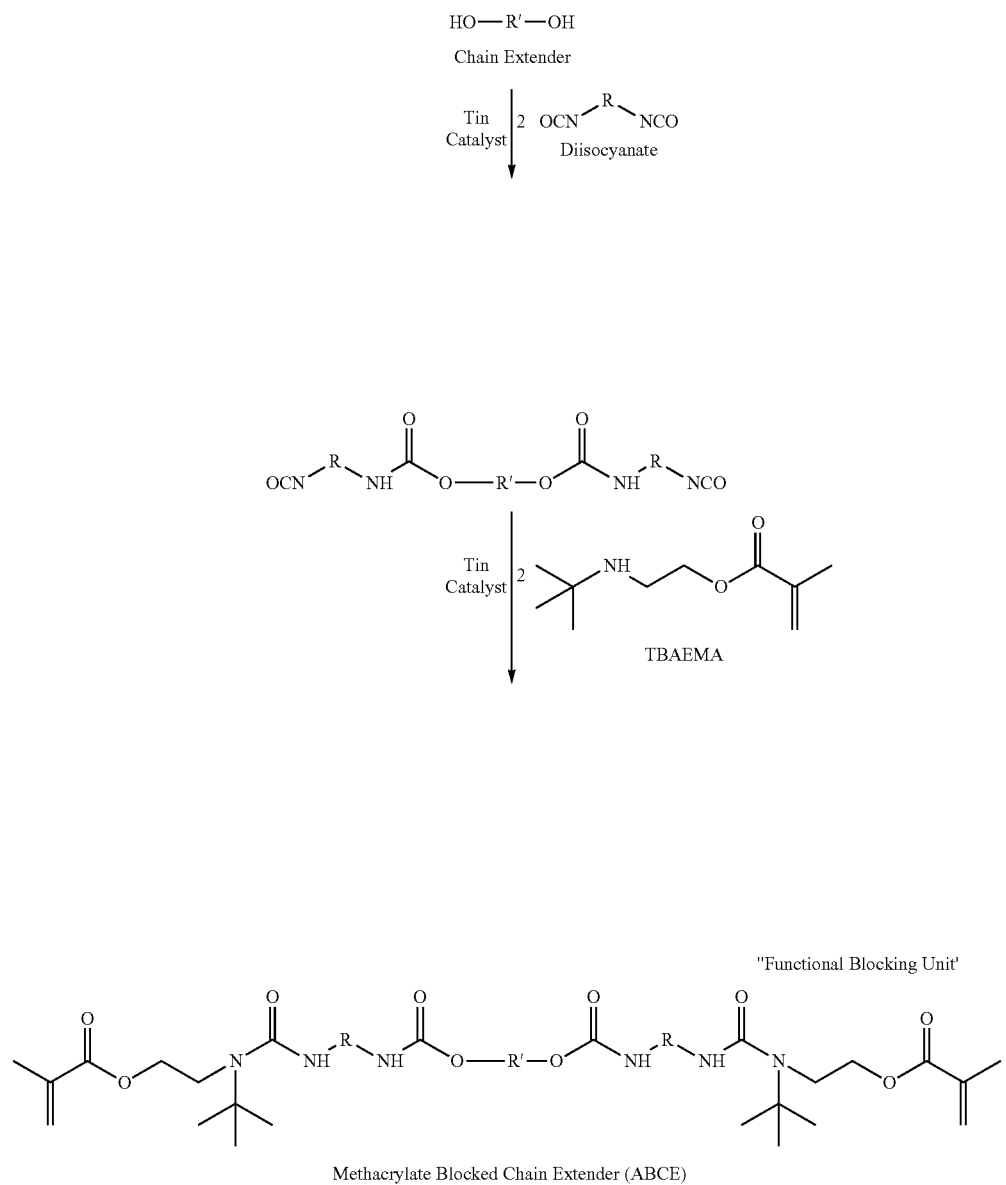

An example of the preparation of a blocked diamine chain extender is shown in the Scheme below:

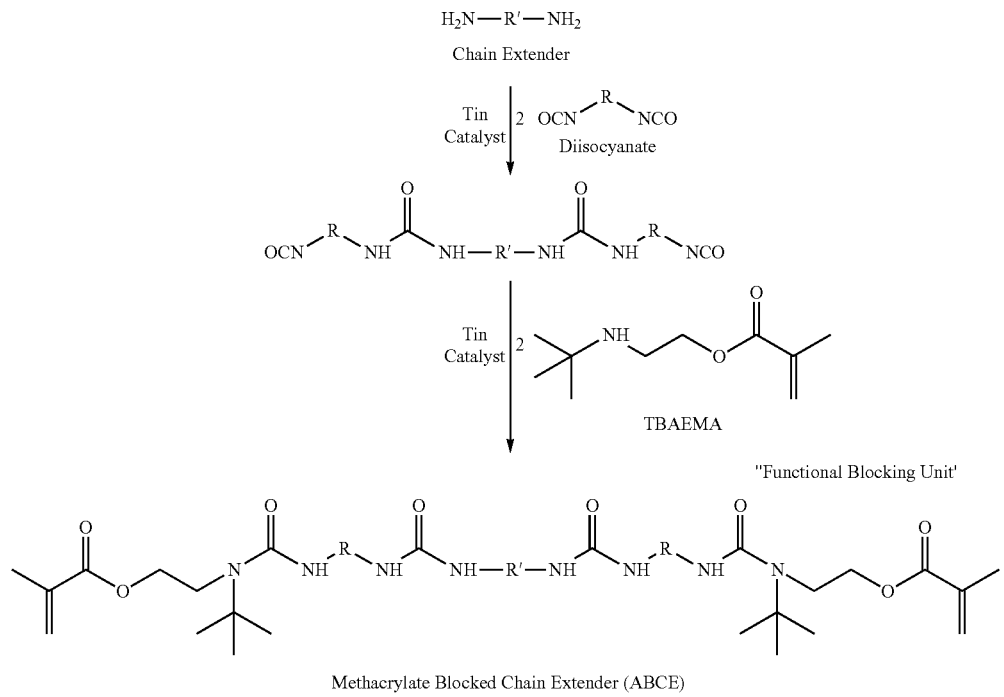

Figure 26C:
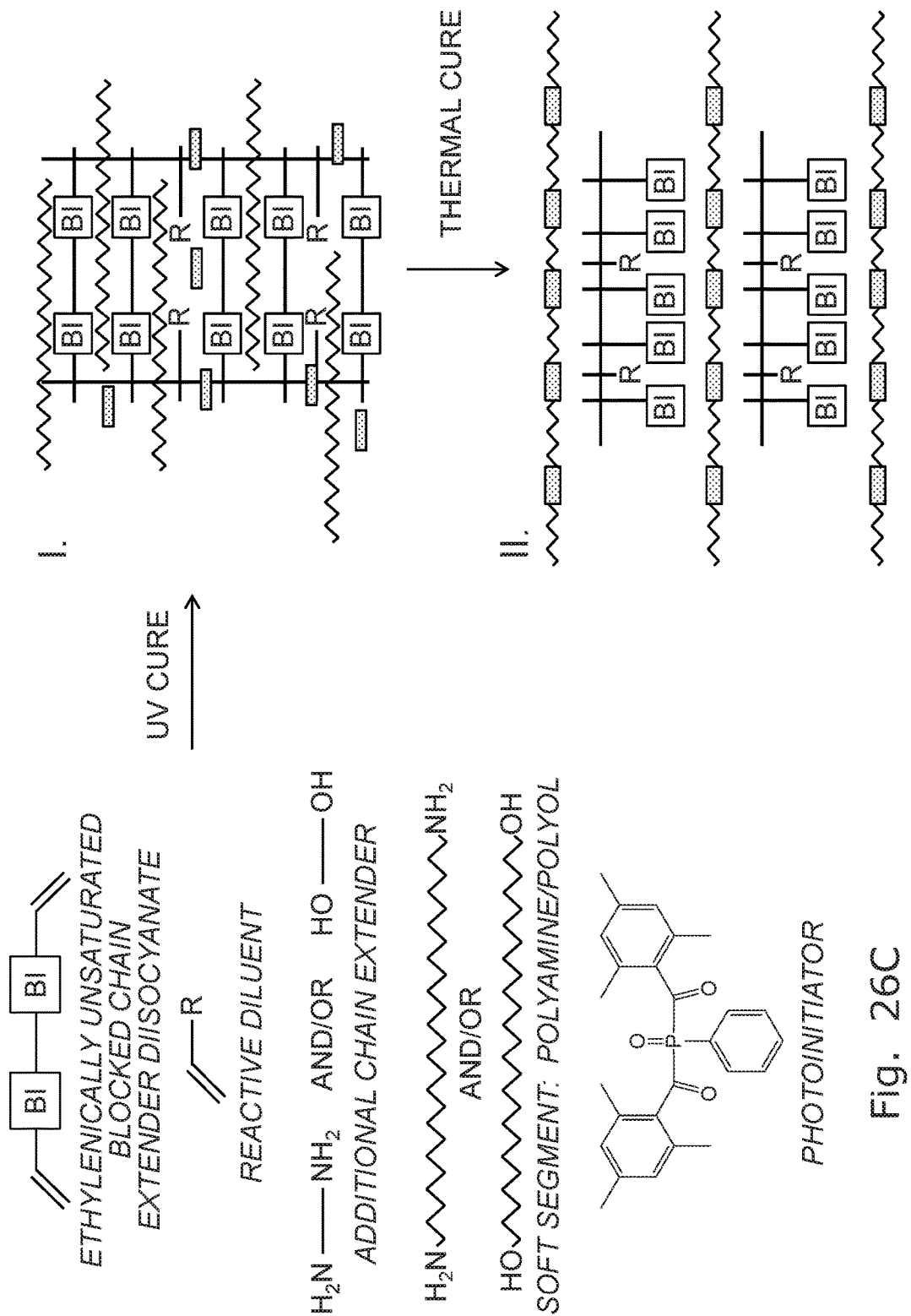
FIG. 26C depicts a method of the present invention carried out with (meth)acrylate blocked chain extenders (ABCEs). I. Crosslinked blocked diisocyanate containing chain extender containing unreacted soft segment and chain extender. II. Polymer blend of: i) linear ethylenically unsaturated blocking monomer copolymerized with reactive diluent and ii) linear thermoplastic polyurethane.

An example of method of the present invention carried out with the materials above is given in FIG. 26C.

Without wishing to be bound to any underlying mechanism of the invention, in some embodiments, during thermal cure, (a) the blocked isocyanate-capped chain extender reacts either directly with soft segment and/or chain extender amine or alcohol groups, displacing the blocking agent; or (b) the blocked isocyanate-capped chain extender is cleaved and diisocyanate-capped chain extender is re-formed and reacts with soft segments and additional chain extender if necessary to yield thermoplastic or thermoset polyurethane, polyurea, or copolymer thereof (e.g., poly (urethane-urea)), such as follows:

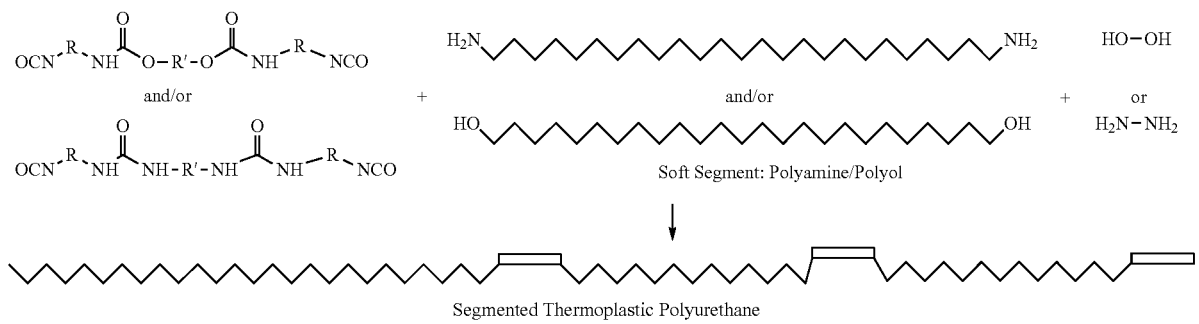

An alternative mechanism analogous to that described in section IX.B. above may also be implemented or employed.

In general, a three-dimensional product of the foregoing methods comprises (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network). In some example embodiments, the three-dimensional product may also include unreacted photoinitiator remaining in the three-dimensional formed object. For example, in some embodiments, from 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups (that is, blocking groups containing polymerizable moieties), it will be appreciated that unreactive blocking groups may be employed as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders with more than two reactive groups (polyol and polyamine chain extenders such as triols and triamine chain extenders) may be used to form three-dimensional objects comprised of a crosslinked thermoset polyurethane, polyurea, or copolymer thereof (e.g., poly(urethane-urea)).

These materials may be used in bottom-up additive manufacturing techniques such as the continuous liquid interface printing techniques described herein, or other additive manufacturing techniques as noted above and below.

Those skilled in the art will appreciate that systems as described in Ying and Cheng, Hydrolyzable Polyureas Bearing Hindered Urea Bonds, *JACS* 136, 16974 (2014), may be used in carrying out the methods described herein.

X. Articles Comprised of Interpenetrating Polymer Networks (IPNs) Formed from Dual Hardening Polymerizable Liquids.

In some embodiments, polymerizable liquids comprising dual hardening systems such as described above are useful in forming three-dimensional articles that, in turn, comprise interpenetrating polymer networks. This area has been noted by Sperling at Lehigh University and K. C. Frisch at the University of Detroit, and others.

In non-limiting examples, the polymerizable liquid and method steps are selected so that the three-dimensional object comprises the following:

Sol-Gel Compositions.

This may be carried out with an amine (ammonia) permeable window or semipermeable member. In the system discussed here, tetraethyl orthosiliciate (TEOS), epoxy (diglycidyl ether of Bisphenol A), and 4-amino propyl triethoxysilane may be added to a free radical crosslinker, and in the process the free radical crosslinker polymerizes and contains the noted reactants, which are then reacted in another step or stage. Reaction requires the presence of water and acid. Photoacid generators (PAGs) could optionally be added to the mixture described above to promote the reaction of the silica based network. Note that if only TEOS is included, one will end up with a silica (glass) network. One could then increase the temperature to remove the organic phase and be left with a silica structure that would be difficult to prepare by more conventional methods. Many variations (different polymeric structures) can be prepared by this process in addition to epoxies including urethanes, functionalized polyols, silicone rubber, etc.

Hydrophobic-Hydrophilic IPNs.

Prior IPN research contained a number of examples for hydrophobic-hydrophilic networks for improved blood compatibility as well as tissue compatibility for biomedical parts. Poly(hydroxyethyl (meth)acrylate) is a typical example of a hydrophilic component. Another option is to add poly(ethylene oxide) polyols or polyamines with an isocyanate to produce polyurethane, polyurea, or copolymer thereof (e.g., poly(urethane-urea)), incorporated in the reactive system.

Phenolic Resins (Resoles).

Precursors to phenolic resins involve either phenolic resoles (formaldehyde terminal liquid oligomers) or phenolic novolacs (phenol terminal solid oligomers crosslinkable with hexamethyltetraamine). For the present process phenolic resoles can be considered. The viscosity thereof may be high but dilution with alcohols (methanol or ethanol) may be employed. Combination of the phenolic resole with the crosslinkable monomer can then provide a product formed from an IPN. Reaction of the phenolic resole to a phenolic resin can occur above 100° in a short time range. One variation of this chemistry would be to carbonize the resultant structure to carbon or graphite. Carbon or graphite foam is typically produced from phenolic foam and used for thermal insulation at high temperatures.

Polyimides.

Polyimides based on dianhydrides and diamines are amenable to the present process. In this case the polyimide monomers incorporated into the reactive crosslinkable monomer are reacted to yield an IPN structure. Most of the dianyhdrides employed for polyimides may be crystalline at room temperature but modest amounts of a volatile solvent can allow a liquid phase. Reaction at modest temperatures (e.g., in the range of about 100° C.) is possible to permit polyimide formation after the network is polymerized.

Conductive Polymers.

The incorporation of aniline and ammonium persulfate into the polymerizable liquid is used to produce a conductive part. After the reactive system is polymerized and a post treatment with acid (such as HCl vapor), polymerization to polyaniline can then commence.

Natural Product Based IPNs.

Numerous natural product based IPNs are known based on triglyceride oils such as castor oil. These can be incorporated into the polymerizable liquid along with an isocyanate. Upon completion of the part, the triglycerides can then be reacted with the diisocyanate to form a crosslinked polyurethane. Glycerol can, of course, also be used.

Sequential IPNs.

In this case, the molded crosslinked networks are swollen with a monomer and free radical catalyst (peroxide) and optionally crosslinker followed by polymerization. The crosslinked triacylate system should imbide large amounts of styrene, acrylate and/or methacrylate monomers allowing a sequential IPN to be produced.

Polyolefin Polymerization.

Polyolefin catalysts (e.g., metallocenes) can be added to the crosslinkable reactive system. Upon exposure of the part to pressurized ethylene (or propylene) or a combination (to produce EPR rubber) and temperature (in the range of 100° C.) the part can then contain a moderate to substantial amount of the polyolefin. Ethylene, propylene and alpha olefin monomers should easily diffuse into the part to react with the catalyst at this temperature, and as polymerization proceeds more olefin will diffuse to the catalyst site. A large number of parts can be post-polymerized at the same time.

XI. Fabrication Products.

A. Example Three-Dimensional (3D) Objects

Three-dimensional products produced by the methods and processes of the present invention may be final, finished or substantially finished products, or may be intermediate products, or may be intermediate products for which further manufacturing steps such as surface treatment, laser cutting, electric discharge machining, etc., is intended. Intermediate products include products for which further additive manufacturing, in the same or a different apparatus, may be carried out. For example, a fault or cleavage line may be introduced deliberately into an ongoing "build" by disrupting, and then reinstating, the gradient of polymerization zone, to terminate one region of the finished product, or simply because a particular region of the finished product or "build" is less fragile than others.

Numerous different products can be made by the methods and apparatus of the present invention, including both large-scale models or prototypes, small custom products, miniature or microminiature products or devices, etc. Examples include, but are not limited to, medical devices and implantable medical devices such as stents, drug delivery depots, functional structures, microneedle arrays, fibers and rods such as waveguides, micromechanical devices, microfluidic devices, etc.

Thus in some embodiments the product can have a height of from 0.1 or 1 millimeters up to 10 or 100 millimeters, or more, and/or a maximum width of from 0.1 or 1 millimeters up to 10 or 100 millimeters, or more. In other embodiments, the product can have a height of from 10 or 100 nanometers up to 10 or 100 microns, or more, and/or a maximum width of from 10 or 100 nanometers up to 10 or 100 microns, or more. These are examples only; maximum size and width depends on the architecture of the particular device and the resolution of the light source and can be adjusted depending upon the particular goal of the embodiment or article being fabricated.

In some embodiments, the ratio of height to width of the product is at least 2:1, 10:1, 50:1, or 100:1, or more, or a width to height ratio of 1:1, 10:1, 50:1, or 100:1, or more.

In some embodiments, the product has at least one, or a plurality of, pores or channels formed therein, as discussed further below.

The processes described herein can produce products with a variety of different properties. Hence in some embodiments the products are rigid; in other embodiments the products are flexible or resilient. In some embodiments, the products are a solid; in other embodiments, the products are a gel such as a hydrogel. In some embodiments, the products have a shape memory (that is, return substantially to a previous shape after being deformed, so long as they are not deformed to the point of structural failure). In some embodiments, the products are unitary (that is, formed of a single polymerizable liquid); in some embodiments, the products are composites (that is, formed of two or more different polymerizable liquids). Particular properties will be determined by factors such as the choice of polymerizable liquid(s) employed.

In some embodiments, the product or article made has at least one overhanging feature (or "overhang"), such as a bridging element between two supporting bodies, or a cantilevered element projecting from one substantially vertical support body. Because of the unidirectional, continuous nature of some embodiments of the present processes, the problem of fault or cleavage lines that form between layers when each layer is polymerized to substantial completion and a substantial time interval occurs before the next pattern is exposed, is substantially reduced. Hence, in some embodiments the methods are particularly advantageous in reducing, or eliminating, the number of support structures for such overhangs that are fabricated concurrently with the article.

B. Example Structures and Geometries of 3D Objects

In example embodiments, the three-dimensional (3D) object may be formed with thousands or millions of shape variations imparted on the three-dimensional object while being formed. In example embodiments, the pattern generator generates different patterns of light to activate photoinitiator in the region of the gradient of polymerization to impart different shapes as the object is extracted through the gradient of polymerization. In example embodiments, the pattern generator may have high resolution with millions of pixel elements that can be varied to change the shape that is imparted. For example, the pattern generator may be a DLP with more than 1,000 or 2,000 or 3,000 or more rows and/or more than 1,000 or 2,000 or 3,000 or more columns of micromirrors, or pixels in an LCD panel, that can be used to vary the shape. As a result, very fine variations or gradations may be imparted on the object along its length. In example embodiments, this allows complex three-dimensional objects to be formed at high speed with a substantially continuous surface without cleavage lines or seams. In some examples, more than a hundred, thousand, ten thousand, hundred thousand or million shape variations may be imparted on the three-dimensional object being formed without cleavage lines or seams across a length of the object being formed of more than 1 mm, 1 cm, 10 cm or more or across the entire length of the formed object. In example embodiments, the object may be continuously formed through the gradient of polymerization at a rate of more than 1, 10, 100, 1000, 10000 or more microns per second.

In example embodiments, this allows complex three-dimensional (3D) objects to be formed. In some example embodiments, the 3D formed objects have complex non-injection moldable shapes. The shapes may not be capable of being readily formed using injection molding or casting. For example, the shapes may not be capable of being formed by discrete mold elements that are mated to form a cavity in which fill material is injected and cured, such as a conventional two-part mold. For example, in some embodiments, the 3D formed objects may include enclosed cavities or partially open cavities, repeating unit cells, or open-cell or closed-cell foam structures that are not amenable to injection molding and may including hundreds, thousands or millions of these structures or interconnected networks of these structures. However, in example embodiments, these shapes may be 3D formed using the methods described in the present application with a wide range of properties, including a wide range of elastomeric properties, tensile strength and elongation at break through the use of dual cure materials and/or interpenetrating polymer networks to form these structures. In example embodiments, the 3D objects may be formed without cleavage lines, parting lines, seams, sprue, gate marks or ejector pin marks that may be present with injection molding or other conventional techniques. In some embodiments, the 3D formed objects may have continuous surface texture (whether smooth, patterned or rough) that is free from molding or other printing artifacts (such as cleavage lines, parting lines, seams, sprue, gate marks or ejector pin marks) across more than 1 mm, 1 cm, 10 cm or more or across the entire length of the formed object. In example embodiments, complex 3D objects may be formed with no discrete layers visible or readily detectable from the printing process in the finished 3D object across more than 1 mm, 1 cm, 10 cm or more or across the entire length of the formed object. For example, the varying shapes imparted during the course of printing by the pattern generator may not be visible or detectable as different layers in the finished 3D object since the printing occurs through the gradient of polymerization zone (from which the 3D object is extracted as it is exposed by varying patterns projected from the pattern generator). While the 3D objects resulting from this process may be referred to as 3D printed objects, the 3D objects may be formed through continuous liquid interphase printing without the discrete layers or cleavage lines associated with some 3D printing processes.

In some embodiments, the 3D formed object may include one or more repeating structural elements to form the 3D objects, including, for example, structures that are (or substantially correspond to) enclosed cavities, partially-enclosed cavities, repeating unit cells or networks of unit cells, foam cell, Kelvin foam cell or other open-cell or closed-cell foam structures, crisscross structures, overhang structures, cantilevers, microneedles, fibers, paddles, protrusions, pins, dimples, rings, tunnels, tubes, shells, panels, beams (including I-beams, U-beams, W-beams and cylindrical beams), struts, ties, channels (whether open, closed or partially enclosed), waveguides, triangular structures, tetrahedron or other pyramid shape, cube, octahedron, octagon prism, icosidodecahedron, rhombic triacontahedron or other polyhedral shapes or modules (including Kelvin minimal surface tetrakaidecahedra, prisms or other polyhedral shapes), pentagon, hexagonal, octagon and other polygon structures or prisms, polygon mesh or other three-dimensional structure. In some embodiments, a 3D formed object may include combinations of any of these structures or interconnected networks of these structures. In example embodiments, all or a portion of the structure of the 3D formed object may correspond (or substantially correspond) to one or more Bravais lattice or unit cell structures, including cubic (including simple, body-centered or face-centered), tetragonal (including simple or body-centered), monoclinic (including simple or end-centered), orthohombic (including simple, body-centered, face-centered or end-centered), rhombohedral, hexagonal and triclinic structures. In example embodiments, the 3D formed object may include shapes or surfaces that correspond (or substantially correspond) to a catenoid, helicoid, gyroid or lidinoid, other triply periodic minimal surface (TPMS), or other geometry from the associate family (or Bonnet family) or Schwarz P ("Primitive") or Schwarz D ("Diamond"), Schwarz H ("Hexagonal") or Schwarz CLP ("Crossed layers of parallels") surfaces, argyle or diamond patterns, lattice or other pattern or structure.

In example embodiments, the pattern generator may be programmed to vary rapidly during printing to impart different shapes into the gradient of polymerization with high resolution. As a result, any of the above structural elements may be formed with a wide range of dimensions and properties and may be repeated or combined with other structural elements to form the 3D object. In example embodiments, the 3D formed object may include a single three-dimensional structure or may include more than 1, 10, 100, 1000, 10000, 100000, 1000000 or more of these structural elements. The structural elements may be repeated structural elements of similar shapes or combinations of different structural elements and can be any of those described above or other regular or irregular shapes. In example embodiments, each of these structural elements may have a dimension across the structure of at least 10 nanometers, 100 nanometers, 10 microns, 100 microns, 1 mm, 1 cm, 10 cm, 50 cm or more or may have a dimension across the structure of less than 50 cm, 10 cm, 1 cm, 1 mm, 100 microns, 10 microns, 100 nanometers or 10 nanometers or less. In example embodiments, a height, width or other dimension across the structure may be in the range of from about 10 nanometers to about 50 cm or more or any range subsumed therein. As used herein, "any range subsumed therein" means any range that is within the stated range. For example, the following are all subsumed within the range of about 10 nanometers to about 50 square cm and are included herein: 10 nanometers to 1 micron; 1 micron to 1 millimeter; 1 millimeter to 1 centimeter; and 1 centimeter to 50 cm or any other range or set of ranges within the stated range. In example embodiments, each of the structural elements may form a volume of the 3D object in the range of from about 10 square nanometers to about 50 square cm or more or any range subsumed therein. In example embodiments, each of the structural elements may form a cavity or hollow region or gap between surfaces of the structural element having a dimension across the cavity or hollow region or gap in the range of from about 10 nanometers to about 50 cm or more or any range subsumed therein or may define a volume within the expanse of the 3D formed object in the range of from about 10 square nanometers to about 50 square cm or more or any range subsumed therein.

The structural elements may be about the same size or the size may vary throughout the volume of the 3D formed object. The sizes may increase or decrease from one side of the 3D formed object to another side (gradually or stepwise) or elements of different shapes may be intermixed in regular or irregular patterns (for example, a 3D elastomeric foam with varying sizes of open-cell and/or closed-cell cavities intermixed throughout the foam).

In some embodiments, the 3D formed objects may have irregular shapes with overhangs, bridging elements or asymmetries or may otherwise have an offset center of gravity in the direction being formed. For example, the 3D formed object may be asymmetric. In example embodiments, the 3D formed object may not have rotational symmetry around any axis or may have rotational symmetry only around a single axis. In example embodiments, the 3D formed object may not have reflectional symmetry around any plane through the 3D formed object or may have reflectional symmetry only around a single plane. In example embodiments, the 3D object may have an offset center of gravity. For example, the center of gravity of the 3D formed object may not be at the positional center of the object. In some examples, the center of gravity may not be located along any central axis of the object. For example, the 3D formed object may be a shoe sole or insert that generally follows the contour of a foot. The shoe sole or insert may tilt to the right or left and have different widths for the heel and toes. As a result, the 3D formed object in this example will not have reflectional symmetry from side to side or front to back. However, it may have reflectional symmetry from bottom to top if it is a uniformly flat shoe sole or insert. In other examples, the shoe sole or insert may be flat on one side and be contoured to receive the arch of a foot on the other side and, as a result, will not have reflectional symmetry from bottom to top either. Other 3D formed objects for wearable, prosthetic or anatomical shapes or devices may have similar asymmetries and/or offset center of gravity. For example, a 3D formed object for a dental mold or dental implant may substantially conform to the shape of a tooth and may not have reflectional symmetry about any plane. In another example, a 3D formed component for a wearable device may substantially conform to the shape of a body party and have corresponding asymmetries, such as athletic wear such as a right or left contoured shin guard or foam padding or insert for use between a hard shin guard or a helmet or other wearable component and the human body. These are examples only and any number of 3D formed objects may be asymmetric and/or have an offset center of gravity. In example embodiments, where there are significant asymmetries or protruding elements (such as arms, bridging elements, cantilevers, brush fibers or the like) and the desired structural elements will be elastomeric, there is a potential for deformation during 3D printing or subsequent curing. For example, if a large amount of non-UV curable elastomeric resin material is included, gravity may cause deformation before final curing. While the scaffold formed from UV-curable material during 3D printing (from the initial cure in a dual cure process) helps lock-in the shape, some elastomeric compositions with highly asymmetric or protruding shapes may be susceptible to deformation. In some example embodiments, the UV curable material in the composition may be adjusted to form a more rigid scaffold to avoid deformation. In other example embodiments, objects with asymmetric shapes and/or offset center of gravity may be formed in pairs (or in other combinations) with connectors that are later removed, particularly if the 3D formed objects or protruding elements are relatively long. In an example, an elastomeric 3D object may be formed along a length, and have an asymmetry, center of gravity offset and/or protruding element transverse to the length that is more than 10%, 20%, 30%, 40%, 50% or more of the length. For example, the 3D formed object may have a length of about 1 cm to 50 cm or more or any range subsumed therein and may have a transverse or lateral asymmetry or protruding element of about 1 cm to 50 cm or more or any range subsumed therein. In an example embodiment, two or more of these objects may be formed together in a way that provides support for the transverse or protruding elements until the elastomeric material is cured and the objects are separated. For example, two shoe soles may be formed (e.g., when formed in the direction of their length) as a pair (for example, with rotated and inverted shoe soles formed together with small removable connectors between them) such that the soles provide support to one another while being formed. In other example embodiments, other support structures may be formed and removed after curing of the elastomeric material.

C. Example Materials and Compositions of 3D Objects

In example embodiments, 3D formed objects may have any of the above shapes or structures and may comprise or consist of or consist essentially of: (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), and/or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network), and/or (iv) photoinitiator, including unreacted photoinitiator and/or reacted photoinitiator fragments.

In some example embodiments, a silicone rubber 3D object may be formed.

1. Silicone Polyurethanes, Polyureas, or Poly(Urethane-Ureas).

In any of the preceding polyurethane examples, silicone or poly(dimethylsiloxane) (PDMS) may be used as soft segment in the formation of these materials. For example, a (meth)acrylate-functional ABPU could be formed by first reacting an oligomeric PDMS diol or diamine with two equivalents of isocyanate to form a PDMS urethane prepolymer. This material can be further reacted with TBAEMA or other reactive blocking agents described herein to form a reactive blocked PDMS prepolymer which could be blended with chain extenders and reactive diluents as described in the examples above.

2. Silicone Interpenetrating Polymer Networks.

In some embodiments, the material may comprise, consists of or consist essentially of a UV-curable PDMS oligomer that is blended with a two-part thermally curable PDMS oligomer system.

In example embodiments, 3D formed objects may have any of the above shapes or structures and may comprise or consist of or consist essentially of:
  (i) A thermoset silicone or PDMS network cured by platinum-catalyzed hydrosilation, tin-catalyzed condensation chemistry, or peroxide initiated chemistry.
  (ii) A UV-curable reactive diluent that is miscible with silicone thermoset oligomers prior to curing. Example: an acrylate-functional PDMS oligomer.
  (iii) combinations thereof (optionally blended with reactive diluent(s), for example as an interpenetrating polymer network, a semi-interpenetrating polymer network, or as a sequential interpenetrating polymer network), and/or
  (iv) photoinitiator, including unreacted photoinitiator and/or reacted photoinitiator fragments.

In an example embodiment, Phenylbis(2-(6-trimethylbenzoyl)phosphine oxide (PPO) is dissolved in isobornyl acrylate (IBA) with a THINKY™ mixer. Methacryloxypropyl terminated polydimethylsiloxane (DMS-R31; Gelest Inc.) is added to the solution, followed by addition of Sylgard Part A and Part B (Corning PDMS precursors), and then further mixed with a THINKY™ mixer to produce a homogeneous solution. The solution is loaded into an apparatus as described above and a three-dimensional intermediate is produced by ultraviolet curing as described above. The three-dimensional intermediate is then thermally cured at 100° C. for 12 hours to produce the final silicone rubber product.

3. Epoxy Interpenetrating Networks.

In some example embodiments, an epoxy 3D object may be formed. In example embodiments, 3D formed objects may have any of the above shapes or structures and may comprise or consist of or consist essentially of:
  (i) A thermoset epoxy network cured by the reaction of a diepoxide with a diamine. Optionally, co-reactants may also be included for example: co-reactants including polyfunctional amines, acids (and acid anhydrides), phenols, alcohols, and thiols;
  (ii) A UV-curable reactive diluent that is miscible with the epoxy thermoset precursors prior to curing;
  (iii) combinations thereof (optionally blended with the reactive diluent(s), for example as an interpenetrating polymer network, a semi-interpenetrating polymer network, or as a sequential interpenetrating polymer network), and/or
  (iv) photoinitiator, including unreacted photoinitiator and/or reacted photoinitiator fragments.

In an example embodiment: 10.018 g EpoxAcast 690 resin part A and 3.040 g part B is mixed on a THINKY™ mixer. 3.484 g is then mixed with 3.013 g of RKP5-78-1, a 65/22/13 mix of Sartomer CN9782/N-vinylpyrrolidone/diethyleneglycol diacrylate to give a clear blend which is cured under a Dymax ultraviolet lamp to produce an elastic 3D object.

In a second example embodiment, RKP11-10-1 containing 3.517 g of the above epoxy and 3.508 g of RKP5-90-3 and 65/33/2/0.25 blend of Sartomer CN2920/N-vinylcaprolactam/N-vinylpyrrolidone/PPO initiator is cured similarly to form a flexible 3D object.

In some example embodiments, the 3D formed object may include sol-gel compositions, hydrophobic or hydrophilic compositions, phenolic resoles, cyanate esters, polyimides, conductive polymers, natural product based IPNs, sequential IPNs and polyolefin as described above.

In example embodiments, 3D formed objects may have any of the shapes or structures described above and may comprise or consist of or consist essentially of a plurality of different materials in different regions of the 3D formed object with different tensile strength or other varying properties. In example embodiments, the differing materials may be selected from any of those describe above. In some example embodiments, the process of fabricating the product may be paused or interrupted one or more times, to change the polymerizable liquid. In example embodiments, 3D formed objects may include multiple materials (which may, for example, be a thermoplastic or thermoset polyurethane, polyurea, or copolymer thereof or silicone rubber or epoxy or combination of the foregoing) with different tensile strengths as described further below. While a fault line or plane may be formed in the intermediate by the interruption, if the subsequent polymerizable liquid is, in its second cure material, reactive with that of the first, then the two distinct segments of the intermediate will cross-react and covalently couple to one another during the second cure (e.g., by heating or microwave irradiation). Thus, for example, any of the materials described herein may be sequentially changed to form a product having multiple distinct segments with different tensile properties, while still being a unitary product with the different segments covalently coupled to one another.

In example embodiments, the polyurethane, polyurea, or copolymer thereof (e.g., poly(urethane-urea)) or silicone rubber or epoxy or combination of the foregoing may comprise a majority of the 3D formed object by weight and may comprise more than 50%, 60%, 70%, 80% or 90% of the 3D formed object by weight. In example embodiments, the polyurethane, polyurea, or copolymer thereof (e.g., poly(urethane-urea)) or silicone rubber or epoxy or combination of the foregoing may comprise or consist of or consist essentially of an interpenetrating network, a semi-interpenetrating polymer network, or as a sequential interpenetrating polymer network.

(i) Examples of Thermoplastic or Thermoset Polyurethane, Polyurea, or Copolymer Thereof (e.g., Poly(Urethane-Urea))

In example embodiments, the polyurethane, polyurea, or copolymer thereof (e.g., poly(urethane-urea)) may comprise a majority of the 3D formed object by weight and may comprise more than 50%, 60%, 70%, 80% or 90% of the 3D formed object by weight.

In example embodiments, the polyurethane, polyurea, or copolymer thereof (e.g., poly(urethane-urea)) may comprise or consist of or consist essentially of linear thermoplastic or thermoset polyurethane, polyurea, or copolymer thereof (e.g., poly(urethane-urea)). In example embodiments, the linear thermoplastic or cross-linked thermoset polyurethane, polyurea, or copolymer thereof (e.g., poly(urethane-urea)) may comprise a majority of the 3D formed object by weight and may comprise more than 50%, 60%, 70%, 80% or 90% of the 3D formed object by weight.

In example embodiments, the polyurethane, polyurea, or copolymer thereof (e.g., poly(urethane-urea)) may comprise or consist of or consist essentially of a polymer blend of (i) linear ethylenically unsaturated blocking monomer copolymerized with reactive diluent and (ii) linear thermoplastic or cross-linked thermoset polyurethane, polyurea, or copolymer thereof (e.g., poly(urethane-urea)). In example embodiments, the polymer blend may comprise a majority of the 3D formed object by weight and may comprise more than 50%, 60%, 70%, 80% or 90% of the 3D formed object by weight. In example embodiments, the linear thermoplastic or cross-linked polyurethane, polyurea, or copolymer thereof (e.g., poly(urethane-urea)) may comprise or consist of or consist essentially of linear poly(meth)acrylate.

In example embodiments, the polyurethane, polyurea, or copolymer thereof (e.g., poly(urethane-urea)) may comprise or consist of or consist essentially of an interpenetrating network, a semi-interpenetrating polymer network, or as a sequential interpenetrating polymer network of ethylenically unsaturated monomer and crosslinked or linear polyurethane. In example embodiments, the network of ethylenically unsaturated monomer and crosslinked polyurethane may comprise a majority of the 3D formed object by weight and may comprise more than 50%, 60%, 70%, 80% or 90% of the 3D formed object by weight. In example embodiments, the linear thermoplastic or cross-linked thermoset polyurethane, polyurea, or copolymer thereof (e.g., poly(urethane-urea)) may comprise or consist of or consist essentially of crosslinked poly(meth)acrylate.

In example embodiments, the polyurethane, polyurea, or copolymer thereof (e.g., poly(urethane-urea)) may comprise or consist of or consist essentially of an interpenetrating network, a semi-interpenetrating polymer network, or as a sequential interpenetrating polymer network of ethylenically unsaturated monomer and linear thermoplastic or cross-linked thermoset polyurethane. In example embodiments, the network of ethylenically unsaturated monomer and and linear thermoplastic or crosslinked thermoset polyurethane may comprise a majority of the 3D formed object by weight and may comprise more than 50%, 60%, 70%, 80% or 90% of the 3D formed object by weight. In example embodiments, the linear thermoplastic or cross-linked thermoset polyurethane, polyurea, or copolymer thereof (e.g., poly(urethane-urea)) may comprise or consist of or consist essentially of linear poly(meth)acrylate.

In some example embodiments, the 3D formed object may include sol-gel compositions, hydrophobic or hydrophilic compositions, phenolic resoles, cyanate esters, polyimides, conductive polymers, natural product based IPNs, sequential IPNs and polyolefins as described above.

(ii) Example Photoinitiator and Photoinitiator Fragments

In example embodiments, the 3D formed object may include unreacted photoinitiator remaining in the 3D formed object. For example, in some embodiments, from 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.1 or 0.2 percent by weight to 1, 2 or 4 percent by weight of reacted photoinitiator fragments may remain in the three-dimensional formed object or the reacted photoinitiator fragments may be present in lower amounts or only a trace amount.

In example embodiments, because the systems, in part, consist of monomers and oligomers capable of being polymerized by exposure to UV light, the end products will contain residual photoinitiator molecules and photoiniator fragments.

In some embodiments, a photopolymerization will undergo the transformation outlined below. In the first step, initiation, UV light cleaves the initiator into active radical fragments. These active radical fragments will go on to react with monomer group "M." During the propagation step, the active monomer will react with additional monomers that attach to the growing polymer chain. Finally, termination can occur either by recombination or by disproportionation.

Initiation

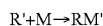

Propagation

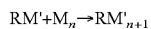

Termination
Combination

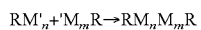

Disproportionation

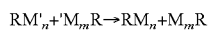

In example embodiments, 3D formed objects generated by the processes outlined herein may contain the following chemical products after the object is created:
(1) Latent unreacted photoinitiator—photoinitiator is rarely 100% consumed during photopolymerization, therefore the product will typically contain unreacted photoinitiators embedded throughout the solid object:
(2) Photoinitiator by-products covalently attached to the polymer network.

In example embodiments, photoinitiators may include the following:
(a) Benzoyl-Chromophore Based:
These systems take the form

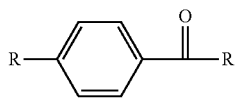

where "R" is any number of other atoms, including H, O, C, N, S. These initiators cleave to form:

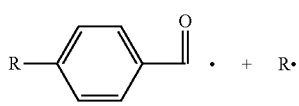

Where • represents a free radical. Either of these components may go on to initiate polymerization and will therefore be covalently bound to the polymer network.

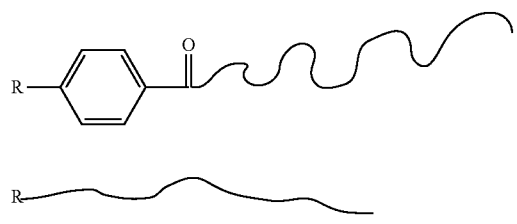

An example of such an initiator is shown below

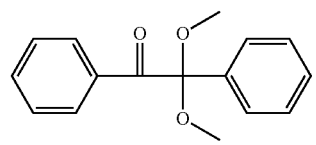 [SMILES: COC(OC)(C(=O)c1ccccc1)c1ccccc1]

(b) Morpholino and Amino Ketones.
These systems take the form:

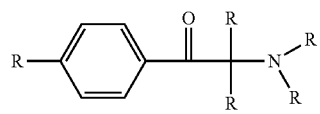

where "R" is any number of other atoms including H, O, C, N, S. These initiators cleave to form

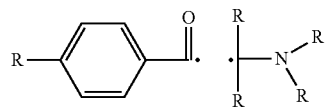

Where • represents a free radical. Either of these components may go on to initiate polymerization and will therefore be covalently bound to the polymer network.

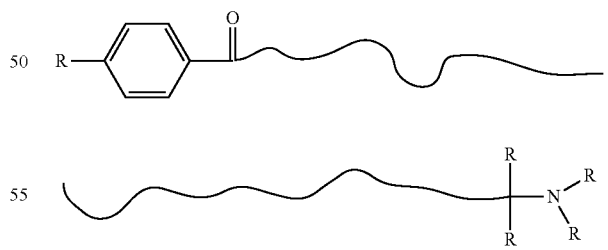

An example of such an initiator is shown below

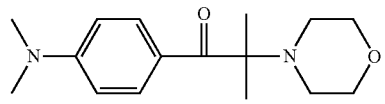 [SMILES: CN(C)c1ccc(C(=O)C(C)(C)N2CCOCC2)cc1]

(c) Benzoyl Phosphine Oxide.

These systems take the form

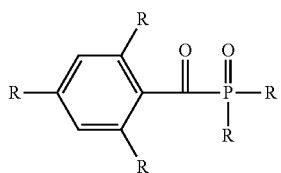

where "R" is any number of other atoms including H, O, C, N, S. These initiators cleave to form

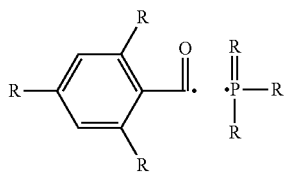

Where • represents a free radical. Either of these components may go on to initiate polymerization and will therefore be covalently bound to the polymer network.

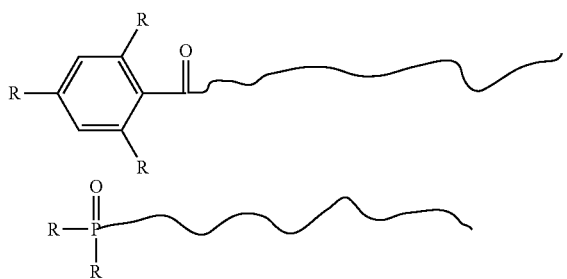

An example of such an initiator is shown below

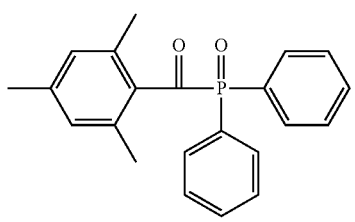 [SMILES: Cc1cc(C)c(C(=O)P(=O)(c2ccccc2)c2ccccc2)c(C)c1]

(d) Amines.

Many photoinitiators may be used in combination with amines. Here the photoinitiators in the excited state serve to abstract a hydrogen atom from the amine, thus generating an active radical. This radical can go on to initiator polymerization and will therefore become incorporated into the formed polymer network. This process is outlined below:

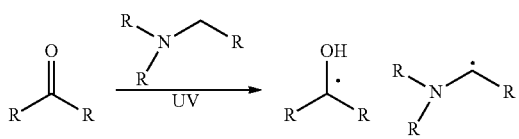

Either of these active species can go on to form an active polymer chain resulting in the structures below:

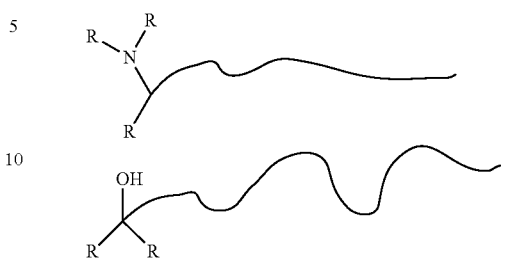

(e) Other Systems.

Other types of photoinitiators that may be used to generate such materials and therefore will generate fragments which are covalently attached to the formed polymer network include: triazines, ketones, peroxides, diketones, azides, azo derivatives, disulfide derivatives, disilane derivatives, thiol derivatives, diselenide derivatives, diphenylditelluride derivatives, digermane derivatives, distannane derivatives, carbo-germanium compounds, carbon-silicon derivatives, sulfur-carbon derivatives, sulfur-silicon derivatives, peresters, Barton's ester derivatives, hydroxamic and thiohydroxamic acids and esters, organoborates, organometallic compounds, titanocenes, chromium complexes, alumate complexes, carbon-sulfur or sulfur-sulfur iniferter compounds, oxyamines, aldehydes, acetals, silanes, phosphorous-containing compounds, borane complexes, thioxanthone derivatives, coumarins, anthraquinones, fluorenones, ferrocenium salts.

(f) Detection.

Detection of the unique chemical fingerprint of photoinitiator fragments in a cured polymer object can be accomplished by a number of spectroscopic techniques. Particular techniques useful alone or in combination include: UV-Vis spectroscopy, fluorescence spectroscopy, infrared spectroscopy, nuclear magnetic resonance spectroscopy, mass spectrometry, atomic absorption spectroscopy, raman spectroscopy, and X-Ray photoelectron spectroscopy.

D. Example Properties of 3D Objects

The structural properties of the 3D formed object may be selected together with the properties of the materials from which the 3D object is formed to provide a wide range of properties for the 3D object. Dual cure materials and methods described above in the present application may be used to form complex shapes with desired material properties to form a wide range of 3D objects.

In some embodiments, 3D formed objects may be rigid and have, for example, a Young's modulus (MPa) in the range of about 800 to 3500 or any range subsumed therein, a Tensile Strength (MPa) in the range of about 30 to 100 or any range subsumed therein, and/or a percent elongation at break in the range of about 1 to 100 or any range subsumed therein. Non-limiting examples of such rigid 3D formed objects may include fasteners; electronic device housings; gears, propellers, and impellers; wheels, mechanical device housings; tools and other rigid 3D objects.

In some embodiments, 3D formed objects may be semi-rigid and have, for example, a Young's modulus (MPa) in the range of about 300-2500 or any range subsumed therein, a Tensile Strength (MPa) in the range of about 20-70 or any range subsumed therein, and/or a percent elongation at break in the range of about 40 to 300 or 600 or any range subsumed therein. Non-limiting examples of such rigid 3D formed objects may include structural elements; hinges including living hinges; boat and watercraft hulls and decks; wheels; bottles, jars and other containers; pipes, liquid tubes and connectors and other semi-rigid 3D objects.

In some embodiments, 3D formed objects may be elastomeric and have, for example, a Young's modulus (MPa) in the range of about 0.5-40 or any range subsumed therein, a Tensile Strength (MPa) in the range of about 0.5-30 or any range subsumed therein, and/or a percent elongation at break in the range of about 50-1000 or any range subsumed therein. Non-limiting examples of such rigid 3D formed objects may include foot-wear soles, heels, innersoles and midsoles; bushings and gaskets; cushions; electronic device housings and other elastomeric 3D objects.

In Examples 18-61 are given materials for the formation of polyurethane products having a variety of different tensile properties, ranging from elastomeric, to semi-rigid, to flexible, as described above.

In some example embodiments, the process of fabricating the product may be paused or interrupted one or more times, to change the polymerizable liquid. In example embodiments, 3D formed objects may include multiple materials (which may, for example, be a thermoplastic or thermoset polyurethane, polyurea, or copolymer thereof) with different tensile strengths. While a fault line or plane may be formed in the intermediate by the interruption, if the subsequent polymerizable liquid is, in its second cure material, reactive with that of the first, then the two distinct segments of the intermediate will cross-react and covalently couple to one another during the second cure (e.g., by heating or microwave irradiation). Thus, for example, any of the materials described herein may be sequentially changed to form a product having multiple distinct segments with different tensile properties, while still being a unitary product with the different segments covalently coupled to one another. In some embodiments, a 3D object may be formed with a plurality of regions with different materials and properties. For example, a 3D formed object could have one or more regions formed from a first material or first group of one or more materials having a Tensile Strength (MPa) in the range of about 30-100 or any range subsumed therein, and/or one or more regions formed from a second material or second group of one or more materials having a Tensile Strength (MPa) in the range of about 20-70 or any range subsumed therein and/or one or more regions formed from a third material or third group of one or more materials having a Tensile Strength (MPa) in the range of about 0.5-30 or any range subsumed therein or any combination of the foregoing. For example, the 3D object could have from 1-10 or more different regions (or any range subsumed therein) with varying tensile strength selected from any of the materials and tensile strengths described above. For example, a hinge can be formed, with the hinge comprising a rigid segment, coupled to a second elastic segment, coupled to a third rigid segment, by sequentially changing polymerizable liquids (e.g., from among those described in Examples 19-60 above) during the formation of the three-dimensional intermediate. A shock absorber or vibration dampener can be formed in like manner, with the second segment being either elastic or semi-rigid. A unitary rigid funnel and flexible hose assembly can be formed in like manner.

E. Additional Examples of 3D Objects

The above methods, structures, materials, compositions and properties may be used to 3D print a virtually unlimited number of products. Examples include, but are not limited to, medical devices and implantable medical devices such as stents, drug delivery depots, catheters, bladder, breast implants, testicle implants, pectoral implants, eye implants, contact lenses, dental aligners, microfluidics, seals, shrouds, and other applications requiring high biocompatibility, functional structures, microneedle arrays, fibers, rods, waveguides, micromechanical devices, microfluidic devices; fasteners; electronic device housings; gears, propellers, and impellers; wheels, mechanical device housings; tools; structural elements; hinges including living hinges; boat and watercraft hulls and decks; wheels; bottles, jars and other containers; pipes, liquid tubes and connectors; foot-ware soles, heels, innersoles and midsoles; bushings, o-rings and gaskets; shock absorbers, funnel/hose assembly, cushions; electronic device housings; shin guards, athletic cups, knee pads, elbow pads, foam liners, padding or inserts, helmets, helmet straps, head gear, shoe cleats, gloves, other wearable or athletic equipment, brushes, combs, rings, jewelry, buttons, snaps, fasteners, watch bands or watch housings, mobile phone or tablet casings or housings, computer keyboards or keyboard buttons or components, remote control buttons or components, auto dashboard components, buttons, dials, auto body parts, paneling, other automotive, aircraft or boat parts, cookware, bakeware, kitchen utensils, steamers and any number of other 3D objects. The universe of useful 3D products that may be formed is greatly expanded by the ability to impart a wide range of shapes and properties, including elastomeric properties, through the use of multiple methods of hardening such as dual cure where a shape can be locked-in using continuous liquid interface printing and subsequent thermal or other curing can be used to provide elastomeric or other desired properties. Any of the above described structures, materials and properties can be combined to form 3D objects including the 3D formed products described above. These are examples only and any number of other 3D objects can be formed using the methods and materials described herein.

XII. Washing of Intermediate Prior to Second Cure.

When desired, washing of the intermediate may be carried out by any suitable technique, aided with any suitable apparatus, including but not limited to those described in U.S. Pat. No. 5,248,456, the disclosure of which is incorporated herein by reference.

Wash liquids that may be used to carry out the present invention include, but are not limited to, water, organic solvents, and combinations thereof (e.g., combined as co-solvents), optionally containing additional ingredients such as surfactants, chelants (ligands), enzymes, borax, dyes or colorants, fragrances, etc., including combinations thereof. The wash liquid may be in any suitable form, such as a solution, emulsion, dispersion, etc.

Examples of organic solvents that may be used as a wash liquid, or as a constituent of a wash liquid, include, but are not limited to, alcohol, ester, dibasic ester, ketone, acid, aromatic, hydrocarbon, ether, dipolar aprotic, halogenated, and base organic solvents, including combinations thereof. Solvents may be selected based, in part, on their environmental and health impact (see, e.g., GSK Solvent Selection Guide 2009).

Examples of alcohol organic solvents that may be used in the present invention include, but are not limited to, aliphatic and aromatic alcohols such as 2-ethyl hexanol, glycerol, cyclohexanol, ethylene glycol, propylene glycol, di-propylene glycol, 1,4-butanediol, isoamyl alcohol, 1,2-propanediol, 1,3-propanediol, benzyl alcohol, 2-pentanol, 1-butanol, 2-butanol, methanol, ethanol, t-butanol, 2-propanol, 1-propanol, 2-methoxyethanol, tetrahydrofuryl alcohol, benzyl alcohol, etc., including combinations thereof.

Examples of ester organic solvents that may be used to carry out the present invention include, but are not limited to, t-butyl acetate, n-octyl acetate, butyl acetate, ethylene carbonate, propylene carbonate, butylenes carbonate, glycerol carbonate, isopropyl acetate, ethyl lactate, propyl acetate, dimethyl carbonate, methyl lactate, ethyl acetate, ethyl propionate, methyl acetate, ethyl formate etc., including combinations thereof.

Examples of dibasic ester organic solvents include, but are not limited to, dimethyl esters of succinic acid, glutaric acid, adipic acid, etc., including combinations thereof.

Examples of organic ketone organic solvents that may be used to carry out the present invention include, but are not limited to, cyclohexanone, cyclopentanone, 2-pentanone, 3-pentanone, methylisobutyl ketone, acetone, methylethyl ketone, etc., including combinations thereof.

Examples of acid organic solvents that may be used to carry out the present invention include, but are not limited to, propionic acid, acetic anhydride, acetic acid, etc., including combinations thereof.

Examples of aromatic organic solvents that may be used to carry out the present invention include, but are not limited to, mesitylene, cumene, p-xylene, toluene, benzene, etc., including combinations thereof.

Examples of hydrocarbon (i.e., aliphatic) organic solvents that may be used to carry out the present invention include, but are not limited to, cis-decalin, ISOPAR G, isooctane, methyl cyclohexane, cyclohexane, heptane, pentane, methylcyclopentane, 2-methylpentane, hexane, petroleum spirit, etc., including combinations thereof.

Examples of ether organic solvents that may be used to carry out the present invention include, but are not limited to, di(ethylene glycol), ethoxybenzene, tri(ethylene glycol), sulfolane, DEG monobutyl ether, anisole, diphenyl ether, dibutyl ether, t-amyl methyl ether, t-butylmethyl ether, cyclopentyl methyl ether, t-butyl ethyl ether, 2-methyltetrahydrofuran, diethyl ether, bis(2-methoxyethyl) ether, dimethyl ether, 1,4-dioxane, tetrahydrofuran, 1,2-dimethoxyethane, diisopropyl ether, etc., including combinations thereof.

Examples of dipolar aprotic organic solvents that may be used to carry out the present invention include, but are not limited to, dimethylpropylene urea, dimethyl sulphoxide, formamide, dimethyl formamide, N-methylformamide, N-methyl pyrrolidone, propanenitrile, dimethyl acetamide, acetonitrile, etc., including combinations thereof.

Examples of halogenated organic solvents that may be used to carry out the present invention include, but are not limited to, 1,2-dichlorobenzene, 1,2,4-trichlorobenzene, chlorobenzene, trichloroacetonitrile, chloroacetic acid, trichloroacetic acid, perfluorotoluene, perfluorocyclohexane, carbon tetrachloride, dichloromethane, perfluorohexane, fluorobenzene, chloroform, perfluorocyclic ether, trifluoracetic acid, trifluorotoluene, 1,2-dichloroethane, 2,2,2-trifluoroethanol, etc., including combinations thereof.

Examples of base organic solvents that may be used to carry out the present invention include, but are not limited to, N,N-dimethylaniline, triethylamine, pyridine, etc., including combinations thereof.

Examples of other organic solvents that may be used to carry out the present invention include, but are not limited to, nitromethane, carbon disulfide, etc., including combinations thereof.

Examples of surfactants include, but are not limited to, anionic surfactants (e.g., sulfates, sulfonates, carboxylates, and phosphate esters), cationic surfactants, zwitterionic surfactants, nonionic surfactants, etc., including combinations thereof. Common examples include, but are not limited to, sodium stearate, linear aikylbenzenesulfonates, lignin sulfonates, fatty alcohol ethoxylates, alkylphenol ethoxylates, etc., including combinations thereof. Numerous examples additional examples of suitable surfactants are known, some of which are described in U.S. Pat. Nos. 9,198,847, 9,175,248, 9,121,000, 9,120,997, 9,095,787, 9,068,152, 9,023,782, and 8,765,108.

Examples of chelants (chelating agents) include, but are not limited to, ethylenediamine tetraacetic acid, phosphates, nitrilotriacetic acid (NTA), citrates, silicates, and polymers of acrylic and maleic acid.

Examples of enzymes that may be included in the wash liquid include, but are not limited to, proteases, amylases, lipases, cellulases, etc., including mixtures thereof. See, e.g., U.S. Pat. Nos. 7,183,248, 6,063,206.

In some embodiments, the wash liquid can be an aqueous solution of ethoxylated alcohol, sodium citrate, tetrasodium N,N-bis(carboxymethyl)-L-glutamate, sodium carbonate, citric acid, and isothiazolinone mixture. One particular example thereof is SIMPLE GREEN® all purpose cleaner (Sunshine Makers Inc., Huntington Beach, Calif., USA) used per se or mixed with additional water.

In some embodiments, the wash liquid can be an aqueous solution comprised of 2-butoxyethanol, sodium metasilicate, and sodium hydroxide. One particular example thereof is PURPLE POWER™ degreaser/cleaner (Aiken Chemical Co., Greenville, S.C., USA), used per se or mixed with additional water.

In some embodiments, the wash liquid can be ethyl lactate, alone or with a co-solvent. One particular example thereof is BIO-SOLV™ solvent replacement (Bio Brands LLC, Cinnaminson, N.J., USA), used per se or mixed with water.

In some embodiments, the wash liquid consists of a 50:50 (volume:volume) solution of water and isopropanol.

When the wash liquid includes ingredients that are not desired for carrying into the further curing step, in some embodiments the initial wash with the wash liquid can be followed with a further rinsing step with a rinse liquid, such as water (e.g., distilled and/or deionized water), or a mixture of water and an alcohol such as isopropanol.

XIII. Alternate Methods and Apparatus.

While the present invention is preferably carried out by continuous liquid interphase/interface polymerization, as described in detail above and in further detail below, in some embodiments alternate methods and apparatus for bottom-up or top down three-dimension fabrication may be used, including layer-by-layer fabrication. Examples of such methods and apparatus include, but are not limited to, those described in U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, US Patent Application Publication Nos. 2013/0292862 to Joyce and 2013/0295212 to Chen et al., and PCT Application Publication No. WO 2015/164234 to Robeson et al. The disclosures of these patents and applications are incorporated by reference herein in their entirety.

Elements and features that may be used in carrying out the present invention are explained in PCT Application Nos. PCT/US2014/015486 (published as U.S. Pat. No. 9,211,678 on Dec. 15, 2015); PCT/US2014/015506 (also published as U.S. Pat. No. 9,205,601 on Dec. 8, 2015), PCT/US2014/015497 (also published as US 2015/0097316, and as U.S. Pat. No. 9,216,546 on Dec. 22, 2015), and in J. Tumbleston, D. Shirvanyants, N. Ermoshkin et al., Continuous liquid interface production of 3D Objects, *Science* 347, 1349-1352 (published online 16 Mar. 2015).

Embodiments of the present invention are explained in greater detail in the following non-limiting examples.

Example 1

High Aspect Ratio Adjustable Tension Build Plate Assembly

Figure 7:
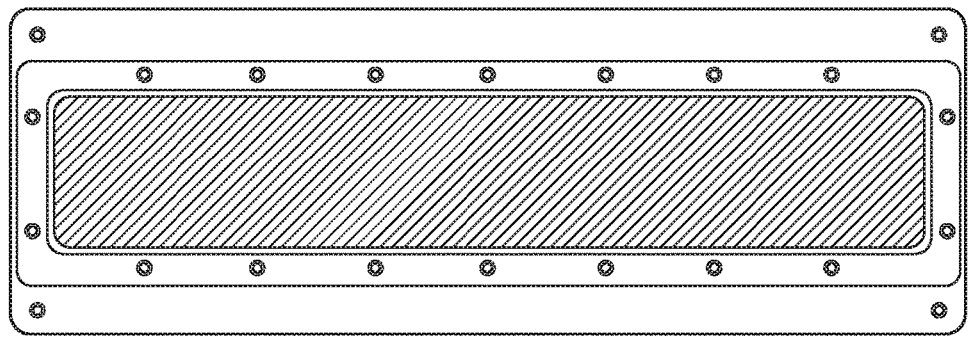
FIG. 7 is a top view of a 3 inch by 16 inch "high aspect" rectangular build plate (or "window") assembly of the present invention, where the film dimensions are 3.5 inch by 17 inch.
Figure 8:
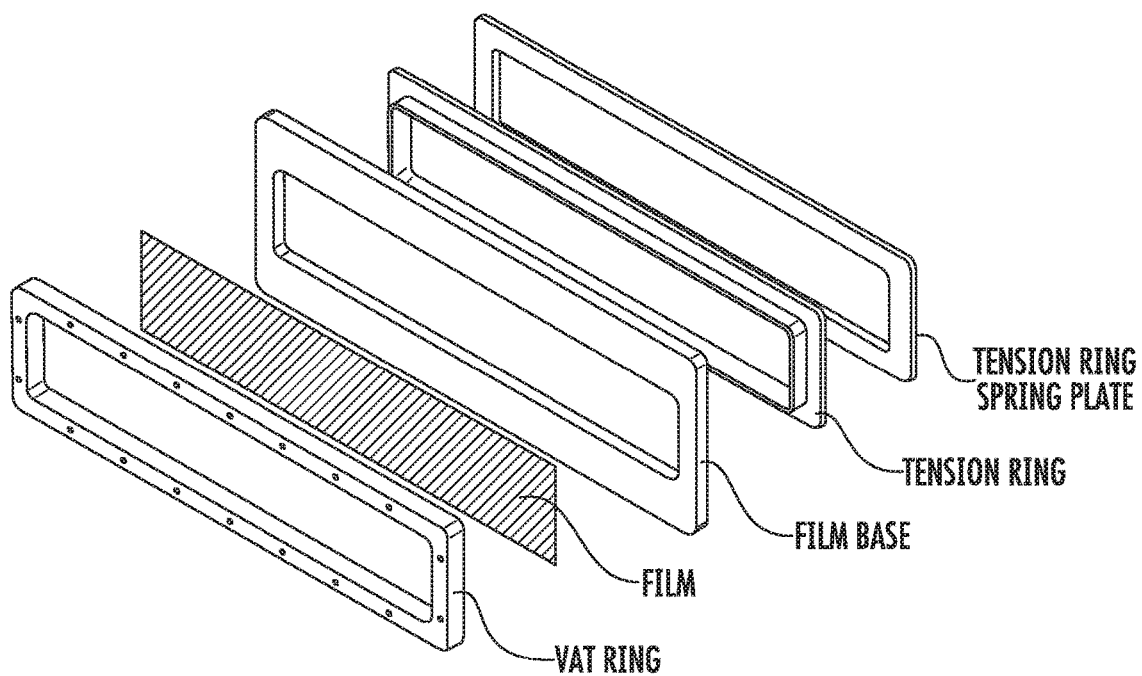
FIG. 8 is an exploded view of the build plate of FIG. 7, showing the tension ring and tension ring spring plate.

FIG. 7 is a top view and FIG. 8 is an exploded view of a 3 inch by 16 inch "high aspect" rectangular build plate (or "window") assembly of the present invention, where the film dimensions are 3.5 inches by 17 inches. The greater size of the film itself as compared to the internal diameter of vat ring and film base provides a peripheral or circumferential flange portion in the film that is clamped between the vat ring and the film base, as shown in side-sectional view in FIG. 9. One or more registration holes (not shown) may be provided in the polymer film in the peripheral or circumferential flange portion to aid in aligning the polymer film between the vat ring and film base, which are fastened to one another with a plurality of screws (not shown) extending from one to the other (some or all passing through holes in the peripheral edge of the polymer film) in a manner that securely clamps the polymer film therebetween.

As shown in FIG. 8 to FIG. 9 a tension ring is provided that abuts the polymer film and stretches the film to tension, stabilize or rigidify the film. The tension ring may be provided as a pre-set member, or may be an adjustable member. Adjustment may be achieved by providing a spring plate facing the tension ring, with one or more compressible elements such as polymer cushions or springs (e.g., flat springs, coil springs, wave springs etc.) therebetween, and with adjustable fasteners such as screw fasteners or the like passing from the spring plate through (or around) the tension ring to the film base.

Polymer films are preferably fluoropolymer films, such as an amorphous thermoplastic fluoropolymer, in a thickness of 0.01 or 0.05 millimeters to 0.1 or 1 millimeters, or more. In some embodiments we use Biogeneral Teflon AF 2400 polymer film, which is 0.0035 inches (0.09 millimeters) thick, and Random Technologies Teflon AF 2400 polymer film, which is 0.004 inches (0.1 millimeters) thick.

Tension on the film is preferably adjusted with the tension ring to about 10 to 100 pounds, depending on operating conditions such as fabrication speed.

The vat ring, film base, tension ring, and tension ring spring plate may be fabricated of any suitable, preferably rigid, material, including metals (e.g., stainless steel, aluminum and aluminum alloys), carbon fiber, polymers, and composites thereof.

Registration posts and corresponding sockets may be provided in any of the vat ring, film base, tension ring and/or spring plate, as desired.

Example 2

Round Adjustable Tension Round Build Plate Assembly

FIG. 10 is a top view and FIG. 11 is an exploded view of a 2.88 inch diameter round build plate of the invention, where the film dimension may be 4 inches in diameter. Construction is in like manner to that given in Example 1 above, with a circumferential wave spring assembly shown in place. Tension on the film is preferably adjusted to a like tension as given in Example 1 above (again depending on other operating conditions such as fabrication speed).

FIG. 11 is an exploded view of the build plate of FIG. 10.

Example 3

Additional Embodiments of Adjustable Build Plates

Figure 12:
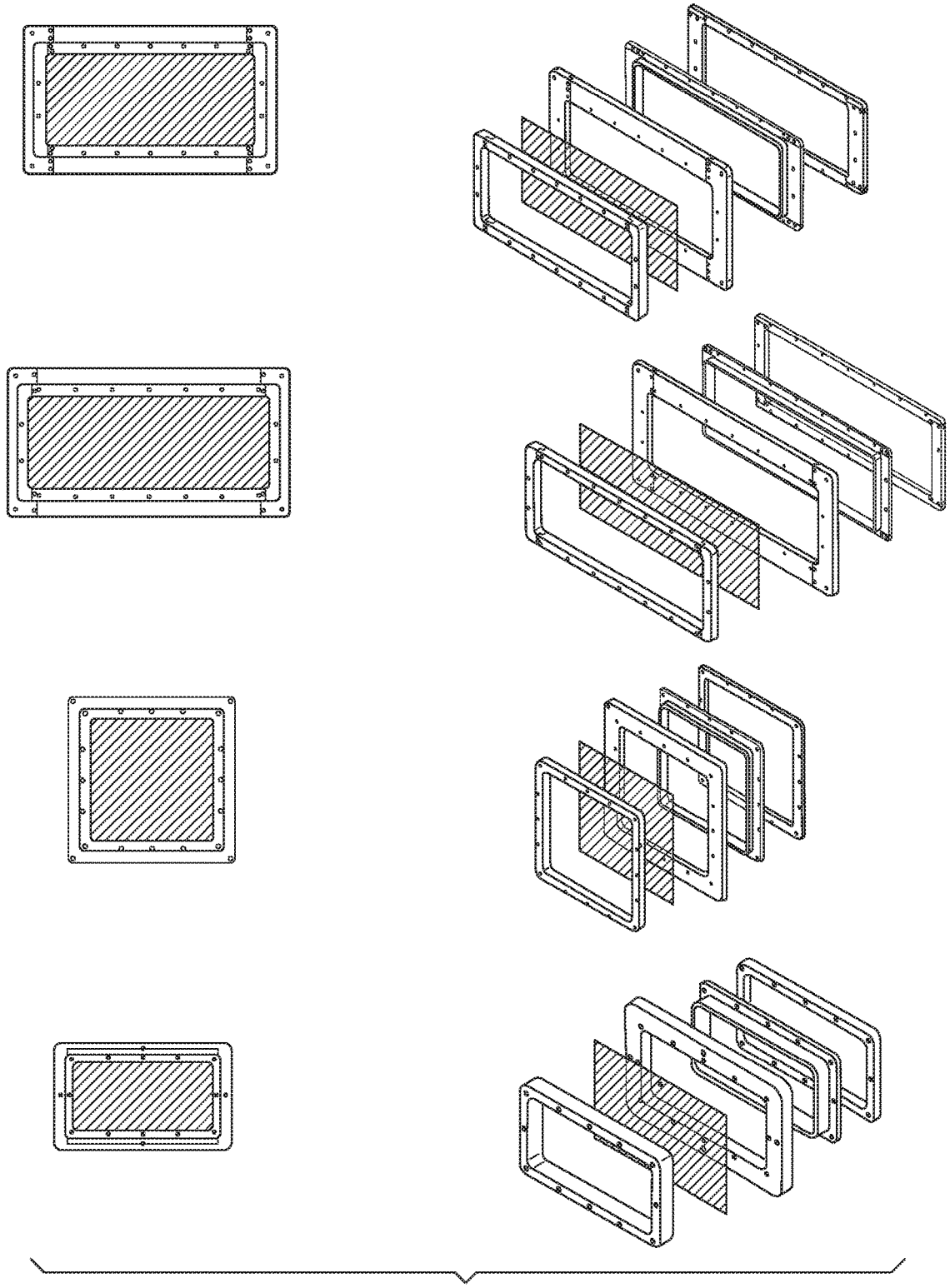
FIG. 12 shows various alternate embodiments of the build plates of FIG. 7-FIG. 11.

FIG. 12 shows various alternate embodiments of the build plates of FIG. 7 to FIG. 11. Materials and tensions may be in like manner as described above.

Example 4

Example Embodiment of an Apparatus

Figure 13:
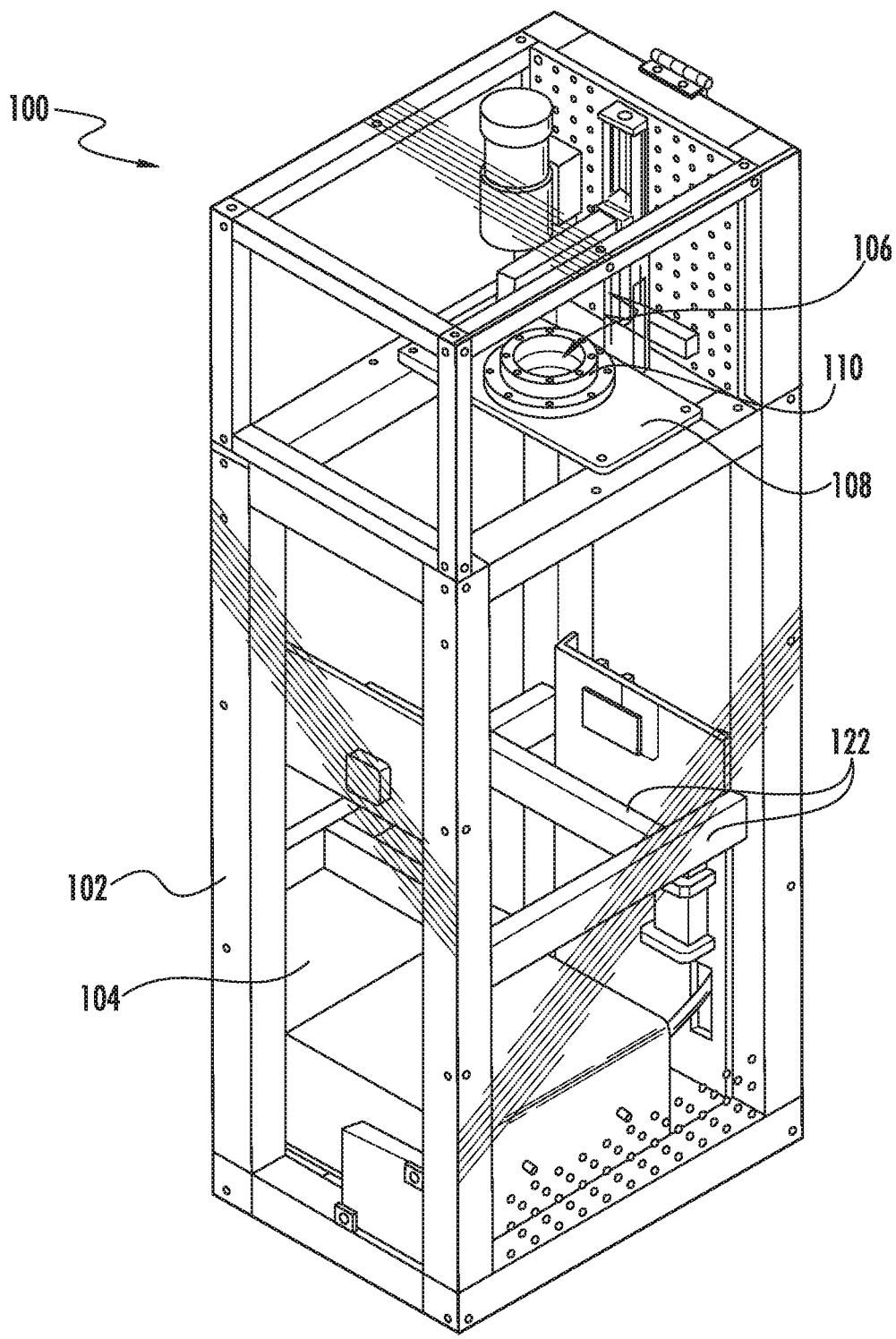
FIG. 13 is a front perspective view of an apparatus according to an exemplary embodiment of the invention.
Figure 14:
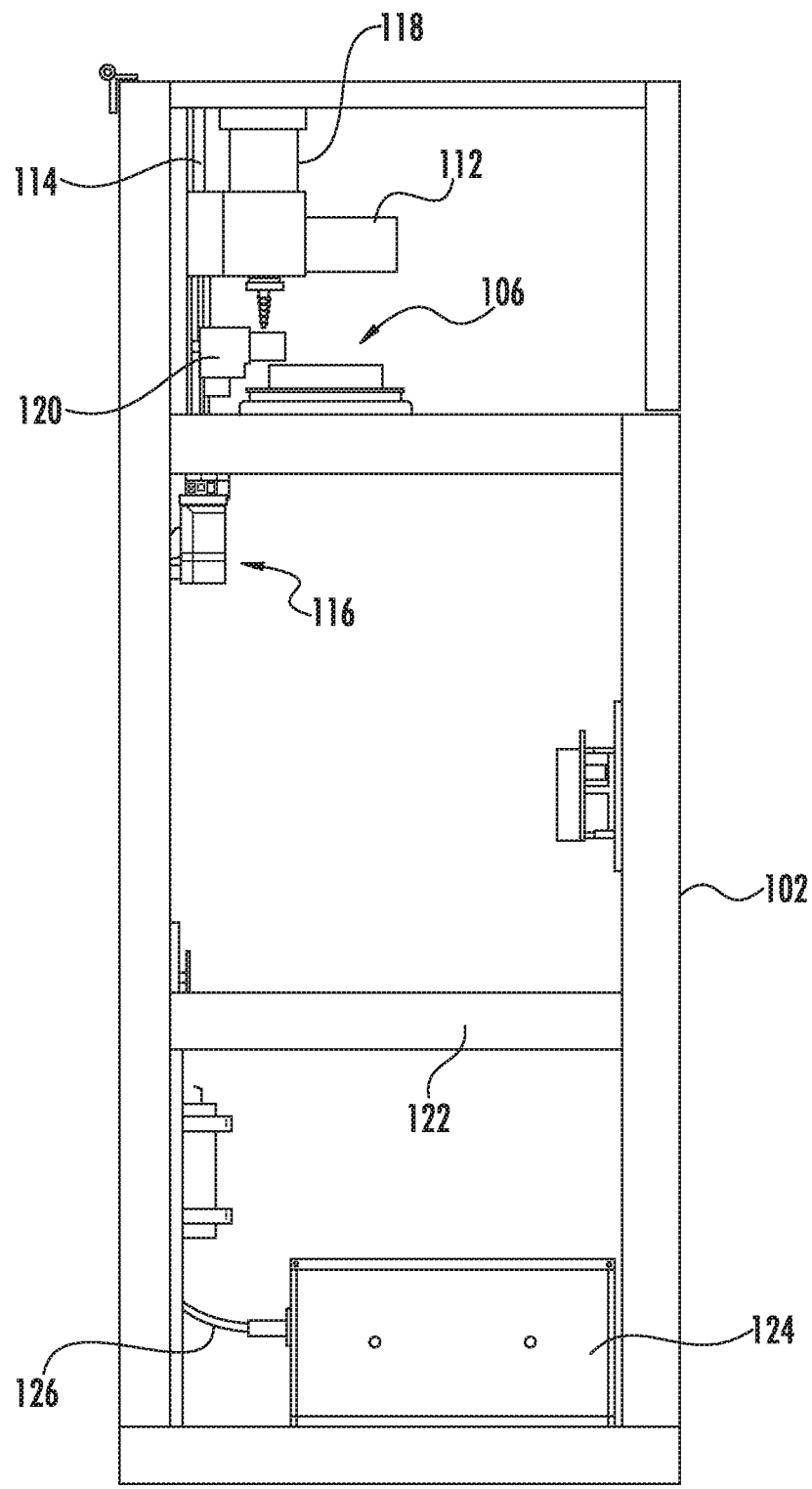
FIG. 14 is a side view of the apparatus of FIG. 13.
Figure 15:
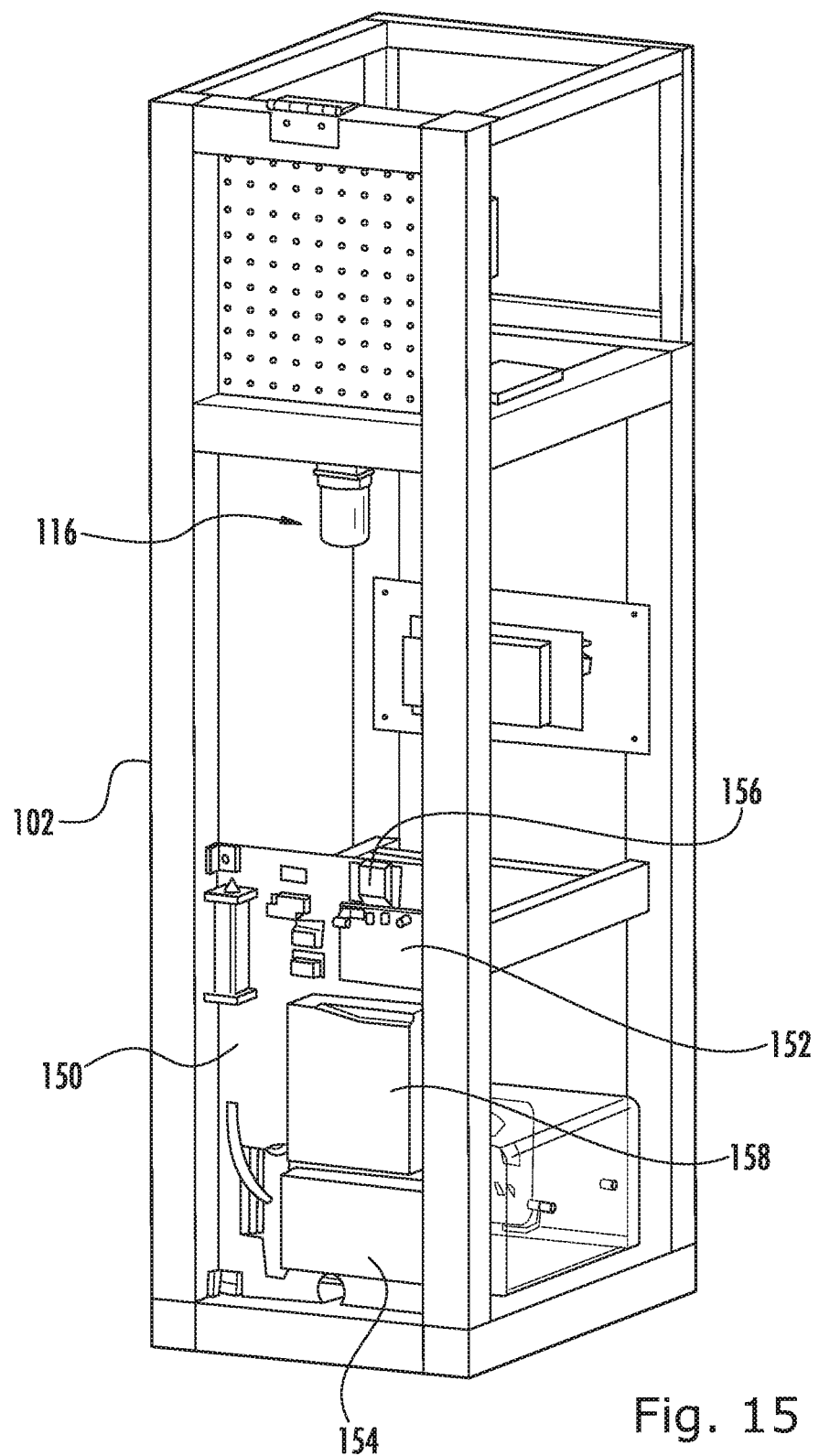
FIG. 15 is a rear perspective view of the apparatus of FIG. 13.

FIG. 13 is a front perspective view, FIG. 14 is a side view and FIG. 15 is a rear perspective view of an apparatus 100 according to an exemplary embodiment of the invention. The apparatus 100 includes a frame 102 and an enclosure 104. Much of the enclosure 104 is removed or shown transparent in FIG. 13-FIG. 15.

The apparatus 100 includes several of the same or similar components and features as the apparatus described above in reference to FIG. 3. Referring to FIG. 13, a build chamber 106 is provided on a base plate 108 that is connected to the frame 102. The build chamber 106 is defined by a wall or vat ring 110 and a build plate or "window" such as one of the windows described above in reference to FIG. 3 and FIG. 7-FIG. 12.

Turning to FIG. 14, a carrier 112 is driven in a vertical direction along a rail 114 by a motor 116. The motor may be any suitable type of motor, such as a servo motor. An exemplary suitable motor is the NXM45A motor available from Oriental Motor of Tokyo, Japan.

A liquid reservoir 118 is in fluid communication with the build chamber 106 to replenish the build chamber 106 with liquid resin. For example, tubing may run from the liquid reservoir 118 to the build chamber 106. A valve 120 controls the flow of liquid resin from the liquid reservoir 118 to the build chamber 106. An exemplary suitable valve is a pinch-style aluminum solenoid valve for tubing available from McMaster-Carr of Atlanta, Ga.

The frame 102 includes rails 122 or other some other mounting feature on which a light engine assembly 130 (FIG. 16) is held or mounted. A light source 124 is coupled to the light engine assembly 130 using a light guide entrance cable 126. The light source 124 may be any suitable light source such as a BlueWave® 200 system available from Dymax Corporation of Torrington, Conn.

Figure 16:
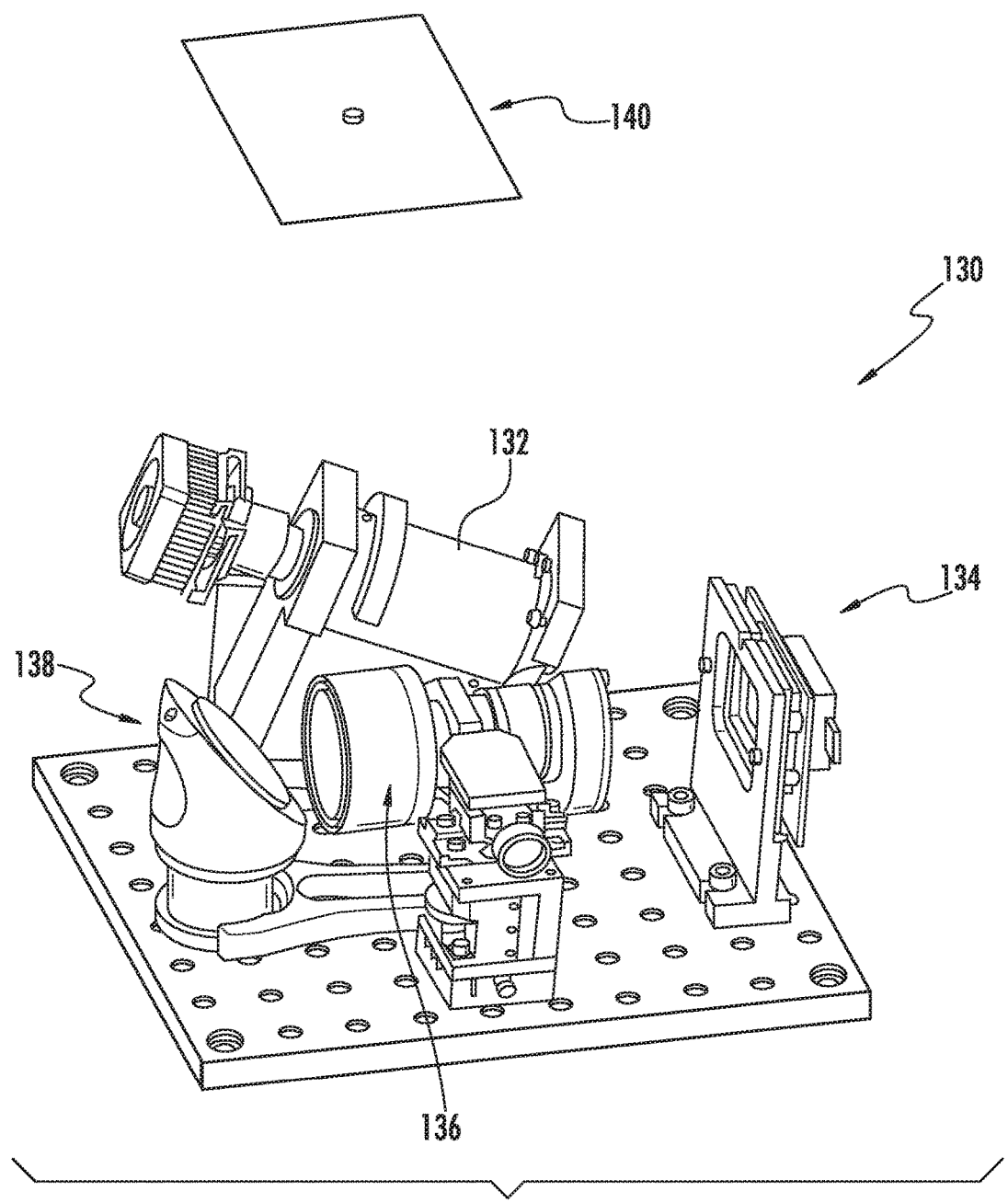
FIG. 16 is a perspective view of a light engine assembly used with the apparatus of FIG. 13.

Turning to FIG. 16, the light engine or light engine assembly 130 includes condenser lens assembly 132 and a digital light processing (DLP) system including a digital micromirror device (DMD) 134 and an optical or projection lens assembly 136 (which may include an objective lens). A suitable DLP system is the DLP Discovery™ 4100 system available from Texas Instruments, Inc. of Dallas, Tex. Light from the DLP system is reflected off a mirror 138 and illuminates the build chamber 106. Specifically, an "image" 140 is projected at the build surface or window.

Referring to FIG. 15, an electronic component plate or breadboard 150 is connected to the frame 102. A plurality of electrical or electronic components are mounted on the breadboard 150. A controller or processor 152 is operatively associated with various components such as the motor 116, the valve 120, the light source 124 and the light engine assembly 130 described above. A suitable controller is the Propeller Proto Board available from Parallax, Inc. of Rocklin, Calif.

Other electrical or electronic components operatively associated with the controller 152 include a power supply 154 and a motor driver 158 for controlling the motor 116. In some embodiments, an LED light source controlled by pulse width modulation (PWM) driver 156 is used instead of a mercury lamp (e.g., the Dymax light source described above).

A suitable power supply is a 24 Volt, 2.5 A, 60 W, switching power supply (e.g., part number PS1-60W-24 (HF60W-SL-24) available from Marlin P. Jones & Assoc, Inc. of Lake Park, Fla.). If an LED light source is used, a suitable LED driver is a 24 Volt, 1.4 A LED driver (e.g., part number 788-1041-ND available from Digi-Key of Thief River Falls, Minn.). A suitable motor driver is the NXD20-A motor driver available from Oriental Motor of Tokyo, Japan.

The apparatus of FIG. 13-FIG. 16 has been used to produce an "image size" of about 75 mm by 100 mm with light intensity of about 5 mW/cm$^2$. The apparatus of FIG. 13-FIG. 16 has been used to build objects at speeds of about 100 to 500 mm/hr. The build speed is dependent on light intensity and the geometry of the object.

Example 5

Another Example Embodiment of an Apparatus

Figure 17:
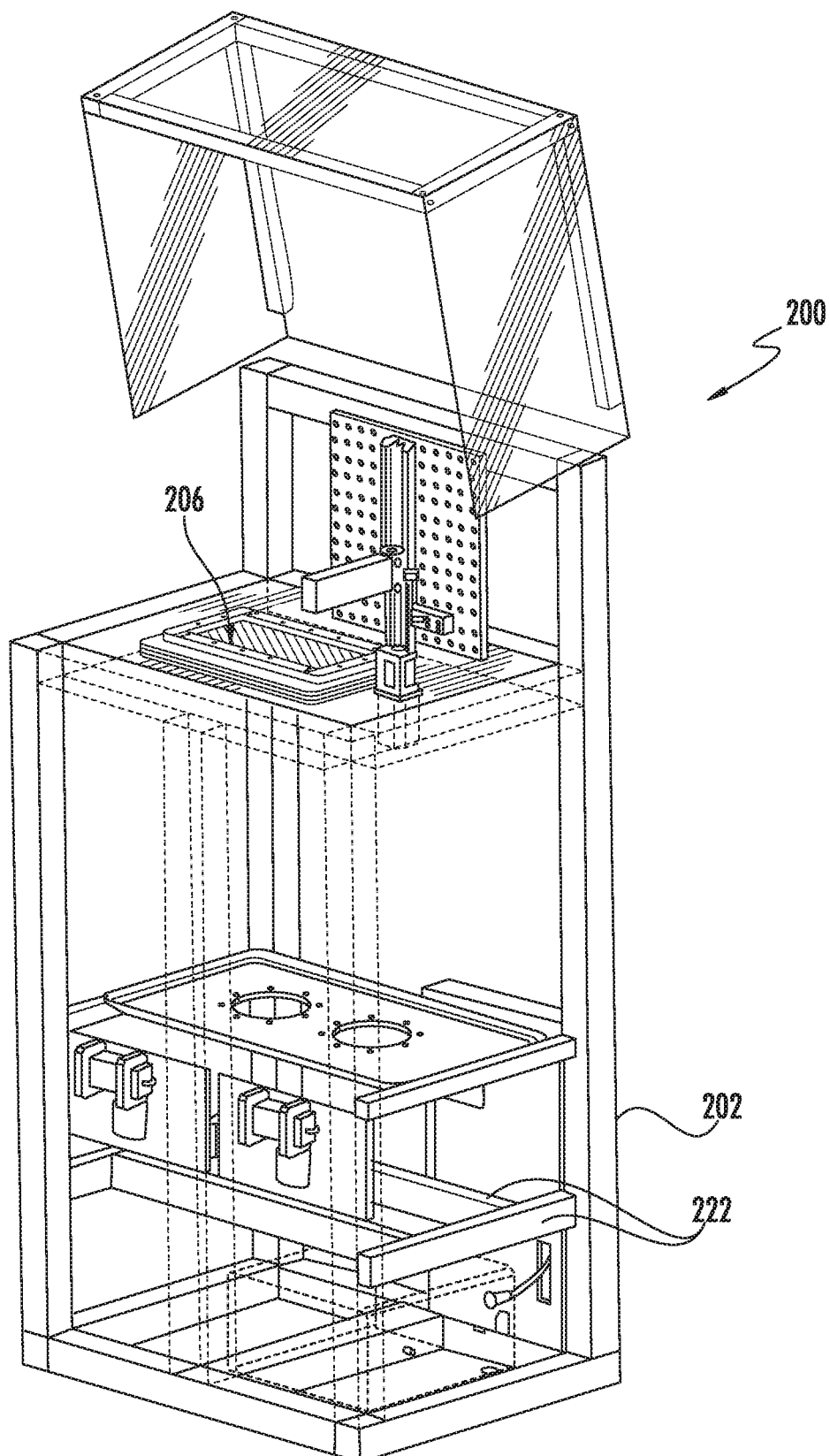
FIG. 17 is a front perspective view of an apparatus according to another exemplary embodiment of the invention.

FIG. 17 is a front perspective view of an apparatus 200 according to another exemplary embodiment of the invention. The apparatus 200 includes the same components and features of the apparatus 100 with the following differences.

The apparatus 200 includes a frame 202 including rails 222 or other mounting feature at which two of the light engine assemblies 130 shown in FIG. 16 may be mounted in a side-by-side relationship. The light engine assemblies 130 are configured to provide a pair of "tiled" images at the build station 206. The use of multiple light engines to provide tiled images is described in more detail above.

The apparatus of FIG. 17 has been used to provide a tiled "image size" of about 150 mm by 200 mm with light intensity of about 1 mW/cm$^2$. The apparatus of FIG. 17 has been used to build objects at speeds of about 50 to 100 mm/hr. The build speed is dependent on light intensity and the geometry of the object.

Example 6

Another Example Embodiment of an Apparatus

Figure 19:
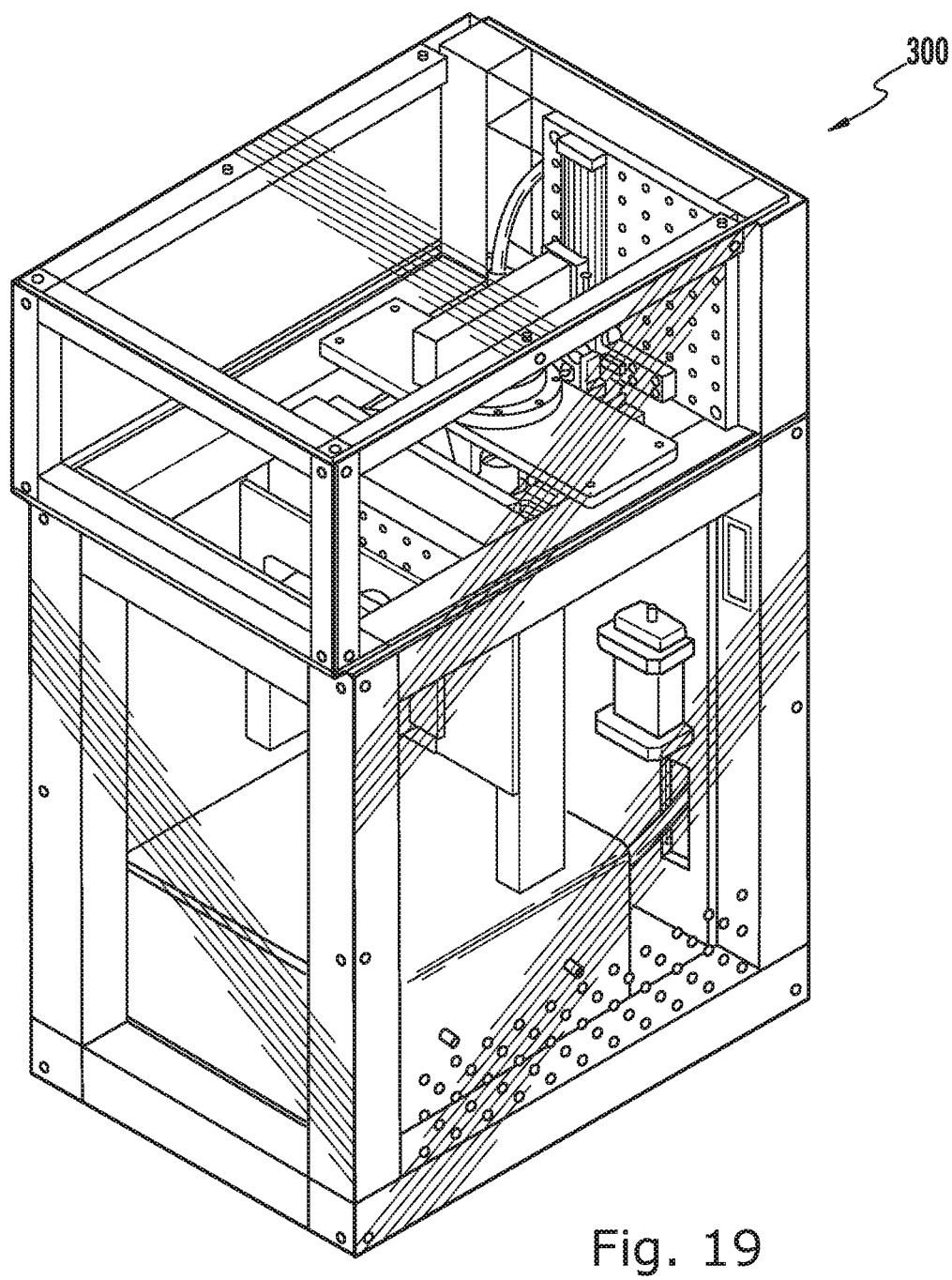
FIG. 19 is a front perspective view of an apparatus according to another exemplary embodiment of the invention.
Figure 20:
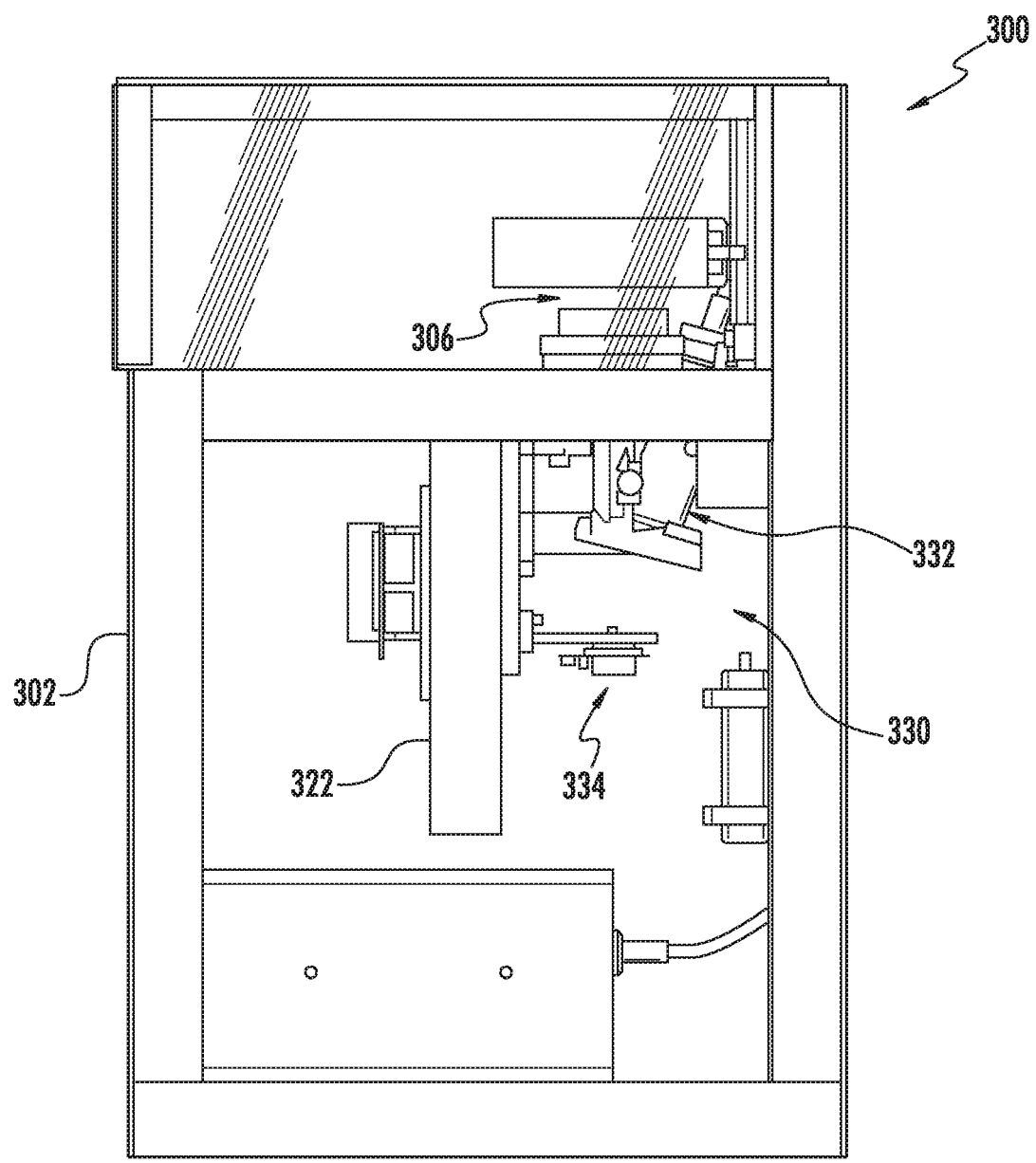
FIG. 20 is a side view of the apparatus of FIG. 19.

FIG. 19 is a front perspective view and FIG. 20 is a side view of an apparatus 300 according to another exemplary embodiment of the invention. The apparatus 300 includes the same components and features of the apparatus 100 with the following differences.

Figure 21:
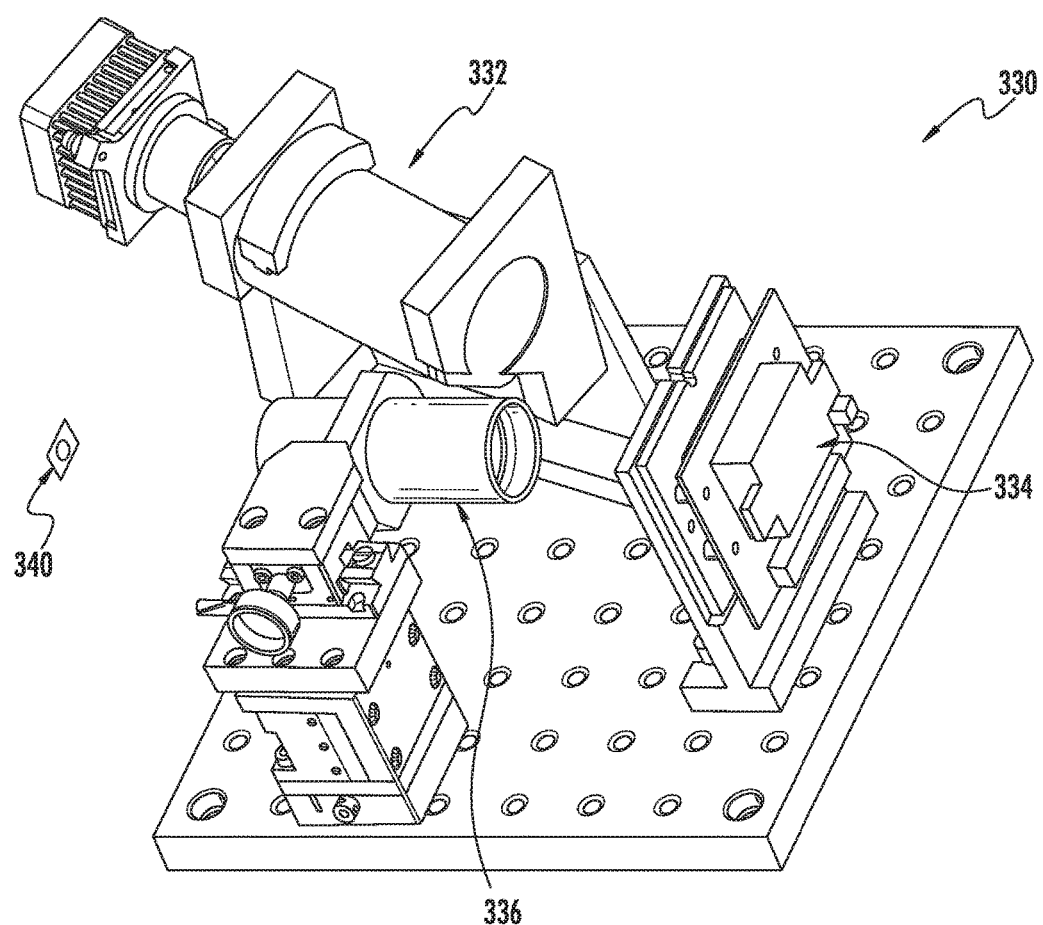
FIG. 21 is a perspective view of a light engine assembly used with the apparatus of FIG. 19.

The apparatus 300 includes a frame 302 including rails 322 or other mounting feature at which a light engine assembly 330 shown in FIG. 21 may be mounted in a different orientation than the light assembly 130 of the apparatus 100. Referring to FIGS. 20 and 21, the light engine assembly 330 includes a condenser lens assembly 332 and a digital light processing (DLP) system including a digital micromirror device (DMD) 334 and an optical or projection lens assembly 336 (which may include an objective lens). A suitable DLP system is the DLP Discovery™ 4100 system available from Texas Instruments, Inc. of Dallas, Tex. Light from the DLP system illuminates the build chamber 306. Specifically, an "image" 340 is projected at the build surface or window. In contrast to the apparatus 100, a reflective mirror is not used with the apparatus 300.

The apparatus of FIGS. 19-21 has been used to provide "image sizes" of about 10.5 mm by 14 mm and about 24 mm by 32 mm with light intensity of about 200 mW/cm$^2$ and 40 mW/cm$^2$ The apparatus of FIGS. 19-21 has been used to build objects at speeds of about 10,000 and 4,000 mm/hr. The build speed is dependent on light intensity and the geometry of the object.

Example 7

Control Program with Lua Scripting

Current printer technology requires low level control in order to ensure quality part fabrication. Physical parameters such as light intensity, exposure time and the motion of the carrier should all be optimized to ensure the quality of a part. Utilizing a scripting interface to a controller such as the Parallax PROPELLER™ microcontroller using the programming language "Lua" provides the user with control over all aspects of the printer on a low level. See generally R. Ierusalimschy, *Programming in Lua* (2013) (ISBN-10: 859037985X; ISBN-13: 978-8590379850).

This Example illustrates the control of a method and apparatus of the invention with an example program written utilizing Lua scripting. Program code corresponding to such instructions, or variations thereof that will be apparent to those skilled in the art, is written in accordance with known techniques based upon the particular microcontroller used.

Concepts.

A part consists of slices of polymer which are formed continuously. The shape of each slice is defined by the frame that is being displayed by the light engine.

Frame.

The frame represents the final output for a slice. The frame is what manifests as the physical geometry of the part. The data in the frame is what is projected by the printer to cure the polymer.

Slice.

All the 2D geometry that will be outputted to a frame should be combined in a Slice. Slices can consist of procedural geometry, Slices of a 3D model or any combination of the two. The slice generating process allows the user to have direct control over the composition of any frame.

Slice of a 3D Model.

A slice is a special type of 2D geometry derived from a 3D model of a part. It represents the geometry that intersects a plane that is parallel to the window. Parts are usually constructed by taking 3D models and slicing them at very small intervals. Each slice is then interpreted in succession by the printer and used to cure the polymer at the proper height.

Procedural Geometry.

Procedurally generated geometry can also be added to a slice. This is accomplished by invoking shape generation functions, such as "addcircle", "addrectangle", and others. Each function allows projection of the corresponding shape onto the printing window. A produced part appears as a vertically extruded shape or combination of shapes.

Coordinate Spaces: Stage.

The coordinate system that the stage uses is usually calibrated such that the origin is 1-20 microns above the window.

Coordinate Spaces: Slice.

Coordinate system of the projected slice is such that origin is located at the center of the print window.

Quick Start.

The following is the most basic method of printing a part from a sliced 3D model. Printing a sliced model consists of 4 main parts: Loading the data, preparing the printer, printing, and shutdown.

Loading Data.

In this section of the code the sliced model data is loaded into memory. The file path to the model is defined in the Constants section of the code. See the full code below for details.

```
--Loading Model
modelFilePath = "Chess King.svg"
numSlices = loadslices(modelFilePath)
```

Preparing the printer it is important to do two things before printing. You must first turn on the light engine with the relay function, and if applicable, the desired fluid height should be set.

```
--Prepare Printer
relay(true)--turn light on
showframe(-1) --ensure nothing is
exposed durring setup
setlevels(.55, .6)--if available, printer set
fluid pump to maintain about 55% fill
```

Printing.

The first step of the printing process is to calibrate the system and set the stage to its starting position by calling gotostart. Next we begin a for loop in which we print each slice. The first line of the for loop uses the infoline command to display the current slice index in the sidebar. Next we determine the height at which the next slice should be cured. That value is stored to nextHeight. Following this we move the stage to the height at which the next slice needs to be cured. To ensure a clean print it can sometimes be necessary to wait for oxygen to diffuse into the resin. Therefore we call sleep for a half second (the exact time for preExposureTime is defined in the constants section as well). After this it's time to actually cure the resin so we call showframe and pass it the index of the slice we want to print, which is stored in sliceIndex by the for loop. We sleep again after this for exposureTime seconds in order to let the resin cure. Before moving on to the next frame, we call showframe(−1) in order to prevent the light engine from curing any resin while the stage is moving to the next height.

```
--Execute Print
gotostart( )--move stage to starting position
for sliceIndex =0,numSlices-1 do
   infoline(5, string.format("Current Slice: %d",
   sliceIndex))
   nextHeight = sliceheight(sliceIndex)--calculate
   the height that the stage should be at to
   expose this frame
   moveto(nextHeight, stageSpeed)--
   move to nextHeight
   sleep(preExposureTime)--wait a given
   amount of time for oxygen to diffuse into resin,
   prepExposureTime is predefined in the
   Constants section
   showframe(sliceIndex)--show
   frame to expose
   sleep(exposureTime)--wait while
   frame exposes, exposureTime is
   predefined in the
   Constants section
   showframe(-1)-- show nothing to ensure
   no exposure while stage is moving
   to next position
end
```

Shutdown.

The final step in the printing process is to shut down the printer. Call relay(false) to turn the light engine off. If you are using fluid control, call setlevels(0,0) to ensure the valve is shut off. Finally it is a good idea to move the stage up a bit after printing to allow for easy removal of the part.

```
--Shutdown
relay(false)
setlevels(0,0)
--Lift stage to remove part
moveby(25, 16000)
```

Fully completed code implementing instructions based on the above is set forth below.

```
--Constants
exposureTime = 1.5-- in seconds
preExposureTime = 0.5 -- in seconds
stageSpeed = 300 --in mm/hour
--Loading Model
modelFilePath = "Chess King.svg"
numSlices = loadslices(modelFilePath)
--calculating parameters
maxPrintHeight = sliceheight(numSlices-1)--
find the highest point in the print, this is the same
as the height of the last slice. Slices are 0 indexed,
hence the −1.
infoline(1, "Current Print Info:")
infoline(2, string.format("Calculated Max Print
Height: %dmm", maxPrintHeight))
infoline(3, string.format("Calculated Est. Time:
%dmin", (maxPrintHeight/stageSpeed)*60 +
(preExposureTime+exposureTime)* numSlices/60))
infoline(4, string.format("Number of Slices: %d",
numSlices))
--Prepare Printer
relay(true)--turn light on
showframe(-1) --ensure nothing is
exposed durring setup
setlevels(.55, .6)--if available, printer set
fluid pump to maintain about 55% fill
--Execute Print
gotostart( )--move stage to starting position
for sliceIndex =0,numSlices-1 do
   infoline(5, string.format("Current Slice:
   %d", sliceIndex))
   nextHeight = sliceheight(sliceIndex)--calculate
   the height that the stage should
   be at to expose this frame
   moveto(nextHeight, stageSpeed)--move to nextHeight
   sleep(preExposureTime)--wait a given amount of
   time for oxygen to diffuse into
   resin, prepExposureTime is predefined
   in the Constants section
   showframe(sliceIndex)--show frame to expose
   sleep(exposureTime)--wait while frame exposes,
   exposureTime is predefined in
   the Constants section
   showframe(-1)-- show nothing to ensure no
   exposure while stage is moving to next
   position
end
--Shutdown
relay(false)
```

```
setlevels(0,0)
--Lift stage to remove part
moveby(25, 16000)
```

Gotostart.

The main purpose of gotostart is to calibrate the stage. This function resets the coordinate system to have the origin at the lowest point, where the limit switch is activated. Calling this command will move the stage down until the limit switch in the printer is activated; this should occur when the stage is at the absolute minimum height.

```
gotostart( ) moves stage to start at the maximum speed which varies from printer to printer.
gotostart( )--moving to origin at default speed
gotostart(number speed) moves stage to start at speed given in millimeters/hour.
gotostart(15000)--moving stage to origin at 15000mm/hr
-speed: speed, in mm/hour, at which the stage will move to the start position.
MOVETO
      moveto allows the user to direct the stage to a desired height at a given speed.
      Safe upper
and lower limits to speed and acceleration are ensured internally.
moveto(number targetHeight, number speed)
moveto(25, 15000)--moving to 25mm at 15,000mm/hr
moveto(number targetHeight, number speed, number acceleration)
This version of the function allows an acceleration to be defined as well as speed. The stage
starts moving at initial speed and then increases by acceleration.
moveto(25, 20000, 1e7)--moving the stage to 25mm at 20,000mm/hr while accelerating at 1
million mm/hr^2
moveto(number targetHeight, number speed, table con trolPoints, function callback)
This function behaves similar to the basic version of the function. It starts at its initial
speed and
position and moves to the highest point on the control point table. callback is called when
the stage passes each control point.
        function myCallbackFunction(index)--defining the callback function
        print("hello")
        end
        moveto(25, 20000, slicecontrolpoints( ), myCallbackFunction)--moving
        the stage to 25mm at 20,000mm/hr while calling myCallbackFunction
        at the control points generated by slicecontrolpoints( )
moveto(number targetHeight, number speed, number acceleration, table controlPoints,
      function callback) This function is the same as above except the user can pass an
      acceleration. The stage accelerates from its initial position continuously until it
      reaches the last control point.
      function myCallbackFunction(index)--defining the callback function
      print("hello")
      end
      moveto(25, 20000, 0.5e7, slicecontrolpoints( ), myCallbackFunction)--moving
        the stage to 25mm at 20,000mm/hr while accelerating at 0.5 million
        mm/hr^2 and also calling myCallbackFunction at the control points
        generated by slicecontrolpoints( )
      -targetHeight: height, in mm from the origin, that the stage will move to.
      -initialSpeed: initial speed, in mm/hour, that the stage will start moving at.
      -acceleration: rate, in mm/hour^2, that the speed of the stage will increase from
      initial speed.
      -controlPoints: a table of target heights in millimeters. After the stage reaches a
      target height, it calls the function callback.
      -callback: pointer to a function that will be called when the stage reaches a
      control point. The callback function should take one argument which is the
      index of the control point the stage has reached.
moveby
      moveby allows the user to change the height of the stage by a desired amount
      at a given
speed. Safe upper and lower limits to speed and acceleration are ensured internally.
    moveby(number dHeight, number initalSpeed)
      1 moveby(-2,15000)--moving down 2mm at 15,000mm/hr
    moveby(number dHeight, number initialSpeed, number acceleration)
      This version of the function allows an acceleration to be defined as well as
      speed. The stage starts moving at initial speed and then increases by
      acceleration until it reaches its destination.
      1 moveby(25,15000, 1e7)--moving up 25mm at 15,000mm/hr while accelerating
      1e7mm/hr^2
    moveby(number dHeight, number initialSpeed, table controlPoints, function callback)
      This function usage allows the user to pass the function a table of absolute
      height coordinates. After the stage reaches one of these target heights, it calls the
      function 'callback.' Callback should take one argument which is the index of the
      control point it has reached.
        function myCallbackFunction(index)--defining the callback function
            print("hello")
        end
moveby(25, 20000, slicecontrolpoints( ), myCallbackFunction)--moving the stage
up 25mm at 20,000mm/hr while calling myCallbackFunction at the control points
generated by slicecontrolpoints( )
   moveby(number dHeight, number initialSpeed, number acceleration, table controlPoints,
      function callback) This function is the same as above except the user can pass an
```

-continued

```
acceleration. The stage accelerates from its initial position continuously until it reaches
the last control point.
        function myCallbackFunction(index)--defining the callback function
        print("hello")
        end
    moveby(25, 20000, 1e7,slicecontrolpoints( ), myCallbackFunction)--moving the stage
up 25mm at 20,000mm/hr while calling myCallbackFunction at the control points generated by
slicecontrolpoints( ) and accelerating at 1e7mm/hr^2
        -dHeight: desired change in height, in millimeters, of the stage.
        -initialSpeed: initial speed, in mm/hour, at which the stage moves.
        -acceleration: rate, in mm/hour², that the speed of the stage will increase from
        initial speed.
        -controlPoints: a table of target heights in millimeters. After the stage reaches a
        target height, it calls the function callback.
        -callback: pointer to a function that will be called when the stage reaches a
        control point. The callback function should take one argument which is the
        index of the control point the stage has reached.
```

Light Engine Control

Light relay is used to turn the light engine on or off in the printer. The light engine must be on in order to print. Make sure the relay is set to off at the end of the script.

```
            relay(boolean lightOn)
            relay(true)--turning light on
                -lightOn: false turns the light engine
                off, true turns the light engine on.
```

Adding Procedural Geometry

Functions in this section exist to project shapes without using a sliced part file. Every function in this section has an optional number value called figureIndex. Each figure in a slice has its own index. The figures reside one on top of another. Figures are drawn so that the figure with the highest index is 'on top' and will therefore not be occluded by anything below it. By default indexes are assigned in the order that they are created so the last figure created will be rendered on top. One can, however, change the index by passing the desired index into figureIndex.

Every function in this section requires a sliceIndex argument. This value is the index of the slice that the figure will be added to.

Note that generating this procedural geometry does not guarantee that it will be visible or printable. One must use one of the functions such as fillmask or linemask outlined below.

```
addcircle
        addcircle(number x, number y, number radius, number sliceIndex) addcircle draws a
circle in the specified slice slice.
addCircle(0,0, 5, 0)--creating a circle at the origin of the first slice with a radius of 5mm
        -x: is the horizontal distance, in millimeters, from the center of the circle to the origin.
        -y: is the vertical distance, in millimeters, from the center of the circle to the origin.
        -radius: is the radius of the circle measured in millimeters.
        -sliceIndex: index of the slice to which the figure will be added.
        Returns: figure index of the figure.
addrectangle
        addrectangle(number x, number y, number width, number height number sliceIndex)
            addrectangle draws a rectangle in the specified slice.
addrectangle(0,0, 5,5, 0)--creating a 5mm x 5mm square with its top left corner at the
origin.
        -x: horizontal coordinate, in millimeters, of the top left corner of the rectangle.
        -y: vertical coordinate, in millimeters, of the top left corner of the rectangle.
        -width: width of the rectangle in millimeters.
        -height: height of the rectangle in millimeters.
        -sliceIndex: index of the slice to which the figure will be added.
        Returns: figure index of the figure.
addline
        addline(number x0, number y0, number x1, number y1, number sliceIndex) addline draws
            a line segment.
addLine(0,0, 20,20, 0)--creating a line from the origin to 20mm along the x and y axis on the
first slice.
        -x0: horizontal coordinate of the first point in the segment, measured in millimeters.
        -y0: vertical coordinate of the first point in the segment, measured in millimeters.
        -x1: horizontal coordinate of the second point in the segment, measured in millimeters.
        -y2: vertical coordinate of the second point in the segment, measured in millimeters.
        -sliceIndex: index of the slice to which the figure will be added. Returns: figure
            index of
the figure.
addtext
        text(number x, number y, number scale, string text, number sliceIndex) addtext
draws text on the specified slice starting at position 'x, y' with letters of size 'scale'.
addtext(0,0, 20, "Hello world", 0)--writing Hello World at the origin of the first slice
        -x: horizontal coordinate, measured in millimeters, of the top left corner of the
        bounding box around the text.
```

-continued

-y: vertical coordinate, measured in millimeters, of the top left corner of the
    bounding box around the text.
    -scale: letter size in millimeters, interpretation may vary depending on the
    underlying operating system (Windows, OSX, Linux, etc).
    -text: the actual text that will be drawn on the slice.
    -sliceIndex: index of the slice to which the figure
    will be added. Returns: figure index of the
    figure.

FILL AND LINE CONTROL fillmask
    fillmask(number color, number sliceIndex, number figureIndex) fillmask is used to
    control how the procedural geometry is drawn. fillmask tells the figure in
    question to fill the entirety of its interior with color.
    -color: can be any number on the range 0 to 255. Where 0 is black and 255 is
    white, any value in between is a shade of grey interpolated linearly between
    black and white based on the color value. Any value less than 0 will produce a
    transparent color.
    myCircle = addCircle(0,0,5,0)--creating the circle to fill
    fillmask(255, 0, myCircle)--Creating a white filled circle
    -sliceIndex:the index of the slice that should be modified.
    -figureIndex:the is used to deteimine which figure on the slice should be filled.
    Each figure has its own unique index. If no figureIndex is passed, the fill applies
    to all figures in the slice.

linemask
    linemask(number color, number sliceIndex, number figureIndex) linemask is used
    to control how the procedural geometry is drawn. linemask tells a figure to
    draw its outline in a specific color. The width of the outline is defined by the
    function linewidth.
    myCircle = addCircle(0,0,20,0)--creating the circle to fill
    linemask(255, 0, myCircle)--setting the outline of the circle to be white
    fillmask(150,0, myCircle)--setting the fill of the circle to be grey
    -color: can be any number on the range 0 to 255. Where 0 is black and 255 is
    white, any value in between is a shade of grey interpolated linearly between
    black and white based on the color value. Any value less than 0 will produce a
    transparent color.
    -sliceIndex: the index of the slice that should be modified.
    -figureIndex: is used to determine which figure on the slice should be filled.
    Each figure has its own unique index. If no figureIndex is passed, the fill applies
    to all figures in the slice.

linewidth
    linewidth(number width, number sliceIndex, number figureIndex)
        linewidth is used to set the width of the line that linemask will
        use to outline the figure.
linewidth(2,0)--setting the line width for every figure on the first slice to 2mm
        -sliceIndex: the index of the slice that should be modified.
        -figureIndex: is used to detefinine which figure on the slice should have its
        outline changed. Each figure has its own unique index, see section 2.3 (Pg. 10)
        for more details. If no figureIndex is passed, the fill applies to all figures in the
        slice.

loadmask
    loadmask(string filepath) loadmask allows for advanced fill control. It enables the
    user to load a texture from a bitmap file and use it to fill the entirety of a figure
    with the texture.
    texture = loadmask("voronoi_noise.png")--loading texture. voronoi_noise.png
    is in the
    same directory as the script.
    myCircle = addCircle(0,0,20,0)--creating the circle to fill
    fillmask(texture, 0, myCircle)--filling the circle with voronoi noise
    -filepath: file path to image file
    Returns: a special data type which can be passed into a fillmask or linemask
    function as the color argument.

FRAMES showframe
    showframe(number sliceIndex) showframe is essential to the printing process. This
    function sends the data from a slice to the printer. Call showframes on a frame
    that doesn't exist to render a black frame e.g., showframe(-1).
showframe(2)--showing the 3rd slice
        -sliceIndex: the index of the slice to send to the printer.

framegradient
    framegradient(number slope) framegradient is
        designed to compensate for differences in light
        intensity.

calcframe
    calcframe( )
        calcframe is designed to analyze the construction of a slice calculates the last
        frame shown.
        showframe(0)
        calcframe( )

Returns: the maximum possible distance between any point in the figure and the edge.

2.5.4 loadframe loadframe(string filepath)

loadframe is used to load a single slice from a supported bitmap file.

loadframe("slice.png")--slice.png is in the same directory as the script

-filepath: file path to slice image.

SLICES addslice addslice(number sliceHeight) addslice creates a new slice at a given height at the end of the slice stack.

addslice(.05)--adding a slice at .05mm addslice(number sliceHeight, number sliceIndex)

addslice(.05, 2)--adding a slice at .05mm and at index 2. this pushes all layers 2 and higher up an index.

addslice creates a new slice at a given height and slice index.

-sliceHeight: height, in millimeters, of the slice.

-sliceIndex: index at which the slice should be added. Returns: slice index.

loadslices loadslices(stringfilepath) loadslices is.

used to load all the slices from a 2D slice file.

loadslices("Chess King.svg")--loading all the slices from the Chess King.svg file -filepath: file path to the sliced model. Acceptable formats are .cli and .svg. Returns: number of slices.

sliceheight sliceheight(number sliceIndex) sliceheight is used to find the height of a slice in mm off the base.

addslice(.05,0)--setting the first slice to .05mm sliceheight(0)--checking the height of slice 0, in this example it should return .05

-sliceIndex: index of the slice to check. Returns: slice height in mm.2.6.4 slicecontrolpoints slicecontrolpoints( ) slicecontrolpoints is a helper function which creates a control point for each slice of a model. These control points can be passed to the moveto or moveby function to set it to callback when the stage reaches the height of each slice. Make sure loadslices has been called prior to calling this function.

loadslices("Chess King.svg")

controlPoints = slicecontrolpoints( )

Returns: Lua table of control points.

TIMING

Sleep sleep(number seconds) sleep allows the user to pause the execution of the program for a set number of seconds.

sleep(.5)--sleeping for a half second

-seconds: number of seconds to pause script execution.

Clock clock( ) clock returns the current time in seconds. It is accurate at least up to the millisecond and should therefore be used instead of Lua's built in clock functionality, clock should be used as a means to measure differences in time as the start time for the second count varies from system to system.

t1 = clock( )

loadslices("Chess King.svg")

deltaTime = clock( )-t1

Returns: system time in seconds.

Fluid Control

This set of functions can be used with printer models that support fluid control. Before the script finishes executing, setlevels(0,0) should be called to ensure that the pump stops pumping fluid into the vat.

getcurrentlevel getcurrentlevel( ) getcurrentlevel returns the percentage of the vat that is full.

print( string.format("Vat is %d percent full.", getcurrentlevel( )*100) )

Returns: a floating point number on the range 0 to 1 that represents the percentage of the vat that is full.

setlevels
  setlevels(number min, number max) setlevels allows the user to define how much fluid should be in the vat. The fluid height will be automatically regulated by a pump. The difference between min and max should be greater than 0.05 to ensure that the valve is not constantly opening and closing.
    setlevels(.7,.75)--keeping vat about 75 percent full
-min: the minim percentage of the vat that should be full. Entered as a floating point number from 0 to 1.
    -max: the max percentage of the vat that should be full. Entered as a floating point number from 0 to 1.

UserFeedback
  infoline
    infoline(int lineIndex, string text) infoline allows the user to display up to 5 lines of text in a constant position on the sidebar of the Programmable Printer Platform. This function is often used to allow the user to monitor several changing variables at once.
    infoline(1, string.format("Vat is %d percent full.", getcurrentlevel( )*100) )
      -lineIndex: the index of the line. Indexes should be in the range 1 to 5, 1 being the upper most line. -text: text to be displayed at line index.

Global Configuration Table.

Before a print script is executed, all global variables are loaded into a configuration table called cfg. Most of the data in this table has already been read by the Programmable Printer Platform by the time the users script executes, therefore, changing them will have no effect. However, writing to the xscale, yscale, zscale, xorig and yorig fields of the cfg, will effect all the loadslices and addlayer calls that are made afterwards. If the users script is designed to be run at a specific scale and/or position, it is good practice to override the cfg with the correct settings to ensure the scale and position can't be accidentally changed by the Programmable Printer Platform.

```
cfg.xscale = 3 --overriding global settings to
set scale on the x axis to 3
cfg.yscale = 2 --overriding global settings to
set scale on the y axis to 2
cfg.zscale = 1 --overriding global settings to
set scale on the z axis to 1
cfg.xorig = -2.0 --overriding global settings to
set the origin on the x axis 2mm left
cfg.yorig = 0.25 --overriding global settings to
set the origin on the y axis .25mm in the
positive direction
```

-continued

Fields in cfg:
-serial port: name of serial port (changing this variable wont effect code)
-xscale: x scale -yscale: y scale
-zscale: z scale
-xorig: x origin -yorig: y origin
-hw xscale: pixel resolution in x direction (changing this variable won't effect code)
-hw yscale: pixel resolution in y direction (changing this variable won't effect code)

Useful Lua Standard Libraries.

The math standard library contains several different functions that are useful in calculating geometry. The string object is most useful in printing for manipulating info strings. For details contact LabLua at Departamento de Informática, PUC-Rio, Rua Marquês de São Vicente, 225; 22451-900 Rio de Janeiro, RJ, Brazil Example 8

Lua Script Program for Continuous Print

This example shows a Lua script program corresponding to Example 7 above for continuous three dimension printing.

```
--Constants
sliceDepth = .05--in millimeters
exposureTime = .225-- in seconds
--Loading Model
modelFilePath = "Chess King.svg"
numSlices = loadslices(modelFilePath)
    controlPoints = slicecontrolpoints( )--Generate Control Points
    --calculating parameters
    exposureTime = exposureTime/(60*60)--converted to hours
    stageSpeed = sliceDepth/exposureTime--required distance/required time
    maxPrintHeight = sliceheight(numSlices-1)--find the highest point in the print, this
    is the same as the height of the last slice. Slices are 0 indexed, hence the -1.
    infoline(1, "Current Print Info:")
    infoline(2, string.format("Calulated Stage Speed: %dmm/hr\n", stageSpeed))
    infoline(3, string.format("Calculated Max Print Height: %dmm", maxPrintHeight))
    infoline(4, string.format("Calculated Est. Time: %dmin",
    (maxPrintHeight/stageSpeed)*60))
    --Create Callback Function for use with moveto
    function movetoCallback(controlPointIndex)
        showframe(controlPointIndex)
    end
```

```
--Prepare Printer
relay(true)--turn light on
setlevels(.55, .6)--if available, printer set fluid pump to maintain about 50% fill
--Execute Print
gotostart( )--move stage to starting position
moveto(maxPrintHeight, stageSpeed, control Points, movetoCallback)
--Shutdown
relay(false)
setlevels(0,0)
--Lift stage to remove part
moveby(25, 160000)
```

Example 9

Lua Script Program for Cylinder and Buckle

This example shows a Lua script program for two fitted parts that use procedural geometry.

Cylinder:

```
--Constants
exposureTime = 1.5-- in seconds
preExposureTime = 1 -- in seconds
stageSpeed = 300 --in mm/hour
sliceDepth = .05
numSlices = 700
--Generating Model
radius = 11
thickness = 4
smallCircleRad = 1.4
for sliceIndex = 0,numSlices-1 do
    addlayer(sliceDepth*(sliceIndex+1), sliceIndex)--the depth of a slice*its index =
        height of slice
    largeCircle = addcircle(0,0,radius, sliceIndex)
    linewidth(thickness, sliceIndex, largeCircle)
    linemask(255, sliceIndex, largeCircle)
    for i=0,2*math.pi, 2*math.pi/8 do
    addcircle(math.cos(i)*radius, math.sin(i)*radius, smallCircleRad, sliceIndex)
    end
    fillmask(0,sliceIndex)
end
    --calculating parameters
  maxPrintHeight = sliceheight(numSlices-1)--find the highest point in the print, this is the
    same as the height of the last slice. Slices are 0 indexed, hence the -1.
  infoline(1, "Current Print Info:")
  infoline(2, string.format("Calculated Max Print Height: %dmm", maxPrintHeight))
  infoline(3, string.format("Calculated Est. Time: %dmin", (maxPrintHeight/stageSpeed)*60 +
    (preExposureTime+exposureTime)* numSlices/60))
  infoline(4, string.format("Number of Slices: %d", numSlices))
--Prepare Printer
relay(true)--turn light on
showframe(-1) --ensure nothing is exposed durring setup
setlevels(.55, .6)--if available, printer set fluid pump to maintain about 55% fill
--Execute Print
gotostart( )--move stage to starting position
for sliceIndex =0,numSlices-1 do
        infoline(5, string.format("Current Slice: %d", sliceIndex))
        nextHeight = sliceheight(sliceIndex)--calculate the height that the stage
        should be at to expose this frame
        moveto(nextHeight, stageSpeed)--move to nextHeight
        sleep(preExposureTime)--wait a given amount of time for oxygen to diffuse into
        resin, prepExposureTime is predefined in the Constants section
        showframe(sliceIndex)--show frame to expose
        sleep(1.5)--wait while frame exposes, exposureTime is predefined in the Constants
        section
        showframe(-1)-- show nothing to ensure no exposure while stage is moving to next
        position
    end
    --Shutdown
    relay(false)
    setlevels(0,0)
    --Lift stage to remove part
    moveby(25, 160000)
```

-continued

Buckle:

```
--Constants
exposureTime = 1.5-- in seconds
preExposureTime = 0.5 -- in seconds
stageSpeed = 300 --in mm/hour
sliceDepth = .05
numSlices = 900
--Generating Model
baseRadius = 11
thickness = 3
innerCircleRad = 7.5
for sliceIndex = 0,numSlices-1 do
    addlayer(sliceDepth*(sliceIndex+1))--the depth of a slice*its index = height of
slice
        if(sliceindex < 100) then --base
            addcircle(0,0, baseRadius, sliceIndex)
            fillmask(255, sliceIndex)
        else -- inner circle
            innerCircle = addcircle(0,0, innerCircleRad, sliceIndex)
            linewidth(thickness, sliceIndex, innerCircle)
            linemask(255, sliceIndex, innerCircle)
        for i = 0,4*2*math.pi/8, 2*math.pi/8 do
                x = math.cos(i)*(innerCircleRad+thickness)
                y = math.sin(i)*(innerCircleRad+thickness)
                cutLine = addline(x,y, -x,-y, sliceIndex)
                linewidth(3, sliceIndex, cutLine)
                linemask(0, sliceIndex, cutLine)
        end
            if (sliceIndex > 800) then --tips
            r0 = innerCircleRad +2
            if(sliceIndex <850) then
    r0 = innerCircleRad + (sliceIndex-800)*(2/50)
            end
                for i = 0,4*2*math.pi/8, 2*math.pi/8 do
        ang = i + (2*math.pi/8)/2
        x = math.cos(ang)*(r0)
        y = math.sin(ang)*(r0)
        nubLine = addline(x,y, -x,-y, sliceIndex)
        linewidth(2, sliceIndex, nubLine)
        linemask(255, sliceIndex, nubLine)
            end
                fillmask(0,sliceIndex, addcircle(0,0, innerCircleRad-(thickness/2),
            sliceIndex))
        end
end
showframe(sliceIndex)
sleep(.02)
end
--calculating parameters
maxPrintHeight = sliceheight(numSlices-1)--find the highest point in the print, this is the same
as the height of the last slice. Slices are 0 indexed, hence the −1.
infoline(1, "Current Print Info:")
infoline(2, string.format("Calculated Max Print Height: %dmm", maxPrintHeight))
infoline(3, string.format("Calculated Est. Time: %dmin", (maxPrintHeight/stageSpeed)*60 +
(preExposureTime+exposureTime)*numSlices/60))
infoline(4, string.format("Number of Slices: %d", numSlices))
--Prepare Printer
relay(true)--turn light on
showframe(-1) --ensure nothing is exposed durring setup
setlevels(.55, .6)--if available, printer set fluid pump to maintain about 55% fill
--Execute Print
gotostart( )--move stage to starting position
for sliceIndex = 0,numSlices-1 do
        infoline(5, string.format("Current Slice: %d", sliceIndex))
        nextHeight = sliceheight(sliceIndex)--calculate the height that the stage should
        be at to expose this frame
        moveto(nextHeight, stageSpeed)--move to nextHeight
        sleep(preExposureTime)--wait a given amount of time for oxygen to
        diffuse into resin,
        prepExposureTime is predefined in the Constants section
        showframe(sliceIndex)--show frame to expose
        sleep(1.5)--wait while frame exposes, exposureTime is predefined in the Constants
        section
        showframe(-1)-- show nothing to ensure no exposure while stage is moving to next
position
end
--Shutdown
relay(false)
```

```
setlevels(0,0)
--Lift stage to remove part
moveby(25, 160000)
```

Example 10

Continuous Fabrication with Intermittent Irradiation and Advancing

Figure 22:
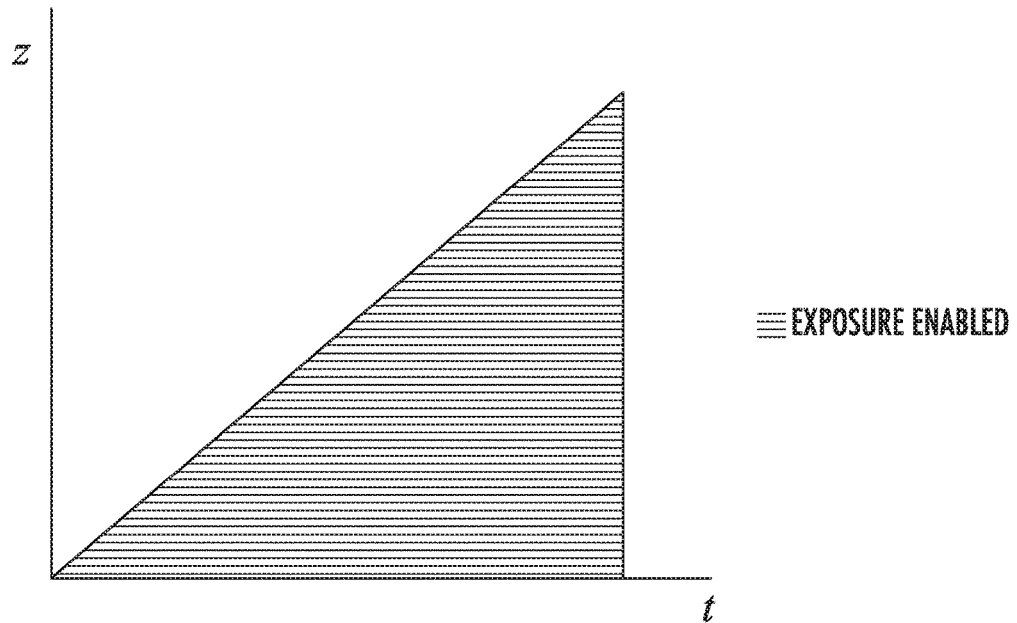
FIG. 22 is a graphic illustration of a process of the invention indicating the position of the carrier in relation to the build surface or plate, where both advancing of the carrier and irradiation of the build region is carried out continuously. Advancing of the carrier is illustrated on the vertical axis, and time is illustrated on the horizontal axis.

A process of the present invention is illustrated in FIG. 22, where the vertical axis illustrates the movement of the carrier away from the build surface. In this embodiment, the vertical movement or advancing step (which can be achieved by driving either the carrier or the build surface, preferably the carrier), is continuous and unidirectional, and the irradiating step is carried out continuously. Polymerization of the article being fabricated occurs from a gradient of polymerization, and hence creation of "layer by layer" fault lines within the article is minimized.

Figure 23:
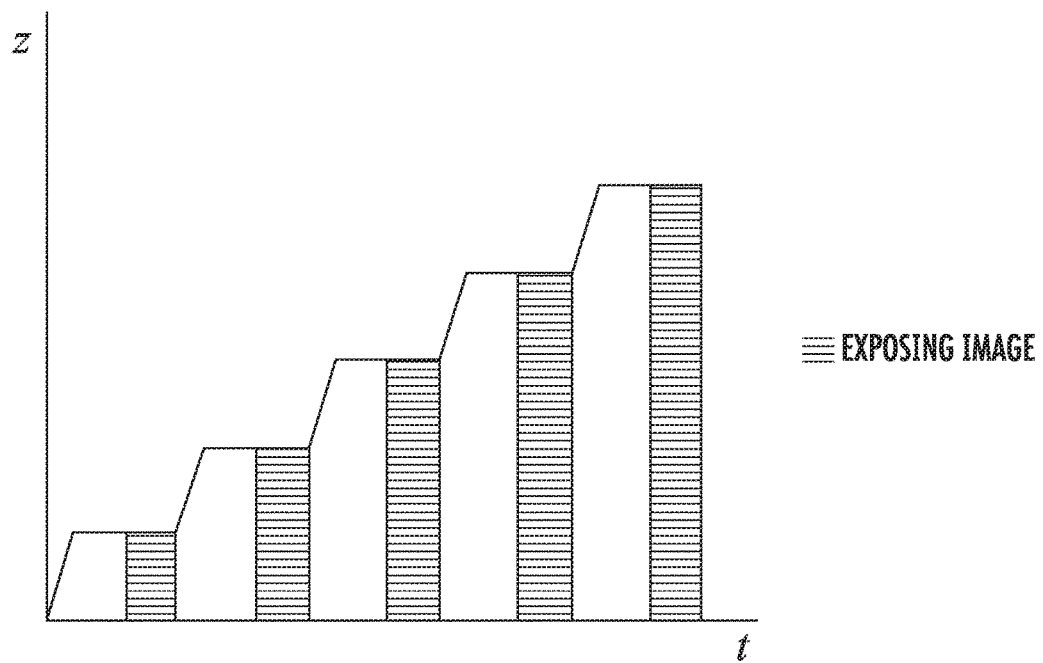
FIG. 23 is a graphic illustration of another process of the invention indicating the position of the carrier in relation to the build surface or plate, where both advancing of the carrier and irradiation of the build region is carried out stepwise, yet the dead zone and gradient of polymerization are maintained. Advancing of the carrier is again illustrated on the vertical axis, and time is illustrated on the horizontal axis.

An alternate embodiment of the present invention is illustrated in FIG. 23. In this embodiment, the advancing step is carried out in a step-by-step manner, with pauses introduced between active advancing of the carrier and build surface away from one another. In addition, the irradiating step is carried out intermittently, in this case during the pauses in the advancing step. We find that, as long as the inhibitor of polymerization is supplied to the dead zone in an amount sufficient to maintain the dead zone and the adjacent gradient of polymerization during the pauses in irradiation and/or advancing, the gradient of polymerization is maintained, and the formation of layers within the article of manufacture is minimized or avoided. Stated differently, the polymerization is continuous, even though the irradiating and advancing steps are not. Sufficient inhibitor can be supplied by any of a variety of techniques, including but not limited to: utilizing a transparent member that is sufficiently permeable to the inhibitor, enriching the inhibitor (e.g., feeding the inhibitor from an inhibitor-enriched and/or pressurized atmosphere), etc. In general, the more rapid the fabrication of the three-dimensional object (that is, the more rapid the cumulative rate of advancing), the more inhibitor will be required to maintain the dead zone and the adjacent gradient of polymerization.

Example 11

Figure 24:
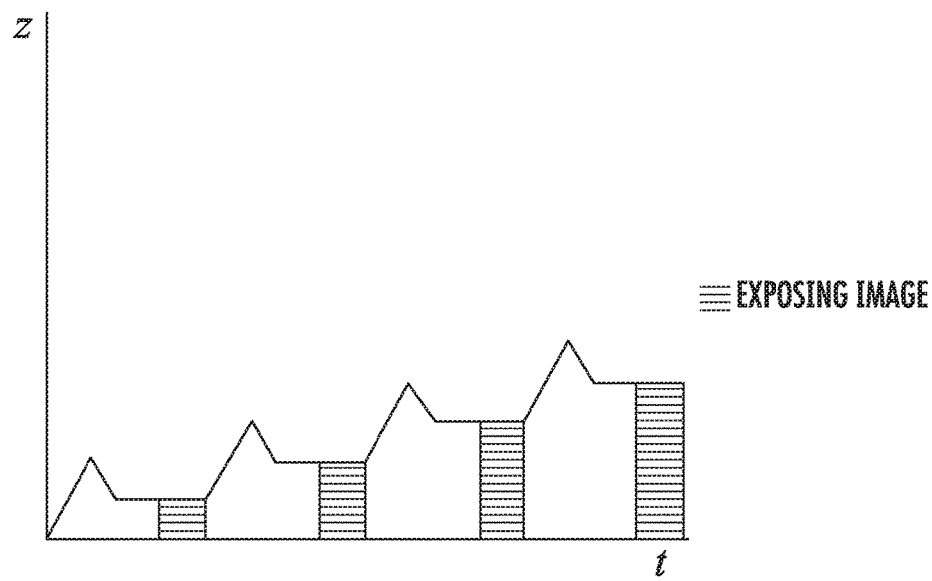
FIG. 24 is a graphic illustration of still another process of the invention indicating the position of the carrier in relation to the build surface or plate, where both advancing of the carrier and irradiation of the build region is carried out stepwise, the dead zone and gradient of polymerization are maintained, and a reciprocating step is introduced between irradiation steps to enhance the flow of polymerizable liquid into the build region. Advancing of the carrier is again illustrated on the vertical axis, and time is illustrated on the horizontal axis.

Continuous Fabrication with Reciprocation During Advancing to Enhance Filling of Build Region with Polymerizable Liquid A still further embodiment of the present invention is illustrated in FIG. 24. As in Example 10 above, this embodiment, the advancing step is carried out in a step-by-step manner, with pauses introduced between active advancing of the carrier and build surface away from one another. Also as in Example 10 above, the irradiating step is carried out intermittently, again during the pauses in the advancing step. In this example, however, the ability to maintain the dead zone and gradient of polymerization during the pauses in advancing and irradiating is taken advantage of by introducing a vertical reciprocation during the pauses in irradiation.

We find that vertical reciprocation (driving the carrier and build surface away from and then back towards one another), particularly during pauses in irradiation, can serve to enhance the filling of the build region with the polymerizable liquid, apparently by pulling polymerizable liquid into the build region. This is advantageous when larger areas are irradiated or larger parts are fabricated, and filling the central portion of the build region may be rate-limiting to an otherwise rapid fabrication.

Reciprocation in the vertical or Z axis can be carried out at any suitable speed in both directions (and the speed need not be the same in both directions), although it is preferred that the speed when reciprocating away is insufficient to cause the formation of gas bubbles in the build region.

While a single cycle of reciprocation is shown during each pause in irradiation in FIG. 24, it will be appreciated that multiple cycles (which may be the same as or different from one another) may be introduced during each pause.

As in Example 10 above, as long as the inhibitor of polymerization is supplied to the dead zone in an amount sufficient to maintain the dead zone and the adjacent gradient of polymerization during the reciprocation, the gradient of polymerization is maintained, the formation of layers within the article of manufacture is minimized or avoided, and the polymerization/fabrication remains continuous, even though the irradiating and advancing steps are not.

Example 12

Figure 25:
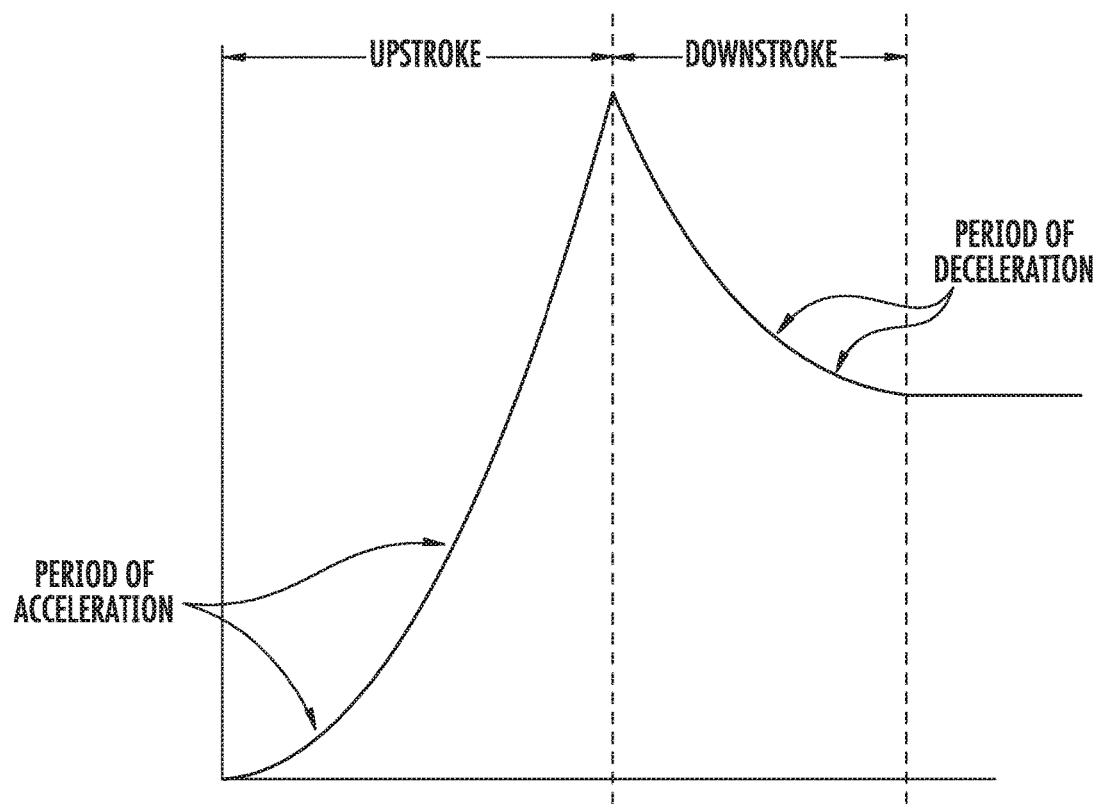
FIG. 25 is a detailed illustration of a reciprocation step of FIG. 24, showing a period of acceleration occurring during the upstroke (i.e., a gradual start of the upstroke) and a period of deceleration occurring during the downstroke (i.e., a gradual end to the downstroke).

Acceleration During Reciprocation Upstroke and Deceleration During Reciprocation Downstroke to Enhance Part Quality We observe that there is a limiting speed of upstroke, and corresponding downstroke, which if exceeded causes a deterioration of quality of the part or object being fabricated (possibly due to degradation of soft regions within the gradient of polymerization caused by lateral shear forces a resin flow). To reduce these shear forces and/or enhance the quality of the part being fabricated, we introduce variable rates within the upstroke and downstroke, with gradual acceleration occurring during the upstroke and gradual deceleration occurring during the downstroke, as schematically illustrated in FIG. 25.

Example 13

Dual Cure with PEGDA+EGDA+Polyurethane (HMDI Based)

5 g of the following mixture was mixed for 3 minutes in a high-shear mixer.
- 1 g of poly(ethylene glycol) diacrylate (Mn=700 g/mol) containing 12 wt % of diphenyl(2-(6-trimethylbenzoyl) phosphine oxide (DPO).
- 1 g of diethyleneglycol diacrylate containing 12 wt % DPO
- 1 g of "Part A" polyurethane resin (Methylene bis(4-Cyclohexylisocyanate) based: "ClearFlex 50" sold by Smooth-On® inc.
- 2 g of "Part B" polyurethane resin (polyol mixture): "ClearFlex 50" sold by Smooth-On® inc.
- 0.005 g of amorphous carbon black powder After mixing, the resin was 3D formed using an apparatus as described herein. A "honeycomb" object was formed at a speed of 160 mm/hr using a light intensity setting of 1.2 mV (when measured using a volt meter equipped with a optical sensor). Total printing time was approximately 10 minutes.

After printing, the part was removed from the print stage, rinsed with hexanes, and placed into an oven set at 110° C. for 12 hours.

After heating, the part maintained its original shape generated during the initial printing, and it had transformed into a tough, durable, elastomer having an elongation at break around 200%.

Example 14

Dual Cure with EGDA+Polyurethane (TDI Based)

5 g of the following mixture was mixed for 3 minutes in a high-shear mixer.
  1 g of diethyleneglycol diacrylate containing 12 wt % DPO
  2 g of "Part A" polyurethane resin (toluene diisocyanate) based: "VytaFlex 30" sold by Smooth-On® inc.
  2 g of "Part B" polyurethane resin (polyol mixture): "Vytaflex 30" sold by Smooth-On® inc.

After mixing, the resin was 3D formed using an apparatus as described herein. The cylindrical object was formed at a speed of 50 mm/hr using a light intensity setting of 1.2 mV (when measured using a volt meter equipped with an optical sensor). Total printing time was approximately 15 minutes.

After printing, the part was removed from the print stage, rinsed with hexanes, and placed into an oven set at 110° C. for 12 hours.

After heating, the part maintained its original shape generated during the initial printing, and it had transformed into a tough, durable, elastomer having an elongation at break around 400%

Example 15

Synthesis of a Reactive Blocked Polyurethane Prepolymer for Dual Cure

Add 200 g of melted anhydrous 2000 Da, polytetramethylene oxide (PTMO2k) into a 500 mL 3-neck flask charged with an overhead stirrer, nitrogen purge and a thermometer. Then 44.46 g IPDI is added to the flask and stirred to homogeneous solution with the PTMO for 10 min, followed by addition of 140 uL Tin(II) catalyst stannous octoate. Raise the temperature to 70° C., and keep reaction for 3 h. After 3 h, gradually lower the temperature to 40° C., and gradually add 37.5 g TBAEMA using an additional funnel within 20 min. Then set the temperature to 50° C. and add 100 ppm hydroquinone. Keep the reaction going on for 14 h. Pour out the final liquid as the product.

Example 16

Synthesis of a Second Reactive Blocked Polyurethane Prepolymer for Dual Cure

Add 150 g dried 1000 Da, polytetramethylene oxide (PTMO1k) into a 500 mL 3-neck flask charged with an overhead stirrer, nitrogen purge and a thermometer. Then 50.5 g HDI is added to the flask and stirred to homogeneous solution with the PTMO for 10 min, followed by addition of 100 uL Tin(II) catalyst stannous octoate. Raise the temperature to 70° C., and keep reaction for 3 h. After 3 h, gradually lower the temperature to 40° C., and gradually add 56 g TBAEMA using an additional funnel within 20 min. Then set the temperature to 50° C. and add 100 ppm hydroquinone. Keep the reaction going on for 14 h. Pour out the final liquid as the product.

In the above examples, the PTMO can be replaced by polypropylene glycol (PPG, such as 1000 Da PPG (PPG1k)) or other polyesters or polybuadiene diols. IPDI or HDI can be replaced by other diisocyanates or branched isocyanates. The molar stoichiometry of the polyol:diisocyanate:TBAEMA is preferably 1:2:2. Preferably use 0.1-0.3 wt % stannous octoate to the weight of the polyol.

Example 17

Printing and Thermal Curing with a Reactive Blocked Polyurethane Prepolymers

ABPU resins can be formed (optionally but preferably by continuous liquid interphase/interface printing) at up to 100 mm/hr using the formulations in Table 1 to generate elastomers with low hysteresis after thermally cured, at 100° C. for 2 to 6 hours, depending on the diisocyanates used in ABPU and the chain extender(s).

TABLE 1

|  | Parts by weight |
| --- | --- |
| ABPU | 320 |
| Reactive Diluent | 40-80 |
| Ethylene glycol | 8-20 |
| H12MDA | 8-20 |
| PPO | 1-4 |

Dog-bone-shaped specimens were formed by continuous liquid interface printing with different ABPUs (varying the diisocyanate and polyol used for the synthesis) and reactive diluents. Table 2 shows the mechanical properties of some of the thermally cured dog-bone samples at room temperature.

TABLE 2

| ABPU | | Reactive diluent | Tensile stress at maximum load (MPa) | % elongation at break |
| --- | --- | --- | --- | --- |
| Diisocyanate | Polyol | | | |
| IPDI | PTMO2k | Methyl methacrylate | 25 | 650 |
| IPDI | PPG1k | Cyclohexane methacrylate | 7.5 | 368 |
| MDI | PTMO2k | TBAEMA | 13.4 | 745 |
| HDI | PTMO1k | TBAEMA | 13 | 490 |
| HMDI | PTMO1k | TBAEMA | 13.6 | 334 |

Examples 18-61

Additional Polyurethane Dual Cure Materials, Testing and Tensile Properties

The following abbreviations are used in the Examples below: "DEGMA" means di(ethylene glycol) methyl ether methacrylate; "IBMA" means isoboronyl methacrylate; "PACM" means 4,4'-Diaminodicyclohexyl methane; "BDO" means 1,4-butanediol; "PPO" means Phenylbis(2,4,6-trimethylbenzoyl)phosphine oxide; "MDEA" means 4,4'- methylene-bis-(2,6-diethylaniline); "2-EHMA" means 2-ethylhexyl methacrylate; and "PEGDMA" means poly (ethylene glycol) dimethacrylate (MW=700 Da).

Example 18

Testing of Tensile Properties

In the examples above and below, tensile properties were tested in accordance with ASTM standard D638-10, *Standard Test Methods for Tensile Properties of Plastics* (ASTM International, 100 Barr Harbor Drive, PO Box C700, West Conshohocken, Pa., 19428-2959 USA).

Briefly, tensile specimens (sometimes referred to as "dog-bone samples" in reference to their shape), were loaded onto an Instron 5964 testing apparatus with Instron BLUEHILL3 measurement software (Instron, 825 University Ave, Norwood, Mass., 02062-2643, USA). The samples are oriented vertically and parallel to the direction of testing. Cast and flood cured samples were fully cured using a DNMAX 5000 EC-Series enclosed UV flood lamp (225 mW/cm$^2$) for from thirty to ninety seconds of exposure. Table 3 below summarizes the types of tensile specimens tested, general material property (rigid or non-rigid), and the associated strain rate.

TABLE 3

| Dogbone Type | MaterialType | Strain Rate (mm/min) |
|---|---|---|
| IV | Rigid | 5 |
| V | Rigid | 1 |
| IV | Non-rigid | 50 |
| V | Non-rigid | 10 |

Dogbone type IV is used to test elastomeric samples.

The samples were tested at a rate such that the sample ruptures at a time between 30 seconds to 5 minutes to ensure that sample strain rate is slow enough to capture plastic deformation in the samples.

Measured dogbone samples that do not rupture in the middle rectangular section are excluded. Samples that break in the grips or prior to testing are not representative of the anticipated failure modes and are excluded from the data.

Persuant to ASTM D-638, measure the Young's modulus (modulus of elasticity) (slope of the stress-strain plot between 5-10% elongation), tensile strength at break, tensile strength at yield, percent elongation at break, percent elongation at yield.

A strain rate is chosen such that the part with the lowest strain-at-break (%) will fail within 5 minutes. This often means that a slower strain rate will be necessary for rigid samples.

Example 19

Elastomer from a Reactive Blocked Polyurethane Prepolymer

Components as shown in Table 4, except PACM, were added to a container and thoroughly mixed (either by an overhead stirrer or a centrifugation mixer such as THINKY™ mixer) to obtain a homogeneous resin. Then PACM was added to the resin and mixed for another 2-30 min depending on the volume and viscosity of resin. The resin was formed by CLIP as described above into D638 Type IV dog-bone-shaped specimens followed by thermal curing at 125° C. for 2 h. The cured elastomer specimens were tested following ASTM standard D638-10 on an Instron apparatus for mechanical properties as described above, which properties are also summarized in Table 4.

TABLE 4

|  | Parts by weight |
|---|---|
| ABPU(PTMO1k + HDI + TBAEMA) | 697 |
| DEGMA | 82 |
| IBMA | 123 |
| PACM | 83 |
| PPO | 5 |
| Tensile Strength (MPa) | 13.1 |
| % Elongation at Break | 395 |

Example 20

Elastomer from a Reactive Blocked Polyurethane Prepolymer

Cured elastomer specimens were prepared in the same manner as in Example 19 but using the formulation in Table 5. The cured specimens were tested following ASTM standard on an Instron apparatus for mechanical properties as described above, which properties are summarized in Table 5.

TABLE 5

|  | Parts by weight |
|---|---|
| ABPU(PTMO2k + IPDI + TBAEMA) | 721 |
| DEGMA | 84 |
| IBMA | 126 |
| PACM | 54 |
| PPO | 5 |
| Tensile Strength (MPa) | 26.8 |
| % Elongation at Break | 515 |

Example 21

Elastomer from a Reactive Blocked Polyurethane Prepolymer

Cured elastomer specimens were prepared in the same manner as in Example 19 but using the formulation in Table 6. The cured specimens were tested following ASTM standard on an Instron apparatus for mechanical properties as described above, which properties are summarized in Table 6.

TABLE 6

|  | Parts by weight |
|---|---|
| ABPU(PTMO2k + HMDI + TBAEMA) | 728 |
| DEGMA | 86 |
| IBMA | 128 |
| PACM | 53 |
| PPO | 5 |
| Tensile Strength (MPa) | 23.1 |
| % Elongation at Break | 456 |

Example 22

Elastomer from a Reactive Blocked Polyurethane Prepolymer

Components as shown in Table 7 were added to a container and thoroughly mixed (either by an overhead stirrer or a centrifugation mixer such as THINKY™ mixer) to obtain a homogeneous resin. The resin was casted into a square mold (with dimensions of 100×100×4 mm), and UV flood cured for 1 min, followed by thermal curing at 125° C. for 2 h. The obtained elastomer sheet was die-cut into rectangular bars with dimensions of 100×20×4 mm. The elastomer specimens were tested following ASTM standard D638-10 on an Instron apparatus for mechanical properties as described above, which properties are summarized in Table 7.

TABLE 7

|  | Parts by weight |
|---|---|
| ABPU(PTMO1k + HDI + TBAEMA) | 666 |
| 2-EHMA | 131 |
| IBMA | 66 |
| MDEA | 123 |
| PPO | 10 |
| Tensile Strength (MPa) | 14.4 |
| % Elongation at Break | 370 |

Example 23

Elastomer from a Reactive Blocked Polyurethane Prepolymer

Cured elastomer specimens were prepared in the same manner as in Example 22 but using the formulation in Table 8. The elastomer specimens were tested following ASTM standard D638-10 an Instron apparatus for mechanical properties as described above, which properties are summarized in Table 8.

TABLE 8

|  | Parts by weight |
|---|---|
| ABPU(PTMO1k + HDI + TBAEMA) | 692 |
| DEGMA | 102 |
| 2-EHMA | 102 |
| PEGDMA | 14 |
| PACM | 80 |
| PPO | 10 |
| Tensile Strength (MPa) | 6.42 |
| % Elongation at Break | 388 |

Example 24

Elastomer from a Reactive Blocked Polyurethane Prepolymer

Cured elastomer specimens were prepared in the same manner as in Example 22 but using the formulation in Table 9. The elastomer specimens were tested following ASTM standard D638-10 on an Instron apparatus for mechanical properties as described above, which properties are summarized in Table 9.

TABLE 9

|  | Parts by weight |
|---|---|
| ABPU(PTMO1k + IPDI + TBAEMA) | 700 |
| DEGMA | 206 |
| PEGDMA | 10 |
| PACM | 74 |
| PPO | 10 |
| Tensile Strength (MPa) | 11.26 |
| % Elongation at Break | 366 |

Example 25

Elastomer from a Reactive Blocked Polyurethane Prepolymer

Cured elastomer specimens were prepared in the same manner as in Example 22 but using the formulation in Table 10. The elastomer specimens were tested following ASTM standard D638-10 on an Instron apparatus for mechanical properties as described above, which properties are summarized in Table 10.

TABLE 10

|  | Parts by weight |
|---|---|
| ABPU(PTMO1k + MDI + TBAEMA) | 672 |
| 2-EHMA | 248 |
| PEGDMA | 10 |
| PACM | 60 |
| PPO | 10 |
| Tensile Strength (MPa) | 24.93 |
| % Elongation at Break | 320 |

Example 26

Elastomer from a Reactive Blocked Polyurethane Prepolymer

Cured elastomer specimens were prepared in the same manner as in Example 22 but using the formulation in Table 11. The elastomer specimens were tested following ASTM standard D638-10 on an Instron apparatus for mechanical properties as described above, which properties are summarized in Table 11.

TABLE 11

|  | Parts by weight |
|---|---|
| ABPU(PTMO1k + MDI + TBAEMA) | 698 |
| DEGMA | 208 |
| PEGDMA | 10 |
| PACM | 74 |
| PPO | 10 |
| Tensile Strength (MPa) | 20.14 |
| % Elongation at Break | 355 |

Example 27

Elastomer from a Reactive Blocked Polyurethane Prepolymer

Cured elastomer specimens were prepared in the same manner as in Example 22 but using the formulation in Table 12. The elastomer specimens were tested following ASTM standard D638-10 on an Instron apparatus for mechanical properties as described above, which properties are summarized in Table 12.

TABLE 12

|  | Parts by weight |
|---|---|
| ABPU(PTMO2k + HMDI + TBAEMA) | 2000 |
| DEGMA | 400 |
| 2-EHMA | 200 |
| PEGDMA | 66 |
| PACM | 145 |
| PPO | 14 |
| Tensile Strength (MPa) | 16.7 |
| % Elongation at Break | 476 |

Example 28

Elastomer from a Reactive Blocked Polyurethane Prepolymer

Cured elastomer specimens were prepared in the same manner as in Example 22 but using the formulation in Table 13. The elastomer specimens were tested following ASTM standard D638-10 on an Instron apparatus for mechanical properties as described above, which properties are summarized in Table 13.

TABLE 13

|  | Parts by weight |
|---|---|
| ABPU(PTMO2k + HMDI + TBAEMA) | 2000 |
| DEGMA | 400 |
| 2-EHMA | 200 |
| PACM | 145 |
| PPO | 14 |
| Tensile Strength (MPa) | 16.9 |
| % Elongation at Break | 499 |

Example 29

Elastomer from a Reactive Blocked Polyurethane Prepolymer

Cured elastomer specimens were prepared in the same manner as in Example 22 but using the formulation in Table 14 by mixing all the components together. The elastomer specimens were tested following ASTM standard D638-10 on an Instron apparatus for mechanical properties as described above, which properties are summarized in Table 14.

TABLE 14

|  | Parts by weight |
|---|---|
| ABPU(PTMO2k + HMDI + TBAEMA) | 2000 |
| DEGMA | 400 |
| 2-EHMA | 200 |
| PEGDMA | 66 |
| BDO | 62 |
| PPO | 14 |
| Tensile Strength (MPa) | 2.14 |
| % Elongation at Break | 188 |

Example 30

Elastomer from a Reactive Blocked Polyurethane Prepolymer

Cured elastomer specimens were prepared in the same manner as in Example 22 but using the formulation in Table 15. The elastomer specimens were tested following ASTM standard D638-10 on an Instron apparatus for mechanical properties as described above, which properties are summarized in Table 15.

TABLE 15

|  | Parts by weight |
|---|---|
| ABPU(PTMO2k + IPDI + TBAEMA) | 2000 |
| DEGMA | 420 |
| 2-EHMA | 180 |
| PEGDMA | 67 |
| PACM | 149 |
| PPO | 14 |
| Tensile Strength (MPa) | 8.37 |
| % Elongation at Break | 386 |

Example 31

Elastomer from a Reactive Blocked Polyurethane Prepolymer

Cured elastomer specimens were prepared in the same manner as in Example 22 but using the formulation in Table 16. The elastomer specimens were tested following ASTM standard D638-10 on an Instron apparatus for mechanical properties as described above, which properties are summarized in Table 16.

TABLE 16

|  | Parts by weight |
|---|---|
| ABPU(PTMO2k + IPDI + TBAEMA) | 2400 |
| 2-EHMA | 700 |
| PACM | 179 |
| PPO | 16 |
| Tensile Strength (MPa) | 17.2 |
| % Elongation at Break | 557 |

Example 32

Elastomer from a Reactive Blocked Polyurethane Prepolymer

Cured elastomer specimens were prepared in the same manner as in Example 22 but using the formulation in Table 17. The elastomer specimens were tested following ASTM standard D638-10 on an Instron apparatus for mechanical properties as described above, which properties are summarized in Table 17.

TABLE 17

|  | Parts by weight |
|---|---|
| ABPU(PTMO2k + IPDI + TBAEMA) | 2400 |
| 2-EHMA | 630 |
| PEGDMA | 70 |
| PACM | 179 |
| PPO | 16 |

TABLE 17-continued

| | Parts by weight |
|---|---|
| Tensile Strength (MPa) | 13.4 |
| % Elongation at Break | 520 |

Example 33

Elastomer from a Reactive Blocked Polyurethane Prepolymer

Cured elastomer specimens were prepared in the same manner as in Example 22 but using the formulation in Table 18. The elastomer specimens were tested following ASTM standard D638-10 on an Instron apparatus for mechanical properties as described above, which properties are summarized in Table 18.

TABLE 18

| | Parts by weight |
|---|---|
| ABPU(PTMO2k + IPDI + TBAEMA) | 2000 |
| DEGMA | 400 |
| 2-EHMA | 200 |
| PACM | 149 |
| PPO | 14 |
| Tensile Strength (MPa) | 13.6 |
| % Elongation at Break | 529 |

Example 34

Elastomer from a Reactive Blocked Polyurethane Prepolymer

Cured elastomer specimens were prepared in the same manner as in Example 22 but using the formulation in Table 19. The elastomer specimens were tested following ASTM standard D638-10 on an Instron apparatus for mechanical properties as described above, which properties are summarized in Table 19.

TABLE 19

| | Parts by weight |
|---|---|
| ABPU(PTMO2k + IPDI + TBAEMA) | 2000 |
| DEGMA | 500 |
| 2-EHMA | 500 |
| PACM | 149 |
| PPO | 14 |
| Tensile Strength (MPa) | 9.32 |
| % Elongation at Break | 485 |

Example 35

Elastomer from a Reactive Blocked Polyurethane Prepolymer

Cured elastomer specimens were prepared in the same manner as in Example 22 but using the formulation in Table 20. The elastomer specimens were tested following ASTM standard D638-10 on an Instron apparatus for mechanical properties as described above, which properties are summarized in Table 20.

TABLE 20

| | Parts by weight |
|---|---|
| ABPU(PTMO2k + IPDI + TBAEMA) | 2000 |
| DEGMA | 650 |
| 2-EHMA | 750 |
| PACM | 149 |
| PPO | 14 |
| Tensile Strength (MPa) | 5.14 |
| % Elongation at Break | 440 |

Example 36

Elastomer from a Reactive Blocked Polyurethane Prepolymer

Cured elastomer specimens were prepared in the same manner as in Example 22 but using the formulation in Table 21. The elastomer specimens were tested following ASTM standard D638-10 on an Instron apparatus for mechanical properties as described above, which properties are summarized in Table 21.

TABLE 21

| | Parts by weight |
|---|---|
| ABPU(PTMO1k + HDI + TBAEMA) | 2000 |
| DEGMA | 580 |
| PACM | 246 |
| PPO | 14 |
| Tensile Strength (MPa) | 6.48 |
| % Elongation at Break | 399 |

Example 37

Elastomer from a Reactive Blocked Polyurethane Prepolymer

Cured elastomer specimens were prepared in the same manner as in Example 22 but using the formulation in Table 22. The elastomer specimens were tested following ASTM standard D638-10 on an Instron apparatus for mechanical properties as described above, which properties are summarized in Table 22.

TABLE 22

| | Parts by weight |
|---|---|
| ABPU(PTMO1k + HDI + TBAEMA) | 2000 |
| DEGMA | 580 |
| PEGDMA | 60 |
| PACM | 246 |
| PPO | 14 |
| Tensile Strength (MPa) | 6.49 |
| % Elongation at Break | 353 |

Example 38

Elastomer from a Reactive Blocked Polyurethane Prepolymer

Cured elastomer specimens were prepared in the same manner as in Example 22 but using the formulation in Table 23. The elastomer specimens were tested following ASTM standard D638-10 on an Instron apparatus for mechanical properties as described above, which properties are summarized in Table 23.

TABLE 23

| | Parts by weight |
|---|---|
| ABPU(PTMO1k + HDI + TBAEMA) | 2000 |
| DEGMA | 620 |
| 2-EHMA | 180 |
| PACM | 246 |
| PPO | 14 |
| Tensile Strength (MPa) | 6.83 |
| % Elongation at Break | 415 |

Example 39

Elastomer from a Reactive Blocked Polyurethane Prepolymer

Cured elastomer specimens were prepared in the same manner as in Example 22 but using the formulation in Table 24. The elastomer specimens were tested following ASTM standard D638-10 on an Instron apparatus for mechanical properties as described above, which properties are summarized in Table 24.

TABLE 24

| | Parts by weight |
|---|---|
| ABPU(PTMO2k + HMDI + TBAEMA) | 2000 |
| DEGMA | 400 |
| 2-EHMA | 200 |
| PEGDMA | 66 |
| PACM | 145 |
| PPO | 14 |
| Tensile Strength (MPa) | 15.6 |
| % Elongation at Break | 523 |

Example 40

Elastomer from a Reactive Blocked Polyurethane Prepolymer

Cured elastomer specimens were prepared in the same manner as in Example 22 but using the formulation in Table 25. The elastomer specimens were tested following ASTM standard D638-10 on an Instron apparatus for mechanical properties as described above, which properties are summarized in Table 25.

TABLE 25

| | Parts by weight |
|---|---|
| ABPU(PTMO2k + IPDI + TBAEMA) | 2000 |
| DEGMA | 420 |
| 2-EHMA | 180 |
| PEGDMA | 67 |
| PACM | 149 |
| PPO | 14 |
| Tensile Strength (MPa) | 13.2 |
| % Elongation at Break | 480 |

Example 41

Dual-Cure Material from Reactive Blocked Polyurethane Prepolymer

Components as shown in Table 26, except PACM, were added to a container and thoroughly mixed (either by an overhead stirrer or THINKY™ mixer) to obtain a homogeneous resin. Then PACM was added to the resin and mixed for another 30 min. The resin was cast into dog-bone-shaped specimens by UV flood cure for 60 seconds followed by thermal curing at 125° C. for 4 h. The cured specimens were tested following ASTM standard on an Instron apparatus for mechanical properties as described above, which properties are also summarized in Table 26.

TABLE 26

| Component | | Weight % |
|---|---|---|
| ABPU | ABPU-1K-MDI | 61.78 |
| Reactive Diluent | IBMA | 30.89 |
| Chain Extender | PACM | 6.56 |
| Initiator | PPO | 0.77 |
| Tensile Strength (MPa) | | 31.7 |
| Modulus (MPa) | | 680 |
| Elongation (%) | | 273 |

Example 42

Dual-Cure Material from Reactive Blocked Polyurethane Prepolymer

Cured specimens were prepared in the same manner as in Example 41 but using the formulation in Table 27. The specimens were tested following ASTM standard D638-10 on an Instron apparatus for mechanical properties as described above, which properties are summarized in Table 27.

TABLE 27

| Component | | Weight % |
|---|---|---|
| ABPU | ABPU-1K-MDI | 53.51 |
| Reactive Diluent | IBMA | 40.13 |
| Chain Extender | PACM | 5.69 |
| Initiator | PPO | 0.67 |
| Tensile Strength (MPa) | | 26.2 |
| Modulus (MPa) | | 1020 |
| Elongation (%) | | 176 |

Example 43

Dual-Cure Material from Reactive Blocked Polyurethane Prepolymer

Cured specimens were prepared in the same manner as in Example 41 but using the formulation in Table 28. The specimens were tested following ASTM standard D638-10 on an Instron apparatus for mechanical properties as described above, which properties are summarized in Table 28.

TABLE 28

| Component | | Weight % |
|---|---|---|
| ABPU | ABPU-1K-MDI | 47.2 |
| Reactive Diluent | IBMA | 47.2 |
| Chain Extender | PACM | 5.01 |
| Initiator | PPO | 0.59 |
| Tensile Strength (MPa) | | 29.5 |
| Modulus (MPa) | | 1270 |
| Elongation (%) | | 3.21 |

Example 44

Dual-Cure Material from Reactive Blocked Polyurethane Prepolymer

Cured specimens were prepared in the same manner as in Example 41 but using the formulation in Table 29. The specimens were tested following ASTM standard D638-10 on an Instron apparatus for mechanical properties as described above, which properties are summarized in Table 29.

TABLE 29

| Component | | Weight % |
|---|---|---|
| ABPU | ABPU-1K-MDI | 42.22 |
| Reactive Diluent | IBMA | 52.77 |
| Chain Extender | PACM | 4.49 |
| Initiator | PPO | 0.53 |
| Tensile Strength (MPa) | | 19.3 |
| Modulus (MPa) | | 1490 |
| Elongation (%) | | 1.42 |

Example 45

Dual-Cure Material from Reactive Blocked Polyurethane Prepolymer

Cured specimens were prepared in the same manner as in Example 41 but using the formulation in Table 30. The specimens were tested following ASTM standard D638-10 on an Instron apparatus for mechanical properties as described above, which properties are summarized in Table 30.

TABLE 30

| Component | | Weight % |
|---|---|---|
| ABPU | ABPU-1K-MDI | 61.13 |
| Reactive Diluent | IBMA | 30.57 |
| Chain Extender | PACM | 7.54 |
| Initiator | PPO | 0.76 |
| Tensile Strength (MPa) | | 19.3 |
| Modulus (MPa) | | 1490 |
| Elongation (%) | | 1.42 |

Example 46

Dual-Cure Material from Reactive Blocked Polyurethane Prepolymer

Cured specimens were prepared in the same manner as in Example 41 but using the formulation in Table 31. The specimens were tested following ASTM standard D638-10 on an Instron apparatus for mechanical properties as described above, which properties are summarized in Table 31.

TABLE 31

| Component | | Weight % |
|---|---|---|
| ABPU | ABPU-1K-MDI | 61.55 |
| Reactive Diluent | IBMA | 30.78 |
| Chain Extender | PACM | 6.9 |
| Initiator | PPO | 0.77 |
| Tensile Strength (MPa) | | 34.1 |
| Modulus (MPa) | | 713 |
| Elongation (%) | | 269 |

Example 47

Dual-Cure Material from Reactive Blocked Polyurethane Prepolymer

Cured specimens were prepared in the same manner as in Example 41 but using the formulation in Table 32. The specimens were tested following ASTM standard D638-10 on an Instron apparatus for mechanical properties as described above, which properties are summarized in Table 32.

TABLE 32

| Component | | Weight % |
|---|---|---|
| ABPU | ABPU-1K-MDI | 61.98 |
| Reactive Diluent | IBMA | 30.99 |
| Chain Extender | PACM | 6.25 |
| Initiator | PPO | 0.77 |
| Tensile Strength (MPa) | | 39.7 |
| Modulus (MPa) | | 664 |
| Elongation (%) | | 277 |

Example 48

Dual-Cure Material from Reactive Blocked Polyurethane Prepolymer

Cured specimens were prepared in the same manner as in Example 41 but using the formulation in Table 33. The specimens were tested following ASTM standard D638-10 on an Instron apparatus for mechanical properties as described above, which properties are summarized in Table 33.

TABLE 33

| Component | | Weight % |
|---|---|---|
| ABPU | ABPU-1K-MDI | 63.75 |
| Reactive Diluent | IBMA | 31.87 |
| Chain Extender | PACM | 3.59 |
| Initiator | PPO | 0.8 |
| Tensile Strength (MPa) | | 21.3 |
| Modulus (MPa) | | 265 |
| Elongation (%) | | 207 |

Example 49

Dual-Cure Material from Reactive Blocked Polyurethane Prepolymer

Cured specimens were prepared in the same manner as in Example 41 but using the formulation in Table 34. The specimens were tested following ASTM standard D638-10 on an Instron apparatus for mechanical properties as described above, which properties are summarized in Table 34.

TABLE 34

| Component | | Weight % |
|---|---|---|
| ABPU | ABPU-1K-MDI | 63.75 |
| Reactive Diluent | IBMA | 31.87 |
| Chain Extender | PACM | 5.02 |
| Initiator | PPO | 0.8 |
| Tensile Strength (MPa) | | 22.7 |
| Modulus (MPa) | | 312 |
| Elongation (%) | | 211 |

Example 50

Dual-Cure Material from Reactive Blocked Polyurethane Prepolymer

Cured specimens were prepared in the same manner as in Example 41 but using the formulation in Table 35. The specimens were tested following ASTM standard D638-10 on an Instron apparatus for mechanical properties as described above, which properties are summarized in Table 35.

TABLE 35

| Component | | Weight % |
|---|---|---|
| ABPU | ABPU-1K-MDI | 63.75 |
| Reactive Diluent | IBMA | 31.87 |
| Chain Extender | PACM | 5.71 |
| Initiator | PPO | 0.8 |
| Tensile Strength (MPa) | | 28.4 |
| Modulus (MPa) | | 407 |
| Elongation (%) | | 222 |

Example 51

Dual-Cure Material from Reactive Blocked Polyurethane Prepolymer

Cured specimens were prepared in the same manner as in Example 41 but using the formulation in Table 36. The specimens were tested following ASTM standard D638-10 on an Instron apparatus for mechanical properties as described above, which properties are summarized in Table 36.

TABLE 36

| Component | | Weight % |
|---|---|---|
| ABPU | ABPU-1K-MDI | 63.03 |
| Reactive Diluent | IBMA | 31.51 |
| Chain Extender | BAMN | 4.67 |
| Initiator | PPO | 0.79 |
| Tensile Strength (MPa) | | 25.1 |
| Modulus (MPa) | | 155 |
| Elongation (%) | | 297 |

Example 52

Dual-Cure Material from Reactive Blocked Polyurethane Prepolymer

Cured specimens were prepared in the same manner as in Example 41 but using the formulation in Table 37. The specimens were tested following ASTM standard D638-10 on an Instron apparatus for mechanical properties as described above, which properties are summarized in Table 37.

TABLE 37

| Component | | Weight % |
|---|---|---|
| ABPU | ABPU-1K-MDI | 63.03 |
| Reactive Diluent | IBMA | 31.35 |
| Chain Extender | BAMN | 5.2 |
| Initiator | PPO | 0.79 |
| Tensile Strength (MPa) | | 21.7 |
| Modulus (MPa) | | 214 |
| Elongation (%) | | 291 |

Example 53

Dual-Cure Material from Reactive Blocked Polyurethane Prepolymer

Cured specimens were prepared in the same manner as in Example 41 but using the formulation in Table 38. The specimens were tested following ASTM standard D638-10 on an Instron apparatus for mechanical properties as described above, which properties are summarized in Table 38.

TABLE 38

| Component | | Weight % |
|---|---|---|
| ABPU | ABPU-650-HMDI | 52.62 |
| Reactive Diluent | IBMA | 39.47 |
| Chain Extender | PACM | 7.26 |
| Initiator | PPO | 0.66 |
| Tensile Strength (MPa) | | 31.7 |
| Modulus (MPa) | | 1460 |
| Elongation (%) | | 3.65 |

Example 54

Dual-Cure Material from Reactive Blocked Polyurethane Prepolymer

Cured specimens were prepared in the same manner as in Example 41 but using the formulation in Table 39. The specimens were tested following ASTM standard D638-10 on an Instron apparatus for mechanical properties as described above, which properties are summarized in Table 39.

TABLE 39

| Component | | Weight % |
|---|---|---|
| ABPU | ABPU-650-HMDI | 60.6 |
| Reactive Diluent | IBMA | 30.29 |
| Chain Extender | PACM | 8.36 |
| Initiator | PPO | 0.76 |
| Tensile Strength (MPa) | | 29.4 |
| Modulus (MPa) | | 864 |
| Elongation (%) | | 191 |

Example 55

Dual-Cure Material from Reactive Blocked Polyurethane Prepolymer

Cured specimens were prepared in the same manner as in Example 41 but using the formulation in Table 40. The specimens were tested following ASTM standard D638-10 on an Instron apparatus for mechanical properties as described above, which properties are summarized in Table 40.

TABLE 40

| Component | | Weight % |
|---|---|---|
| ABPU | ABPU-650-HMDI | 30.53 |
| ABPU | ABPU-1K-MDI | 30.53 |
| Reactive Diluent | IBMA | 30.53 |
| Chain Extender | PACM | 7.63 |
| Initiator | PPO | 0.76 |
| Tensile Strength (MPa) | | 29.1 |
| Modulus (MPa) | | 492 |
| Elongation (%) | | 220 |

Example 56

Dual-Cure Material from Reactive Blocked Polyurethane Prepolymer

Cured specimens were prepared in the same manner as in Example 41 but using the formulation in Table 41. The specimens were tested following ASTM standard D638-10 on an Instron apparatus for mechanical properties as described above, which properties are summarized in Table 41.

TABLE 41

| Component | | Weight % |
|---|---|---|
| ABPU | ABPU-650-HMDI | 54.6 |
| Reactive Diluent | IBMA | 27.6 |
| Crosslinker | DUDMA | 9.9 |
| Chain Extender | PACM | 7.1 |
| Initiator | PPO | 0.8 |
| Tensile Strength (MPa) | | 59.3 |
| Modulus (MPa) | | 1880 |
| Elongation (%) | | 91 |

Example 57

Dual-Cure Material from Reactive Blocked Polyurethane Prepolymer

Cured specimens were prepared in the same manner as in Example 41 but using the formulation in Table 42. The specimens were tested following ASTM standard D638-10 on an Instron apparatus for mechanical properties as described above, which properties are summarized in Table 42.

TABLE 42

| Component | | Weight % |
|---|---|---|
| ABPU | ABPU-650-HMDI | 54.6 |
| Reactive Diluent | IBMA | 18.8 |
| Reactive Diluent | PEMA | 18.8 |
| Chain Extender | PACM | 7.1 |
| Initiator | PPO | 0.8 |
| Tensile Strength (MPa) | | 32.5 |
| Modulus (MPa) | | 1050 |
| Elongation (%) | | 178 |

Example 58

Dual-Cure Material from Reactive Blocked Polyurethane Prepolymer

Cured specimens were prepared in the same manner as in Example 41 but using the formulation in Table 43. The specimens were tested following ASTM standard D638-10 on an Instron apparatus for mechanical properties as described above, which properties are summarized in Table 43.

TABLE 43

| Component | | Weight % |
|---|---|---|
| ABPU | PTMO-1K-MDI | 53.6 |
| Reactive Diluent | IBMA | 23.1 |
| Reactive Diluent | PEMA | 7.1 |
| Crosslinker | DUDMA | 9.7 |
| Chain Extender | PACM | 5.7 |
| Initiator | PPO | 0.8 |
| Tensile Strength (MPa) | | 43.8 |
| Modulus (MPa) | | 1030 |
| Elongation (%) | | 135 |

Example 59

Dual-Cure Material from Reactive Blocked Polyurethane Prepolymer

Cured specimens were prepared in the same manner as in Example 41 but using the formulation in Table 44. The specimens were tested following ASTM standard D638-10 on an Instron apparatus for mechanical properties as described above, which properties are summarized in Table 44.

TABLE 44

| Component | | Weight % |
|---|---|---|
| ABPU | PTMO-650-HMDI | 55.1 |
| Reactive Diluent | IBMA | 33.1 |
| Crosslinker | BPADMA | 3.7 |
| Chain Extender | PACM | 7.2 |
| Initiator | PPO | 0.9 |
| Tensile Strength (MPa) | | 33 |
| Modulus (MPa) | | 1390 |
| Elongation (%) | | 57 |

Example 60

Dual-Cure Material from Reactive Blocked Polyurethane Prepolymer

Cured specimens were prepared in the same manner as in Example 41 but using the formulation in Table 45. The specimens were tested following ASTM standard D638-10 on an Instron apparatus for mechanical properties as described above, which properties are summarized in Table 45.

TABLE 45

| Component | | Weight % |
|---|---|---|
| ABPU | PTMO-650-HMDI | 52.6 |
| Reactive Diluent | IBMA | 14.9 |
| Reactive Diluent | PEMA | 5.0 |
| Crosslinker | SR239 | 19.9 |
| Chain Extender | PACM | 6.9 |
| Initiator | PPO | 0.8 |
| Tensile Strength (MPa) | | 44.5 |
| Modulus (MPa) | | 1520 |
| Elongation (%) | | 12.4 |

Example 61

Elastomer from a Reactive Blocked Polyurethane Prepolymer

Cured elastomer specimens are prepared in the same manner as in Example 20 but using the formulation in Table 46 below. The cure specimens give elastomeric properties similar to those disclosed above.

TABLE 46

| | Parts by weight |
|---|---|
| ABPU (PTMO2k + IPDI + NVF) | 721 |
| DEGMA | 84 |
| Isobornyl acrylate | 126 |
| PACM | 54 |
| PPO | 5 |

Example 62

A Flexible, "PVC-Like" Photo-Curable Polyurethane

This example describes dual cure polyurethane resins that produce materials and products having physical properties similar to that of plasticized PVC.

The material is made by combining a part A with a part B, photo-curing the mixture to solidify its shape, and then baking it at a certain temperature to access the desired final properties. Below is a sample formulation:

| REACTANT | WEIGHT (g) | % WT. |
|---|---|---|
| PART A | | |
| ABPU-25 | 22.4 | 48.20937% |
| IBMA | 5.6 | 12.08355% |
| LMA | 13.45 | 28.94714% |
| TMPTMA | 0.27 | 0.58260% |
| TPO | 0.594 | 1.27841% |
| WIKOFF BLACK | 0.12 | 0.258264% |
| PART B | | |
| PACM | 4.03 | 8.67338% |

ABPU-25: this component is an acrylate blocked polyurethane. It contains a mixture of two oligomers. One is a 650 Da diol, poly(tetramethylene oxide) [PTMO-650] capped with methylene bis(4-cyclohexylisocyanate) [HMDI] that has been capped once more with 2-(tert-butylamino)ethyl methacrylate [TBAEMA]. The second oligomer is TBAEMA capped HMDI.

The final stoichiometric ratio of TBAEMA:HMDI:PTMO is 3.4:2.7:1.

IBMA: isobornyl methacrylate, reactive diluents.

LMA: lauryl methacrylate, reactive diluents.

TMPTMA: trimethylolpropane trimethacrylate, cross-linker.

TPO: diphenyl (2,4,6-trimethylbenzoyl) phosphine oxide, photo-initiator.

Wikoff Black: dispersion of black pigment.

PACM: 4,4'-methylenebiscyclohexylamine, chain extender.

Part A is synthesized by adding all of the individual components into a container and mixing until homogeneous. It is easiest to make a stock solution using one of the reactive diluents (LMA for example) and the photoinitiator, which is a powder. This stock solution can be added to the ABPU and the other components and makes it easier to incorporate the photo-initiator.

Part B can be added directly to part A in a 1:22 ratio by weight. Once both parts have been mixed thoroughly in an orbital or overhead mixer the liquid resin can be photo-cured.

After photo-curing the solid part may be washed in a solution of isopropyl alcohol or Green Power Chemical Rapid Rinse to clean the surface of any un-cured material. The part may be dried by patting down with a towel or with the use of compressed air.

After drying, the part should be placed onto a non-stick pan and placed into an oven at 120 degrees Celsius for up to 4 hours. After baking the part should be placed on a counter-top to cool down. Let the part sit out for at least 24 hours before use.

Example 63

Representative Polyurethane Products Produced from Dual-Cure Materials

Polymerizable materials as described in the examples, or detailed description, above (or variations thereof that will be apparent to those skilled in the art) provide products with a range of different elastic properties. Examples of those ranges of properties, from rigid, through semi-rigid (rigid and flexible), to flexible, and to elastomeric. Particular types of products that can be made from such materials include but are not limited to those given in Table 47 below. The products may contain reacted photoinitiator fragments (remnants of the first cure forming the intermediate product) when produced by some embodiments of methods as described above. It will be appreciated that the properties may be further adjusted by inclusion of additional materials such as fillers and/or dyes, as discussed above.

The properties of the product, as characterized by the columns set forth in Table 47, can be influenced in a variety of ways.

In general, increasing the amount of amount of hard segment in the polymer as compared to soft segment in the polymer will favor the production of more rigid, or rigid and flexible, materials. In one specific example, increasing the amount of TBAEMA will increase the amount of hard segment, and will favor the production of more rigid, or rigid and flexible, materials.

Blending the constituents of the polymerizable liquid to generate more phases (e.g., 2 or 3) in the final polymerized product will tend to favor the production of more resilient final products. For example, in some embodiments, a blend that generates 1 phase in the product will favor the production of a rigid, or rigid and flexible, material, while a blend that generates three phases in the material will, in some embodiments, favor the production of a flexible or elastomeric product.

Washing of the intermediate, and choice of wash liquid, can be used to influence the properties of the product. For example, a wash liquid that solubilizes a chain extender in the intermediate product and extracts chain extender from the intermediate may soften the material, and favor the production of less rigid products.

Altering the ratio of constituents that participate in the first curing step, as compared to the constituents that participate in the second curing step, may also be used to alter the properties of the resulting product.

The inclusion of a filler in the resin, and the choice of filler (e.g., silica, tougheners such as core-shell rubbers, etc.) may be used to change the properties of the final product.

TABLE 47

Polyurethane Products by Properties and Example Products[2]

|  | Rigid | Rigid and Flexible (Semi-Rigid) | Flexible | Elastomeric |
|---|---|---|---|---|
| Young's Modulus (MPa) | 800-3500 | 300-2500 | 25-250 | 0.5-40 |
| Tensile Strength (MPa) | 30-100 | 20-70 | 3-20 | 0.5-30 |
| % Elongation at Break | 1-100 | 40-300 or 600 | 100-175 | 50-1000 |
| Phase(s) of material[1] | 1 or 2 | 1 or 2 | 1, 2, or 3 | 2 or 3 |
| Non-limiting Example Products | Fasteners; electronic device housings; gears, propellers, and impellers; wheels, mechanical device housings; tools, etc. | Structural elements; hinges including living hinges; boat and watercraft hulls and decks; wheels; bottles, jars and other containers; pipes, liquid tubes and connectors, etc. | Automotive interior parts (handles, dashboards, etc.); toys; figurines, etc. | Foot-ware soles, heels, innersoles and midsoles; bushings and gaskets; cushions; electronic device housings, etc. |

[1]The number of phases in the product material corresponds directly to the number of peaks the material exhibits by dynamic mechanical analysis, such as with a Seiko Exstar 6000 dynamic mechanical analyzer. Where the material is a composite of a matrix polymer and a filler, the number of phases in this row refers to the number of phases of the matrix polymer.
[2]In the table above, the following general terms and phrases include the following non-limiting specific examples: "Fastener" includes, but is not limited to, nuts, bolts, screws, expansion fasteners, clips, buckles, etc. "Electronic device housing" includes, but is not limited to, partial and complete cell phone housings, tablet computer housings, personal computer housings, electronic recorder and storage media housings, video monitor housings, keyboard housings, etc. "Mechanical device housing" includes, but is not limited to, partial and complete gear housings, pump housings, motor housings, etc. "Structural elements" as used herein includes, but is not limited to, shells, panels, rods, beams (e.g., I-beams, U-beams, W-beams, cylindrical beams, channels, etc), struts, ties, etc., for applications including architectural and building, civil engineering, automotive and other transportation (e.g., automotive body panel, hood, chassis, frame, roof, bumper, etc.), etc. "Tools" includes, but is not limited to, impact tools such as hammers, drive tools such as screwdrivers, grasping tools such as pliers, etc., including component parts thereof (e.g., drive heads, jaws, and impact heads). "Toys" includes single unitary formed items or component parts thereof, examples of which include but are not limited to model vehicles (including airplanes, rockets, space ships, automobiles, trains), dolls and figurines (including human figurines, animal figurines, robot figurines, fantasy creature figurines, etc.), etc., including composites thereof and component parts thereof.

Example 64

Polyurethane Products Having Multiple Structural Segments and/or Multiple Tensile Properties In Examples 18-61 are given materials for the formation of polyurethane products having a variety of different tensile properties, ranging from elastomeric, to semi-rigid, to flexible, as described in Example 62 above.

Because the polyurethane polymer is formed by curing the intermediate product (e.g., by heating or microwave irradiating), the process of fabricating the product may be paused or interrupted one or more times, to change the polymerizable liquid. While a fault line or plane may be formed in the intermediate by the interruption, if the subsequent polymerizable liquid is, in its second cure material, reactive with that of the first, then the two distinct structural segments of the intermediate will cross-react and covalently couple to one another during the second cure (e.g., by heating or microwave irradiation). Thus, for example, any of the materials described in examples 19-60 above may be sequentially changed to form a product having multiple distinct structural segments with different tensile properties, while still being a unitary product with the different segments covalently coupled to one another.

For example, a hinge can be formed, with the hinge comprising a rigid segment, coupled to a second elastic segment, coupled to a third rigid segment, by sequentially changing polymerizable liquids (e.g., from among those described in examples 19-60 above) during the formation of the three-dimensional intermediate.

A shock absorber or vibration dampener can be formed in like manner, with the second segment being either elastic or semi-rigid.

A unitary rigid funnel and flexible hose assembly can be formed in like manner.

Sequential changing of the polymerizable liquid can be carried out with a multi-port, feed-through carrier, system, such as described in PCT Application Publication No. WO 2015/126834, or, where the polymerizable liquid is supplied in a reservoir positioned above the build surface, providing the reservoir and build surface as interchangeable cartridges that can be changed out or swapped during a pause in fabrication.

Example 65

Silicone Rubber Product

Phenylbis(2 4 6-trimethylbenzoyl)phosphine oxide (PPO) is dissolved in isobornyl acrylate (IBA) with a THINKY™ mixer. Methacryloxypropyl terminated polydimethylsiloxane (DMS-R31; Gelest Inc.) is added to the solution, followed by addition of Sylgard Part A and Part B (Corning PDMS precursors), and then further mixed with a THINKY™ mixer to produce a homogeneous solution. The solution is loaded into an apparatus as described above and a three-dimensional intermediate is produced by ultraviolet curing as described above. The three-dimensional intermediate is then thermally cured at 100° C. for 12 hours to produce the final silicone rubber product. Parts by weight and tensile properties are given in Table 48 below.

TABLE 48

| | Parts by weight |
|---|---|
| DMS-R31 | 40 |
| IBA | 20 |
| Sylgard 184 Part A | 40 |
| Sylgard 184 Part B | 4 |
| PPO | 1 |
| Tensile Strength (MPa) | 1.3 |
| % Elongation at Break | 130 |

Example 66

Epoxy Dual Cure Product 10.018 g EpoxAcast 690 resin part A and 3.040 g part B were mixed on a THINKY™ mixer. 3.484 g was then mixed with 3.013 g of RKP5-78-1, a 65/22/13 mix of Sartomer CN9782/N-vinylpyrrolidone/diethyleneglycol diacrylate to give a clear blend which was cured in a "dog bone" shaped sample mold (for tensile strength testing) for 2 minutes under a Dymax ultraviolet lamp to give a very elastic but weak dog bone sample.

A second sample, RKP11-10-1 contained 3.517 g of the above epoxy and 3.508 g of RKP5-90-3 and 65/33/2/0.25 blend of Sartomer CN2920/N-vinylcaprolactam/N-vinylpyrrolidone/PPO initiator cured similarly to give a very flexible dog bone. A third 1:1 sample made with RKP5-84-8 50/20/30/0.25 CN2920/CN9031/NVF/PPO did not cure completely and was discarded.

Later, first samples of an epoxy/acrylate dual cure resins were made, as follows:
  Smooth-On EpoxAcure 690 is an EEW 190 epoxy (probably the diglycidyl ether of bisphenol A) sold with a diaminopropyleneglycol oligomer curing agent and offering a 5 hr open time/24 hr room temperature cure. This was blended 1:1 with three print formulations. Two samples were good homogeneous blends that gave highly elastic, but very weak dog bone samples on standard 2 minute UV cure.
  Subsequent thermal cure of the samples at 84° C. for 5 hrs gave reasonably strong and stiff, but flexible samples, in one case with tenacious adhesion to the polystyrene petri dish on which it was cured. Tensiles were in the modest 5-8 MPa range, less than the base acrylate resins.

Later, RKP1-17-2D a 66/33/1 mix of CN2920/NVC/DPO initiator was blended with EpoxAcure 690 in a 1:1 ratio and 2:1 ratio The 1:1 epoxy/acrylate dual cure formulation previously prepared failed to print in a CLIP apparatus as described above, at 100 or 60 mm/hr, but a 1:2 ratio gave a decent argyle pattern at 60 mm/hr. The Smooth-On EpoxAcure 690/CN2920/NVC argyle was post-cured at room temperature to a clear, flexible, if tacky, sample. Dog bones were also prepared.

Examples 67-72

In some embodiments, when ABDI is used rather than ABPU to make dual-cured parts, especially elastomers, an advantage is obtained in that the UV-cured part can generally have higher stiffness than a corresponding part from the ABPU strategy. Because of the low molecular weight of ABDI, the high cross-linking density ensures a higher Tg of the UV-cured part. During the following thermal cure, the isocyanate groups in ABDI unblock to react with the added polyol or polyamine, chain extender, and or cross-linker, to form an elastomer. This change in the stiffness of the material allows for the more accurate production of more complicated elastomer geometries, or are difficult to produce through the ABPU strategy, as the green samples (intermediate objects) are soft (usually with Young's Modulus<1 MPa). In a typical formulation using the ABDI strategy, the green sample usually have Young's modulus>30 MPa.

Example 67

Elastomer from a Reactive Blocked Isocyanate

Components as shown in Table 34, except the amines, were added to a container and thoroughly mixed (either by an overhead stirrer or a centrifugation mixer such as THINKY™ to obtain a homogeneous resin. Then amines were added to the resin and mixed for another 2-30 min depending on the volume of resin. The resin was printed by CLIP into D412 Type IV dog-bone-shaped specimens followed by thermal curing at 125° C. for 2 h. The cured elastomer specimens were tested following ASTM standard D412 on an Instron apparatus for mechanical properties as described above, which properties are also summarized in Table 49.

TABLE 49

| | Parts by weight |
|---|---|
| ABDI (TBAEMA-IPDI-TBAEMA) | 8 |
| Lauryl methacrylate | 4 |
| PEG600 dimethacrylate | 0.4 |
| Jeffamine D2000 | 9 |
| Laromin C260 | 2.14 |
| TPO | 0.5 |
| Tensile Strength (MPa) after thermal cure | 4.62 |
| % Elongation at Break after thermal cure | 182 |
| Young's Modulus after thermal cure | 18 |
| Young's Modulus of Green Sample | 58 |

Example 68

Elastomer from a Reactive Blocked Isocyanate

Samples were prepared similar to in Example 67. The cured elastomer specimens were tested following ASTM standard D412 on an Instron apparatus for mechanical properties as described above, which properties are also summarized in Table 50.

TABLE 50

|  | Parts by weight |
| --- | --- |
| ABDI (TBAEMA-IPDI-TBAEMA) | 8 |
| Lauryl methacrylate | 2 |
| Stearyl methacrylate | 1.2 |
| PEG600 dimethacrylate | 1.2 |
| Jeffamine THF100 | 6.75 |
| Jeffamine D400 | 2.52 |
| Jeffamine T403 | 0.26 |
| TPO | 0.4 |
| Tensile Strength (MPa) after thermal cure | 5.49 |
| % Elongation at Break after thermal cure | 234 |
| Young's Modulus after thermal cure | 2.55 |
| Young's Modulus of Green Sample | 35 |

Example 69

Elastomer from a Reactive Blocked Isocyanate

Samples were prepared similar to in Example 67. The cured elastomer specimens were tested following ASTM standard D412 on an Instron apparatus for mechanical properties as described above, which properties are also summarized in Table 51.

TABLE 51

|  | Parts by weight |
| --- | --- |
| ABDI (TBAEMA-IPDI-TBAEMA) | 8 |
| Lauryl methacrylate | 4 |
| Jeffamine D2000 | 12 |
| Laromin C260 | 1.79 |
| TPO | 0.45 |
| Tensile Strength (MPa) after thermal cure | 3.0 |
| % Elongation at Break after thermal cure | 210 |
| Young's Modulus after thermal cure | 8.3 |
| Young's Modulus of Green Sample | 46 |

Example 70

Elastomer from a Reactive Blocked Isocyanate

Samples were prepared similar to in Example 67. The cured elastomer specimens were tested following ASTM standard D412 on an Instron apparatus for mechanical properties as described above, which properties are also summarized in Table 52.

TABLE 52

|  | Parts by weight |
| --- | --- |
| ABDI (TBAEMA-IPDI-TBAEMA) | 8 |
| Lauryl methacrylate | 2 |
| Stearyl methacrylate | 1.2 |
| Jeffamine THF100 | 11.4 |
| Laromin C260 | 0.5 |
| TPO | 0.45 |
| Tensile Strength (MPa) after thermal cure | 1.53 |
| % Elongation at Break after thermal cure | 786 |
| Young's Modulus after thermal cure | 1.79 |
| Young's Modulus of Green Sample | 32 |

Example 71

Elastomer from a Reactive Blocked Isocyanate

Samples were prepared similar to in Example 67. The cured elastomer specimens were tested following ASTM standard D412 on an Instron apparatus for mechanical properties as described above, which properties are also summarized in Table 53.

TABLE 53

|  | Parts by weight |
| --- | --- |
| ABDI (TBAEMA-IPDI-TBAEMA) | 8 |
| Lauryl methacrylate | 2 |
| Stearyl methacrylate | 1.2 |
| PEG600 dimethacrylate | 1.2 |
| Jeffamine THF100 | 11.4 |
| Jeffamine D400 | 0.78 |
| Jeffamine T403 | 0.08 |
| TPO | 0.45 |
| Tensile Strength (MPa) after thermal cure | 3.39 |
| % Elongation at Break after thermal cure | 401 |
| Young's Modulus after thermal cure | 1.58 |
| Young's Modulus of Green Sample | 33 |

Example 72

Elastomer from a Reactive Blocked Isocyanate

Samples were prepared similar to in Example 67. The cured elastomer specimens were tested following ASTM standard D412 on an Instron apparatus for mechanical properties as described above, which properties are also summarized in Table 54.

TABLE 54

|  | Parts by weight |
| --- | --- |
| ABDI (TBAEMA-IPDI-TBAEMA) | 8 |
| Lauryl methacrylate | 2 |
| Stearyl methacrylate | 1.2 |
| PEG600 dimethacrylate | 1.2 |
| Jeffamine D400 | 5.04 |
| Jeffamine T403 | 0.52 |
| TPO | 0.27 |
| Tensile Strength (MPa) after thermal cure | 6.98 |
| % Elongation at Break after thermal cure | 106 |
| Young's Modulus after thermal cure | 34.4 |
| Young's Modulus of Green Sample | 62 |

Example 73

Pseudoplastic Precursor Resin System

A pair of precursor resins was prepared. When mixed together, the precursor resins form a single "dual cure" resin useful for additive manufacturing. Each precursor resin contained the following ingredients:

Precursor Resin I:
51.4% Neopentyl glycol dimethacrylate (SR248): 51.4%
3,3' diamino diphenyl sulfone (DDS, 5 um particles): 25.6%
bisphenol A diglycidyl dimethacrylate (PRO13515): 21.3%
Diphenyl(2,4,6-trimethylbenzoyl)phosphine oxide (TPO) photoinitiator: 1.7%

Precursor Resin II:

Bisphenol F epoxy with rubber modifiers, MX136: 80.1%

Acrylated Bisphenol A epoxy, CN153: 19.7%

Sun chemical black pigment: 0.2%

All of the light-curable "Part A" components of the dual cure resin are in Precursor Resin I. In addition, Precursor Resin I contained DDS, which, when mixed with the epoxies in Precursor Resin II, form a second, heat-curable, "Part B" component of the dual cure resin.

In Precursor Resin I, the reactive DDS was in particulate form. However, the DDS also imparted pseudoplastic properties to Precursor Resin I, advantageously enhancing the storage stability thereof.

The pair of precursor resins are stored in separate containers, which separate containers may be connected to one another, or further contained in a common package. Advantageous are dual chamber dispensers, such as those described in U.S. Pat. Nos. 3,311,265; 5,335,827; and 6,458,095.

The foregoing is illustrative of the present invention, and is not to be construed as limiting thereof. The invention is defined by the following claims, with equivalents of the claims to be included therein.

We claim:

1. A method of forming a three-dimensional object, comprising:
    (a) providing a carrier and a fill level, and optionally an optically transparent member having a build surface defining said fill level, said carrier and said fill level having a build region therebetween;
    (b) mixing a first precursor liquid and a second precursor liquid to produce a polymerizable liquid comprising a mixture of (i) a light polymerizable liquid first component, and (ii) a second solidifiable component that is different from said first component,
    and wherein: (i') at least one reactant of said second solidifiable component is contained in said first precursor liquid, and (ii') at least one reactant or catalyst of said second solidifiable component is contained in said second precursor liquid; then
    (c) filling said build region with said polymerizable liquid;
    (d) irradiating said build region with light (through said optically transparent member when present) to form a solid polymer scaffold from said first component and also advancing said carrier away from said build surface to form a three-dimensional intermediate having the same shape as, or a shape to be imparted to, said three-dimensional object and containing said second solidifiable component carried in said scaffold in unsolidified and/or uncured form;
    (e) optionally washing said three-dimensional intermediate; and
    (f) concurrently with or subsequent to said irradiating step, solidifying and/or curing, said second solidifiable component in said three-dimensional intermediate to form said three-dimensional object,
    wherein said second solidifiable component comprises a polymerizable liquid solubilized in or suspended in said first component.

2. The method of claim 1, wherein said second solidifiable component comprises:
    (i) a polymerizable solid suspended in said first component;
    (ii) a polymerizable solid solubilized in said first component; or
    (iii) a polymer solubilized in said first component.

3. The method of claim 1, wherein said three-dimensional object comprises a polymer blend, interpenetrating polymer network, semi-interpenetrating polymer network, or sequential interpenetrating polymer network formed from said first component and said second solidifiable component.

4. The method of claim 1, wherein said solidifying and/or curing step (f) is carried out concurrently with said irradiating step (d) and:
    (i) said solidifying and/or curing step is carried out by precipitation; or
    (ii) said irradiating step generates heat from the polymerization of said first component in an amount sufficient to thermally solidify or polymerize said second solidifiable component.

5. The method of claim 1, wherein said solidifying and/or curing step (f) is carried out subsequent to said irradiating step (d) and is carried out by:
    (i) heating said second solidifiable component;
    (ii) irradiating said second solidifiable component with light at a wavelength different from that of the light in said irradiating step (d);
    (iii) contacting said second solidifiable component to water; and/or
    (iv) contacting said second solidifiable component to a catalyst.

6. The method of claim 1, wherein said second solidifiable component comprises the precursors to a polyurethane, polyurea, or copolymer thereof, a silicone resin, an epoxy resin, a cyanate ester resin, or a natural rubber; and said solidifying and/or curing step is carried out by heating.

7. The method of claim 1, wherein said second solidifiable component comprises the precursors to a polyurethane, polyurea, or copolymer thereof; and said solidifying and/or curing step is carried out by contacting said second component to water.

8. The method of claim 1, wherein said solidifying and/or curing step (f) is carried out subsequent to said irradiating step; and said solidifying and/or curing step (f) is carried out under conditions in which said solid polymer scaffold degrades and forms a constituent necessary for the polymerization of said second solidifiable component.

9. The method of claim 1, wherein said second solidifiable component comprises precursors to a polyurethane, polyurea, or copolymer thereof, a silicone resin, a ring-opening metathesis polymerization resin, a click chemistry resin, or a cyanate ester resin; and said solidifying and/or curing step is carried out by contacting said second component to a polymerization catalyst.

10. The method of claim 1, wherein said irradiating and/or said advancing steps are carried out while also concurrently:
    (i) continuously maintaining a dead zone of polymerizable liquid in contact with said build surface, and
    (ii) continuously maintaining a gradient of polymerization zone between said dead zone and said solid polymer scaffold and in contact with each thereof, said gradient of polymerization zone comprising said first component in partially cured form.

11. The method of claim 10, wherein said optically transparent member is present and comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone;
    wherein said optically transparent member comprises a fluoropolymer;

and wherein: said first component comprises a free radical polymerizable liquid and said inhibitor comprises oxygen; or said first component comprises an acid-catalyzed or cationically polymerizable liquid, and said inhibitor comprises a base.

12. The method of claim 1, wherein said first component comprises monomers and/or prepolymers that can be polymerized by exposure to actinic radiation or light; and said second solidifiable component is solidifiable on contacting to heat, water, water vapor, light at a different wavelength than that at which said first component is polymerized, catalysts, evaporation of a solvent from the polymerizable liquid, exposure to microwave irradiation, or a combination thereof.

13. The method of claim 1, wherein said mixing step is carried out by feeding or forcing said first and second precursor liquids through a mixer.

14. The method of claim 13, wherein said mixer comprises a static mixer.

15. The method of claim 13, wherein said filling step is carried out by filling said build region with the output of said mixer.

16. The method of claim 1, wherein at least one of said first and second precursor liquids comprises a pseudoplastic composition having at least one solid particulate dispersed therein.

17. The method of claim 16, wherein said solid particulate comprises (i) a reactive monomer or prepolymer, (ii) a filler, or (iii) a combination thereof.

18. A method of forming a three-dimensional object comprised of polyurethane, polyurea, or copolymer thereof, said method comprising:
(a) providing a carrier and a fill level, and optionally an optically transparent member having a build surface defining said fill level, said carrier and said fill level having a build region therebetween;
(b) mixing a first precursor liquid and a second precursor liquid to produce a polymerizable liquid comprising at least one of: (i) a blocked or reactive blocked prepolymer, a blocked or reactive blocked isocyanate, or (iii) a blocked or reactive blocked diisocyanate chain extender;
(c) filling said build region with said polymerizable liquid; then;
(d) irradiating said build region with light (through said optically transparent member when present) to form by a first reaction a solid blocked polymer scaffold and advancing said carrier away from said build surface to form a three-dimensional intermediate having the same shape as, or a shape to be imparted to, said three-dimensional object, with said intermediate containing said (i) blocked or reactive blocked prepolymer, (ii) blocked or reactive blocked isocyanate, or (iii) blocked or reactive blocked diisocyanate chain extender;
(e) optionally washing said intermediate, and then
(f) heating or microwave irradiating said three-dimensional intermediate sufficiently to form, by a second reaction, from said three-dimensional intermediate said three-dimensional object comprised of polyurethane, polyurea, or copolymer thereof;
and wherein: (i') at least one reactant of said second reaction is contained in said first precursor liquid, and (ii') at least one reactant or catalyst of said second reaction is contained in said second precursor liquid.

19. The method of claim 18, wherein said irradiating and/or said advancing steps are carried out while also concurrently:
(i) continuously maintaining a dead zone of polymerizable liquid in contact with said build surface, and
(ii) continuously maintaining a gradient of polymerization zone between said dead zone and said solid blocked polymer scaffold and in contact with each thereof, said gradient of polymerization zone comprising said polymerizable liquid in partially cured form.

20. The method of claim 19, wherein said optically transparent member is present and comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone.

21. The method of claim 20, wherein said semipermeable member comprises a fluoropolymer.

22. The method of claim 18, said polymerizable liquid comprising a mixture of (i) a blocked or reactive blocked prepolymer, (ii) a chain extender, (iii) a photoinitiator, (iv) optionally a polyol and/or a polyamine, (v) optionally a reactive diluent, (vi) optionally a pigment or dye, and (vii) optionally a filler.

23. The method of claim 18, said polymerizable liquid comprising a mixture of (i) a blocked or reactive blocked diisocyanate or branched isocyanate, (ii) a polyol and/or polyamine, (iii) a chain extender, (iv) a photoinitiator, (v) optionally a reactive diluent, (vi) optionally a pigment or dye, and (vii) optionally a filler.

24. The method of claim 18, said polymerizable liquid comprising a mixture of (i) a polyol and/or polyamine, (ii) a blocked or reactive blocked diisocyanate or branched isocyanate chain extender, (iii) optionally one or more additional chain extenders, (iv) a photoinitiator, (v) optionally a reactive diluent, (vi) optionally a pigment or dye, and (vii) optionally a filler.

25. The method of claim 18, wherein said mixing step is carried out by feeding or forcing said first and second precursor liquids through a mixer to produce said polymerizable liquid as an output thereof.

26. The method of claim 25, wherein said filling step is carried out by filling said build region with the output of said mixer.

27. The method of claim 18, wherein at least one of said first and second precursor liquids comprises a pseudoplastic composition having at least one solid particulate dispersed therein.

* * * * *

UNITED STATES PATENT AND TRADEMARK OFFICE
CERTIFICATE OF CORRECTION

| | | |
|---|---|---|
| PATENT NO. | : 10,350,823 B2 | Page 1 of 1 |
| APPLICATION NO. | : 15/755385 | |
| DATED | : July 16, 2019 | |
| INVENTOR(S) | : Rolland et al. | |

It is certified that error appears in the above-identified patent and that said Letters Patent is hereby corrected as shown below:

On the Title Page

Item (60) Related U.S. Application Data: Please add the following:
Related U.S. Application Data
(60) Provisional application No. 62/270,829, filed on Dec. 22, 2015

In the Claims

Column 123, Lines 39-40, Claim 18:
Please correct "prepolymer, a blocked" to read -- prepolymer, (ii) a blocked --

Signed and Sealed this
Twenty-ninth Day of October, 2019

Andrei Iancu
*Director of the United States Patent and Trademark Office*